(12) United States Patent
Chaji

(10) Patent No.: US 12,075,565 B2
(45) Date of Patent: Aug. 27, 2024

(54) SELECTIVE TRANSFER OF MICRO DEVICES

(71) Applicant: VueReal Inc., Waterloo (CA)

(72) Inventor: Gholamreza Chaji, Waterloo (CA)

(73) Assignee: VueReal Inc., Waterloo (CA)

( * ) Notice: Subject to any disclaimer, the term of this patent is extended or adjusted under 35 U.S.C. 154(b) by 202 days.

(21) Appl. No.: 17/222,506

(22) Filed: Apr. 5, 2021

(65) Prior Publication Data

US 2021/0243894 A1 Aug. 5, 2021

Related U.S. Application Data

(60) Division of application No. 15/442,293, filed on Feb. 24, 2017, now abandoned, which is a (Continued)

(51) Int. Cl.
*H01L 21/683* (2006.01)
*H01L 23/00* (2006.01)
(Continued)

(52) U.S. Cl.
CPC .......... *H05K 1/111* (2013.01); *H01L 21/6835* (2013.01); *H01L 24/29* (2013.01);
(Continued)

(58) Field of Classification Search
CPC ............... H05K 1/111; H05K 13/0015; H05K 13/0069; H05K 13/04; H01L 21/6835;
(Continued)

(56) References Cited

U.S. PATENT DOCUMENTS 5,184,398 A 2/1993 Moslehi
6,159,822 A 12/2000 Yang
(Continued)

FOREIGN PATENT DOCUMENTS

CA 2880718 A1 7/2016
CA 2887186 A1 11/2016
(Continued)

OTHER PUBLICATIONS

International Search Report and Written Opinion in International Application No. PCT/IB2016/050307, mailed May 4, 2016 (7 pages).
(Continued)

*Primary Examiner* — Vu A Vu
(74) *Attorney, Agent, or Firm* — NIXON PEABODY LLP

(57) ABSTRACT

What is disclosed is a method of selectively transferring micro devices from a donor substrate to contact pads on a receiver substrate. Micro devices being attached to a donor substrate with a donor force. The donor substrate and receiver substrate are aligned and brought together so that selected micro devices meet corresponding contact pads. A receiver force is generated to hold selected micro devices to the contact pads on the receiver substrate. The donor force is weakened and the substrates are moved apart leaving selected micro devices on the receiver substrate. Several methods of generating the receiver force are disclosed, including adhesive, mechanical and electrostatic techniques.

8 Claims, 103 Drawing Sheets

Related U.S. Application Data continuation-in-part of application No. 15/002,662, filed on Jan. 21, 2016, now abandoned.

(51) Int. Cl.

| | | |
|---|---|---|
| *H05K 1/11* | (2006.01) | |
| *H05K 13/00* | (2006.01) | |
| *H05K 13/04* | (2006.01) | |
| G01R 31/26 | (2020.01) | |
| H01L 21/66 | (2006.01) | |
| H01L 25/00 | (2006.01) | |

(52) U.S. Cl.
CPC .............. *H01L 24/83* (2013.01); *H01L 24/95* (2013.01); *H01L 24/97* (2013.01); *H05K 13/0015* (2013.01); *H05K 13/0069* (2013.01); *H05K 13/04* (2013.01); G01R 31/2635 (2013.01); H01L 22/14 (2013.01); H01L 22/20 (2013.01); H01L 24/27 (2013.01); H01L 24/32 (2013.01); H01L 24/75 (2013.01); H01L 25/50 (2013.01); H01L 2221/68322 (2013.01); H01L 2221/68368 (2013.01); H01L 2221/68381 (2013.01); H01L 2224/27002 (2013.01); H01L 2224/2732 (2013.01); H01L 2224/27334 (2013.01); H01L 2224/29006 (2013.01); H01L 2224/29011 (2013.01); H01L 2224/29019 (2013.01); H01L 2224/29026 (2013.01); H01L 2224/29078 (2013.01); H01L 2224/2919 (2013.01); H01L 2224/32237 (2013.01); H01L 2224/75252 (2013.01); H01L 2224/75253 (2013.01); H01L 2224/7598 (2013.01); H01L 2224/83005 (2013.01); H01L 2224/83121 (2013.01); H01L 2224/8314 (2013.01); H01L 2224/83141 (2013.01); H01L 2224/83143 (2013.01); H01L 2224/8316 (2013.01); H01L 2224/8318 (2013.01); H01L 2224/83191 (2013.01); H01L 2224/83192 (2013.01); H01L 2224/83234 (2013.01); H01L 2224/83238 (2013.01); H01L 2224/83862 (2013.01); H01L 2224/83902 (2013.01); H01L 2224/95 (2013.01); H01L 2224/95001 (2013.01); H01L 2224/97 (2013.01)

(58) Field of Classification Search
CPC ......... H01L 24/29; H01L 24/83; H01L 24/95; H01L 24/97; H01L 22/14; H01L 22/20; H01L 24/27; H01L 24/32; H01L 24/75; H01L 25/50; H01L 2221/68322; H01L 2221/68368; H01L 2221/68381; H01L 2224/27002; H01L 2224/2732; H01L 2224/27334; H01L 2224/29006; H01L 2224/29011; H01L 2224/29019; H01L 2224/29026; H01L 2224/29078; H01L 2224/2919; H01L 2224/32237; H01L 2224/75252; H01L 2224/75253; H01L 2224/7598; H01L 2224/83005; H01L 2224/83121; H01L 2224/8314; H01L 2224/83141; H01L 2224/83143; H01L 2224/8316; H01L 2224/8318; H01L 2224/83191; H01L 2224/83192; H01L 2224/83234; H01L 2224/83238; H01L 2224/83862; H01L 2224/83902; H01L 2224/95; H01L 2224/95001; H01L 2224/97; H01L 2224/95136; G01R 31/2635
USPC ........................................................ 438/106
See application file for complete search history.

(56) References Cited

U.S. PATENT DOCUMENTS

| | | | |
|---|---|---|---|
| 7,088,431 | B2 | 8/2006 | Ottens |
| 7,629,184 | B2 | 12/2009 | Kulp |
| 8,139,340 | B2 | 3/2012 | Reynolds |
| 8,436,255 | B2 | 5/2013 | Goh |
| 8,518,204 | B2 * | 8/2013 | Hu .................. H01L 24/83 |
| | | | 156/273.1 |
| 8,647,438 | B2 | 2/2014 | Hoffman |
| 8,765,582 | B2 | 7/2014 | Hsu |
| 9,134,368 | B2 | 9/2015 | Kuo |
| 9,196,498 | B1 | 11/2015 | Nangoy |
| 9,257,414 | B2 | 2/2016 | Chen |
| 9,308,650 | B2 * | 4/2016 | Eisele ................ H01L 21/6831 |
| 9,349,630 | B2 | 5/2016 | Raj |
| 9,356,137 | B2 | 5/2016 | Zhang |
| 9,431,283 | B2 | 8/2016 | Thompson |
| 9,478,583 | B2 * | 10/2016 | Hu ................... H10K 77/111 |
| 9,496,155 | B2 * | 11/2016 | Menard ............... H01L 24/80 |
| 9,589,826 | B2 | 3/2017 | Ono |
| 9,607,907 | B2 * | 3/2017 | Wu ................. H01L 33/0095 |
| 9,741,591 | B2 | 8/2017 | Schweikert |
| 9,965,106 | B2 | 5/2018 | Guard |
| 9,991,147 | B2 | 6/2018 | Wang |
| 10,153,190 | B2 | 12/2018 | Qin |
| 2002/0048137 | A1 | 4/2002 | Williams |
| 2003/0162463 | A1 | 8/2003 | Hayashi |
| 2004/0026773 | A1 | 2/2004 | Koon |
| 2004/0154733 | A1 | 8/2004 | Morf |
| 2004/0251821 | A1 | 12/2004 | Cok |
| 2004/0262614 | A1 | 12/2004 | Hack |
| 2005/0082523 | A1 | 4/2005 | Blanchet-Fincher |
| 2005/0104225 | A1 * | 5/2005 | Huang ................ H01L 24/83 |
| | | | 257/E23.021 |
| 2005/0169570 | A1 | 8/2005 | Kim |
| 2005/0215073 | A1 | 9/2005 | Nakamura |
| 2005/0287687 | A1 | 12/2005 | Liao |
| 2006/0102913 | A1 | 5/2006 | Park |
| 2007/0045620 | A1 | 3/2007 | Park |
| 2008/0315440 | A1 | 12/2008 | Dekker |
| 2009/0302339 | A1 | 12/2009 | Yamazaki |
| 2010/0006845 | A1 | 1/2010 | Seo |
| 2011/0216272 | A1 | 9/2011 | Yoshida |
| 2013/0120440 | A1 | 5/2013 | Westphal |
| 2013/0122610 | A1 * | 5/2013 | Chung ............... H01L 21/6838 |
| | | | 156/379 |
| 2013/0126081 | A1 | 5/2013 | Hu |
| 2013/0130440 | A1 | 5/2013 | Hu |
| 2013/0153277 | A1 | 6/2013 | Menard |
| 2013/0157438 | A1 | 6/2013 | Maeda |
| 2013/0214302 | A1 | 8/2013 | Yeh |
| 2013/0273695 | A1 | 10/2013 | Menard |
| 2014/0027709 | A1 * | 1/2014 | Higginson ............. H01L 33/62 |
| | | | 438/26 |
| 2014/0048836 | A1 | 2/2014 | Hsu |
| 2014/0151678 | A1 | 6/2014 | Sakuma |
| 2014/0333683 | A1 | 11/2014 | Qi |
| 2014/0361265 | A1 | 12/2014 | Liu |
| 2014/0367633 | A1 | 12/2014 | Bibl |
| 2014/0367705 | A1 | 12/2014 | Bibl |
| 2014/0367711 | A1 | 12/2014 | Bibl |
| 2015/0060820 | A1 | 3/2015 | Takagi |
| 2015/0144974 | A1 | 5/2015 | Chen |
| 2015/0228513 | A1 | 8/2015 | Parkhe |
| 2015/0357315 | A1 | 12/2015 | Oraw |
| 2016/0013170 | A1 | 1/2016 | Sakariya |
| 2016/0064363 | A1 | 3/2016 | Bower |
| 2016/0372893 | A1 | 12/2016 | McLaurin |
| 2017/0162552 | A1 | 6/2017 | Thompson |
| 2017/0179092 | A1 | 6/2017 | Sasaki |
| 2017/0261782 | A1 | 9/2017 | Lee |

FOREIGN PATENT DOCUMENTS

| | | |
|---|---|---|
| CA | 2890398 A1 | 11/2016 |
| CN | 1491436 | 4/2004 |

(56) References Cited

FOREIGN PATENT DOCUMENTS

| | | |
|---|---|---|
| CN | 1813362 A | 8/2006 |
| CN | 101154618 | 4/2008 |
| CN | 102097357 | 6/2011 |
| CN | 103904073 | 7/2014 |
| CN | 105324858 | 2/2016 |
| EP | 1750308 A2 | 2/2007 |
| KR | 20160107363 A | 9/2016 |
| TW | 201423242 A | 6/2014 |
| WO | WO 1997/023903 A1 | 7/1997 |
| WO | WO 2002/084631 A1 | 10/2002 |
| WO | WO 03/088359 A1 | 10/2003 |
| WO | WO 2014/165151 A1 | 10/2014 |
| WO | WO 2015/081289 A1 | 6/2015 |

OTHER PUBLICATIONS

International Search Report and Written Opinion in International Application No. PCT/IB2017/051297, mailed May 17, 2017 (7 pages).

International Search Report and Written Opinion in International Application No. PCT/IB2018/055347, mailed Jan. 24, 2019 (16 pages).

* cited by examiner

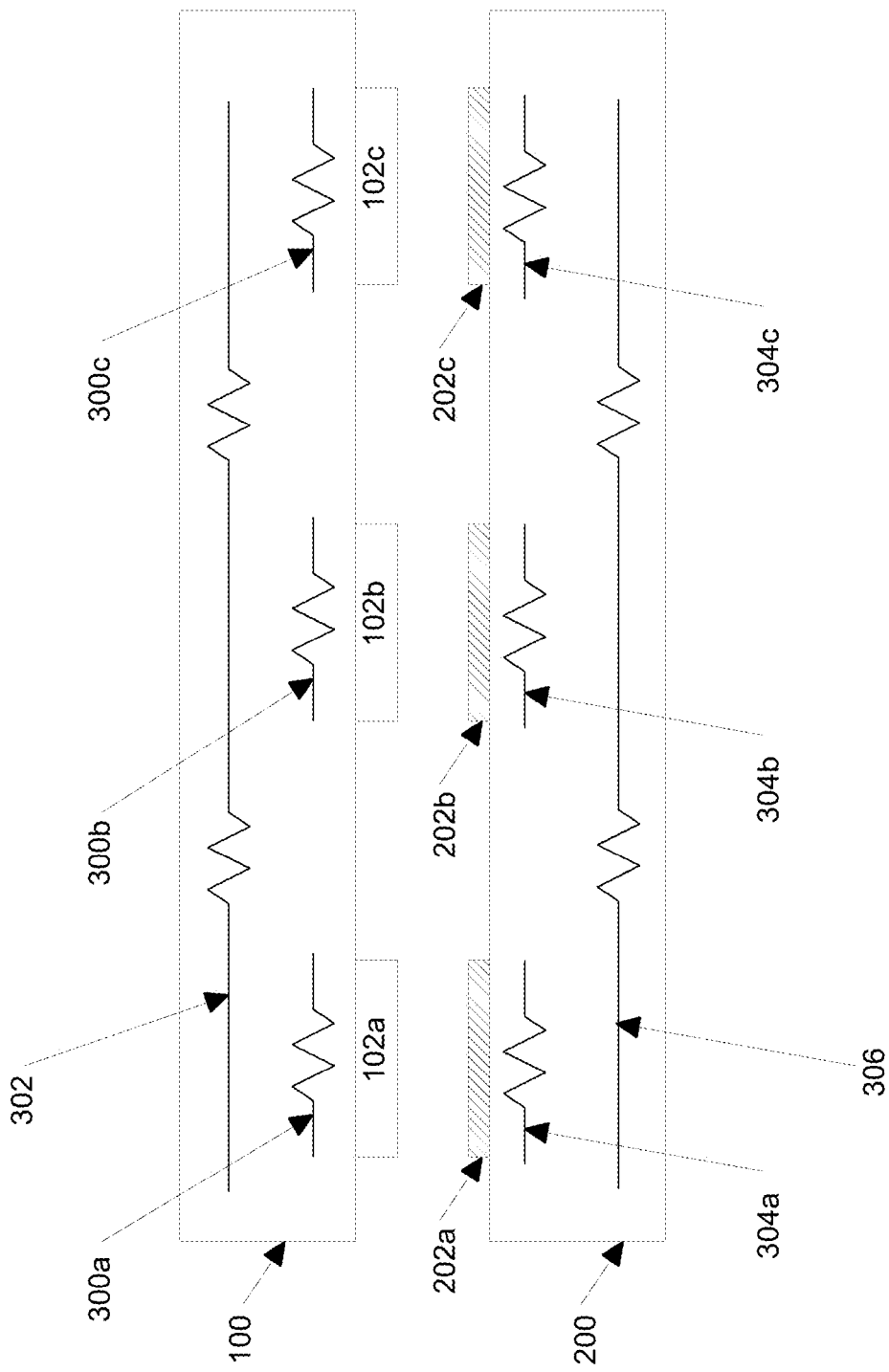

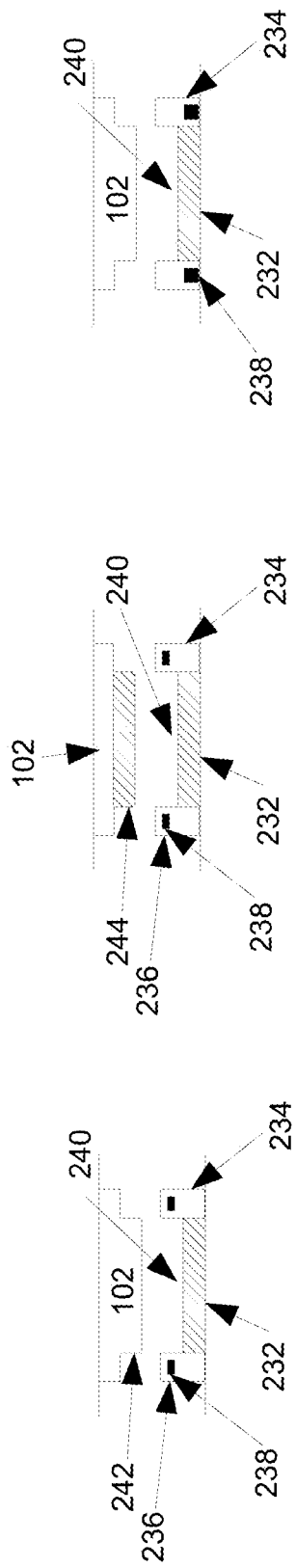

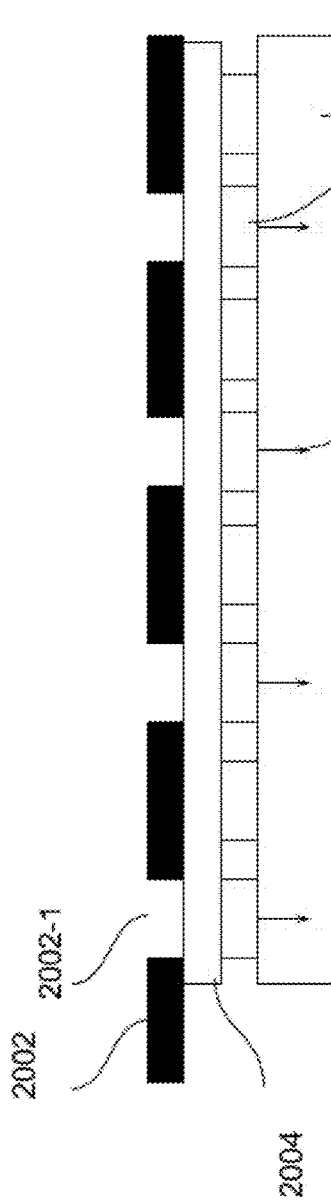
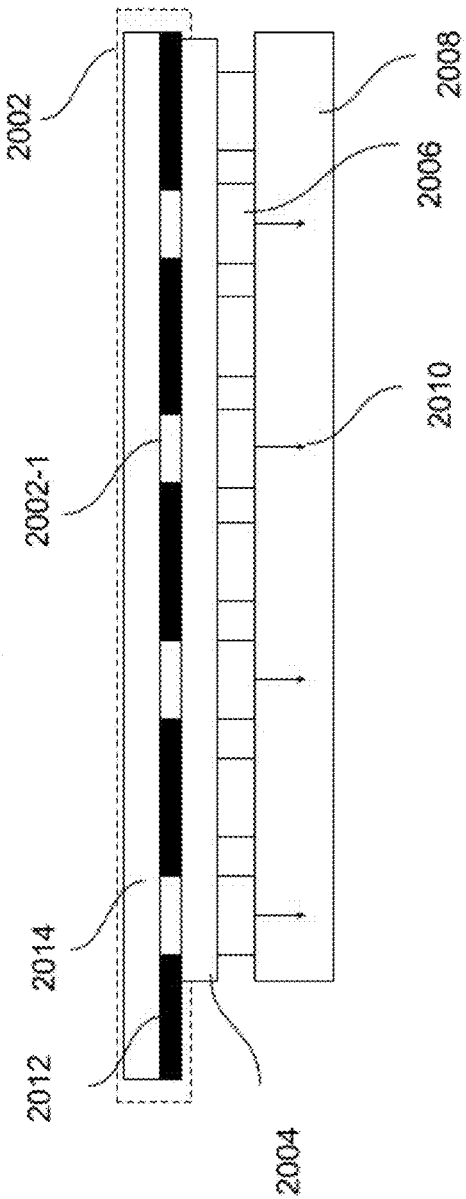
Figure 20A
Figure 20B

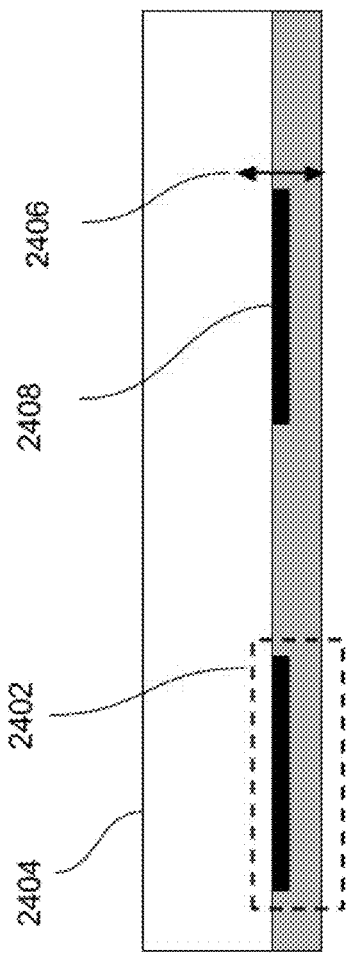
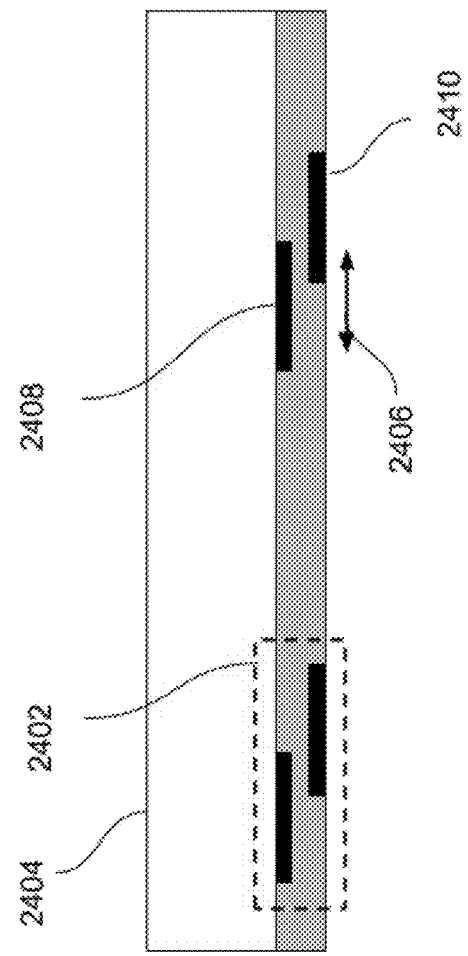

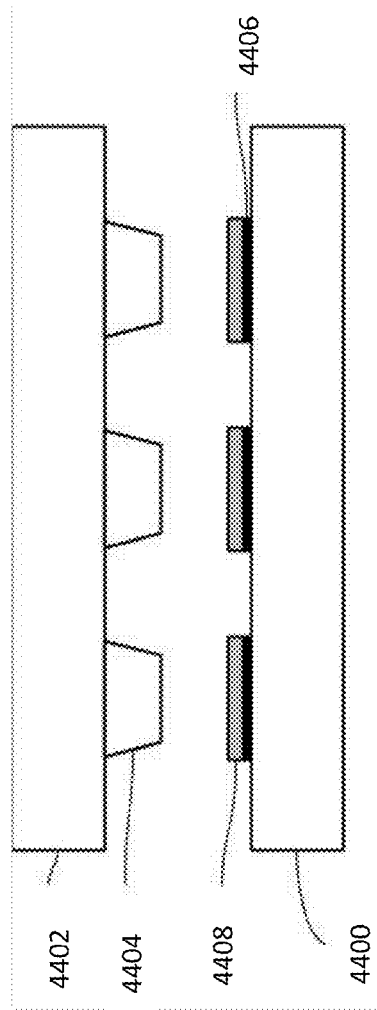

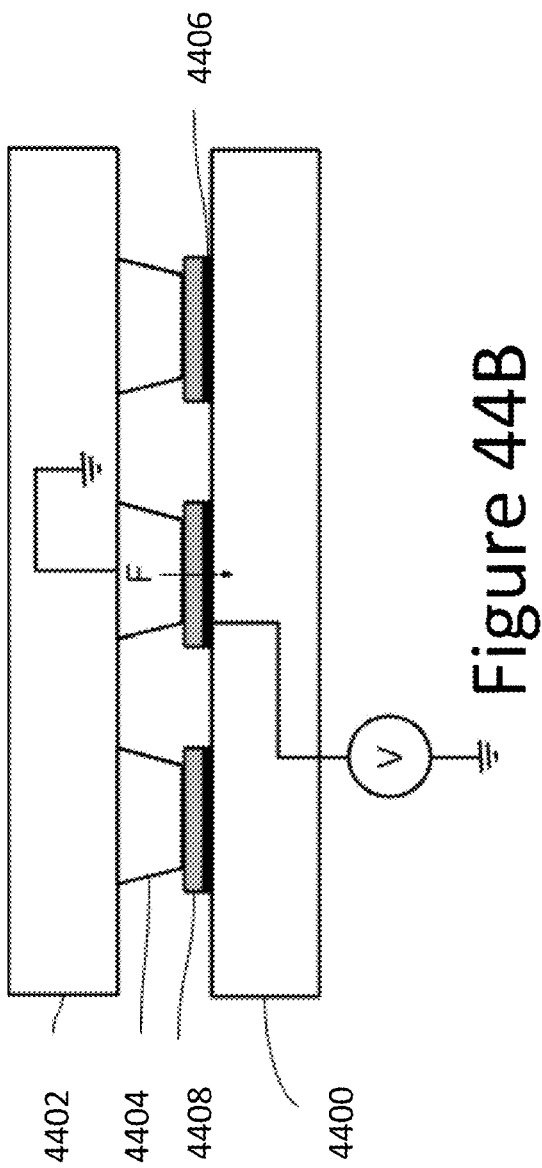

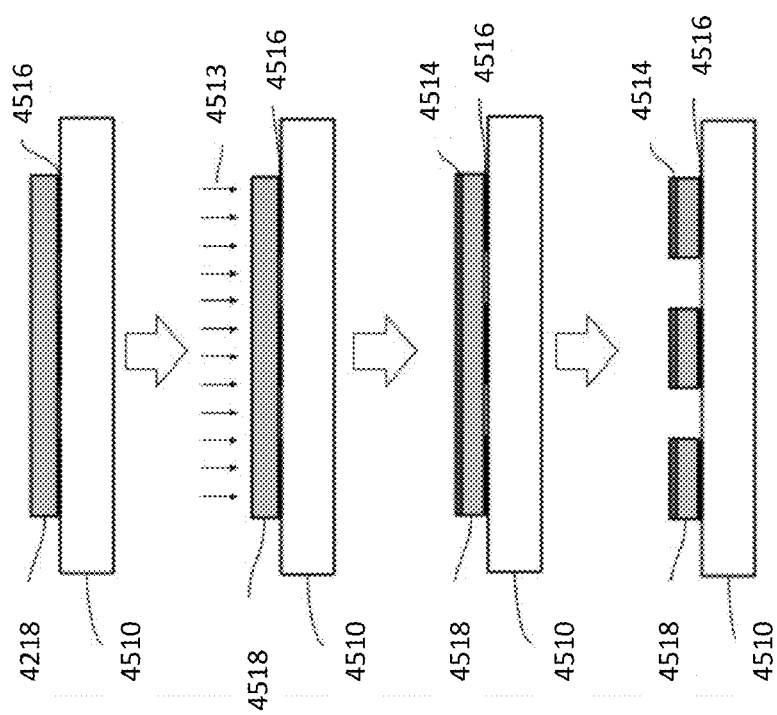

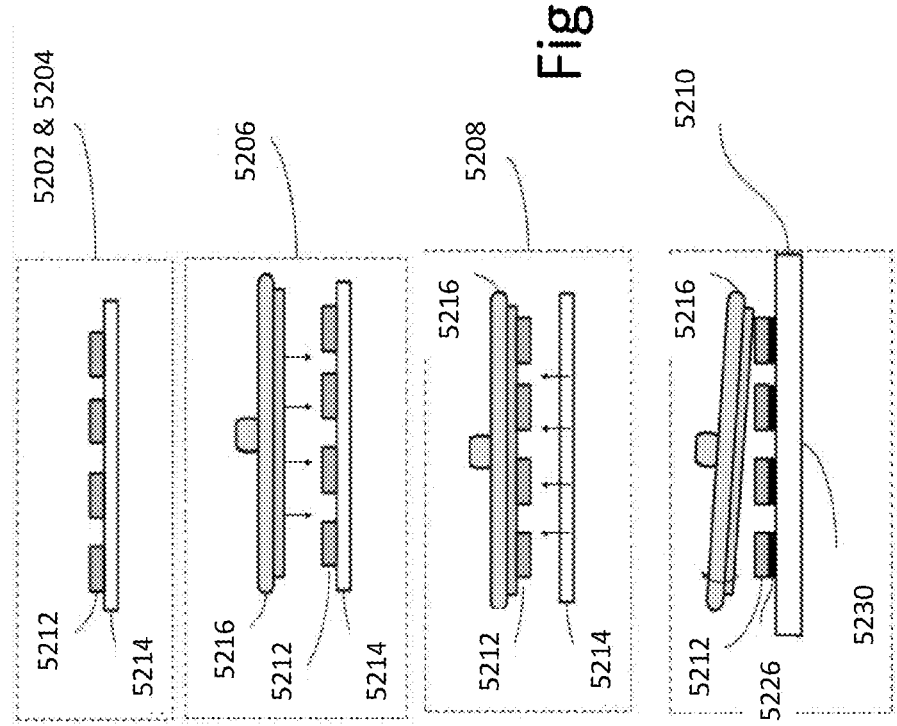

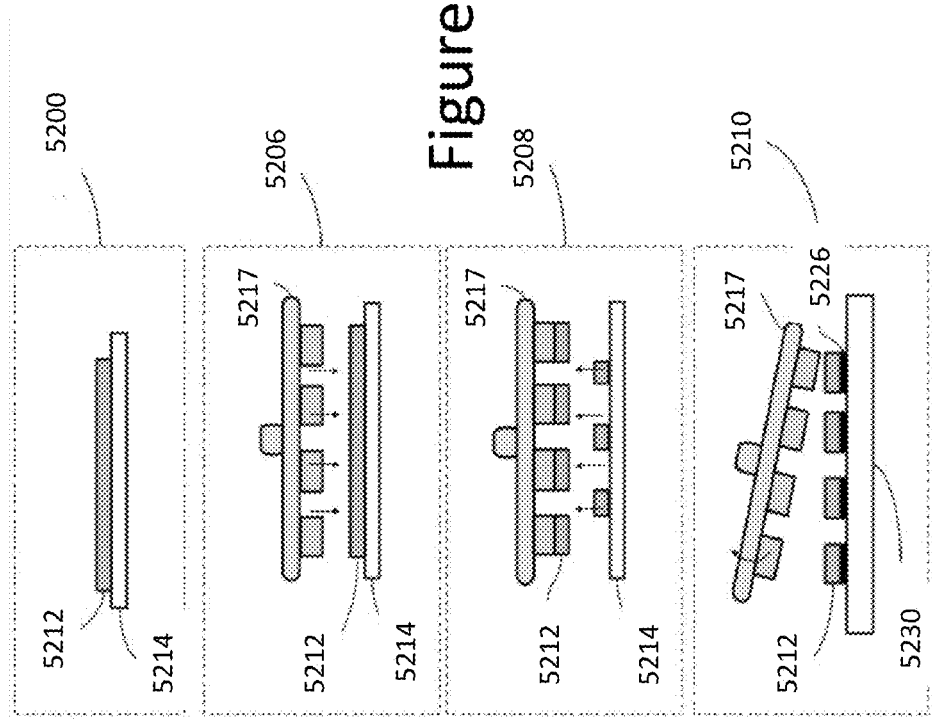

SELECTIVE TRANSFER OF MICRO DEVICES

CROSS-REFERENCE TO RELATED APPLICATION(S)

This application is a division of U.S. application Ser. No. 15/442,293 filed Feb. 24, 2017, which is a continuation-in-part of U.S. application Ser. No. 15/002,662 filed Jan. 21, 2016, and also claims priority to Canadian Application No. 2,921,737 filed Feb. 25, 2016, and Canadian Application No. 2,936,523, filed Jul. 19, 2016, each of which is hereby incorporated by reference herein in its entirety.

FIELD OF THE INVENTION

The present disclosure relates to device integration into system or receiver substrates. More specifically, the present disclosure relates to selective transfer of micro devices from a donor substrate to a receiver substrate.

BRIEF SUMMARY

According to one aspect there is provided, a method of transferring selected micro devices in an array of micro devices each of which is bonded to a donor substrate with a donor force to contact pads in an array on a receiver substrate, the method comprising: aligning the donor substrate and the receiver substrate so that each of the selected micro devices are in line with a contact pad on the receiver substrate (in case contact pad does not pre-exist, other markers in the receiver substrate can be used for alignment); moving the donor substrate and the receiver substrate together until each of the selected micro devices are in contact or proximity with a respective contact pad on the receiver substrate; generating a receiver force that acts to hold the selected micro devices to their contact pads while not affecting other micro devices in contact with or proximity contact with the receiver substrate; and moving the donor substrate and the receiver substrate apart leaving the selected micro devices on the receiver substrate.

Some embodiments further comprise weakening the donor force bonding the micro devices to the donor substrate to assist micro device transfer.

In some embodiments, the donor force for the selected micro devices is weakened to improve selectivity in micro device transfer. In some embodiments, the receiver force is generated selectively to improve selectivity in micro device transfer. Some embodiments further comprise weakening the donor force using laser lift off. Some embodiments further comprise weakening the donor force by heating an area of the donor substrate. Some embodiments further comprise modulating the force by magnetic field. Some embodiments further comprise modulating the receiver force by heating the receiver substrate.

In some embodiments the heating is performed by passing a current through the contact pads. In some embodiments the receiver force is generated by mechanical grip. Some embodiments further comprise performing an operation on the receiver substrate so that the contact pads permanently bond with the selected micro devices.

In some embodiments the receiver force is generated by electrostatic attraction between the selected micro devices and the receiver substrate. In some embodiments the receiver force is generated by an adhesive layer positioned between the selected micro devices and the receiver substrate. Some embodiments further comprise removing the donor force; and applying a push force to selected micro devices to move the devices toward the receiver substrate.

In some embodiments the push force is created by a sacrificial layer deposited between the selected micro device and the donor substrate.

According to another aspect there is provided a receiver substrate structure comprising: an array of landing areas for holding micro devices from a donor substrate selectively, each landing area comprising: at least one contact pad for coupling or connecting a micro device to at least one circuit or a potential in the receiver substrate; and at least one force modulation element for creating a receiver force for holding a micro device on the receiver substrate. For clarity, the area where the micro device sits on the receiver substrate is called the landing area. The contact pad can pre-exist on the receiver substrate or be deposited after the micro device is transferred to the receiver substrate.

In some embodiments the force modulation element is an electrostatic structure. In some embodiments the force modulation element is a mechanical grip. In some embodiments, for each landing area, a same element acts as the force modulation element and the contact pad.

The foregoing and additional aspects and embodiments of the present disclosure will be apparent to those of ordinary skill in the art in view of the detailed description of various embodiments and/or aspects, which is made with reference to the drawings, a brief description of which is provided next.

BRIEF DESCRIPTION OF THE DRAWINGS

The foregoing and other advantages of the disclosure will become apparent upon reading the following detailed description and upon reference to the drawings.

FIGS. 3A-3E show different steps for transferring devices based on 1000A. Similar steps can be used for 1000B and 1000C and combination of 1000A, 1000B, 1000C.

FIG. 3A shows the step of aligning the donor and receiver substrates.

FIG. 3B shows the step of moving the substrates together within a defined distance margin.

FIG. 3C-1 shows one embodiment of modulating the forces by applying receiver forces selectively.

FIG. 3C-2 shows one embodiment of modulating the forces by weakening the donor force selectively and applying receiver force globally.

FIG. 3D shows one embodiment of modulating the forces by applying receiver and weakening donor forces selectively.

FIG. 3E shows the step of moving the substrate apart.

FIG. 5A shows selective and global heating elements incorporated into substrates.

FIG. 6B shows the step of preparing the donor and receiver substrates for selective transfer.

FIG. 6C shows the step of aligning the substrates.

FIG. 6D shows the step of moving the substrates toward each other within a predefined distance margin.

FIG. 6E shows the step of creating receiver forces by curing the adhesive (e.g. applying pressure or heat). This can be globally or selectively.

FIG. 6F shows the step of reducing donor forces if needed. This can be globally or selectively.

FIG. 6G shows the step of moving the substrates away from each other.

FIG. 11A shows the step of aligning donor and receiver substrates.

FIG. 11B shows the step of moving donor and receiver substrates to a defined distance margin while mechanical force is loose.

FIG. 11C shows the step of increasing mechanical forces.

FIG. 11D shows the step of reducing donor forces if needed (this step can be done in advance as well).

FIG. 11E shows moving the donor and receiver substrates away from each other.

FIG. 13A shows the step of aligning the donor and receiver substrates.

FIG. 13B shows the step of moving the substrates within a predefined distance margin.

FIG. 13C shows the step of creating receiver force by applying potential to electrostatic elements. This can be done selectively or globally.

FIG. 13D shows the step of reducing the donor force if needed. This can be done globally or selectively.

FIG. 13E shows the step of moving the substrates away.

FIG. 15A shows another alternative geometry for micro devices and contact pads.

FIG. 15B shows another alternative geometry for micro devices and contact pads.

FIG. 15C shows another alternative geometry for micro devices and contact pads.

FIG. 15D shows another alternative geometry for micro devices and contact pads.

FIG. 15E shows another alternative geometry for micro devices and contact pads.

FIG. 17A shows the step of aligning the donor and receiver substrates.

FIG. 17B shows the step of moving the substrates to a predefined distance margin from each other.

FIG. 17C shows one embodiment for the step of creating a receiver force if needed. This can be globally or selectively. The force can be created with different method.

FIG. 17D shows applying a push force to the micro devices from the donor substrate. The push force from donor substrate should be selective.

FIG. 17E shows the step of moving substrate away.

FIG. 20A shows a selective liftoff process to modulate the force on the donor substrate using shadow mask.

FIG. 20B shows a selective liftoff process to modulate the force on the donor substrate using a patterned mask.

FIG. 24A shows an embodiment for force modulating element by changing the capacitance.

FIG. 24B shows an embodiment for force modulating element by using a shield electrode.

FIG. 44A is a cross sectional view of an array of micro devices on the donor substrate and contact pads on the acceptor one.

FIG. 44B is a cross sectional view of donor and acceptor substrates in which electrostatic force is applied.

FIG. 45B is a cross sectional view of the receiver substrate with dielectric layer in which process of doping top surface of dielectric layer to form a conductive layer is demonstrated.

FIG. 52B is schematic illustration of forming patterned soft dielectric layer on the contact pads by stamping method.

FIG. 52C is schematic illustration of forming patterned soft dielectric layer on the contact pads by using patterned stamper.

Figure 1A:
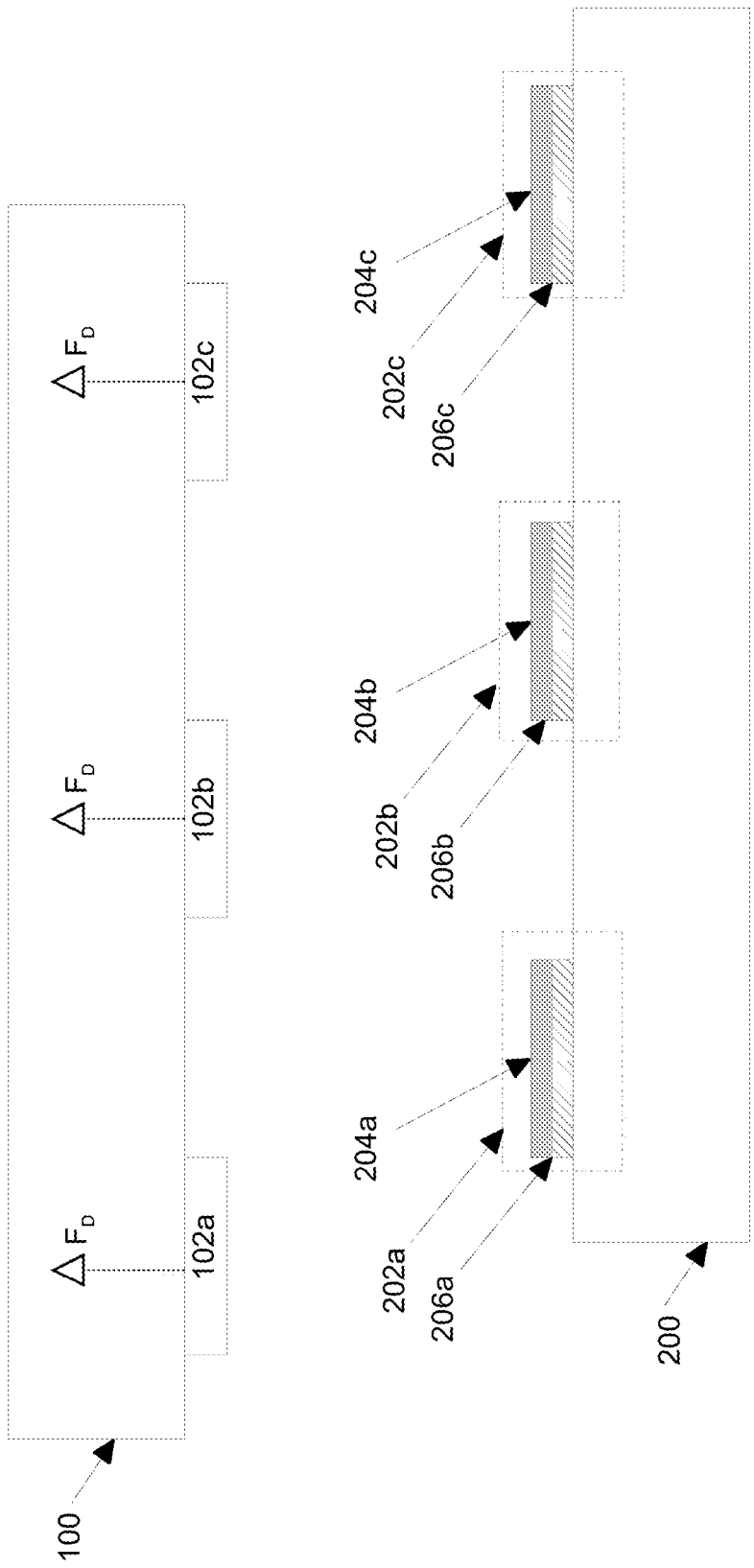
FIG. 1A shows a donor substrate and a receiver substrate before the transfer process begins.

While the present disclosure is susceptible to various modifications and alternative forms, specific embodiments or implementations have been shown by way of example in the drawings and will be described in detail herein. It should be understood, however, that the disclosure is not intended to be limited to the particular forms disclosed. Rather, the disclosure is to cover all modifications, equivalents, and alternatives falling within the spirit and scope of an invention as defined by the appended claims.

DETAILED DESCRIPTION

In one aspect of the invention is transferring a micro device where the method comprising: positioning a donor substrate comprising the micro device proximal to a receiver substrate, wherein the micro device is affixed to the donor substrate by a donor force; and transferring the micro device from the donor substrate to the receiver substrate responsive to selectively reducing the donor force affixing the micro device to the donor substrate.

In one case, the donor force is reduced by physically shielding the micro device from the donor force.

Alternatively, the selectively reducing the donor force comprises changing the bias condition of donor force.

In another method, selectively reducing the donor force comprises selectively applying a form of light to the micro device using a shadow mask.

In another method, reducing the donor force comprises changing a distance between the micro device and a source of the donor force.

Another aspect of the invention is a method of transferring a micro device, the method comprising: positioning a donor substrate comprising the micro device proximal to a receiver substrate, wherein the receiver substrate comprises a force modulator element; and transferring the micro device from the donor substrate to the receiver substrate responsive to selectively reducing the distance between the micro device and the force modulator element.

In one case, reducing the distance between the micro device and the force modulator element comprises moving the micro device toward the force modulator element using a membrane.

In another case, reducing the distance is done mechanically moving the device closer to the receiver substrate.

Alternatively, a sacrificial layer can be used that changes volume under some triggers such as temperature, light, or voltage potential and so moving the micro device closer to the system substrate.

Another aspect of the invention is a method of transferring a micro device, the method comprising: positioning a donor substrate comprising the micro device proximal to a receiver substrate, wherein the receiver substrate comprises a force modulator element creating transfer force for transferring the selected micro devices; and reducing the effect of said force generated by the force modulator element on unwanted micro devices.

In one aspect of the invention, selectively reducing the effect of a force generated by the force modulator element comprises generating a reverse polarity of force surrounding the force modulating element.

Another aspect of the invention is a method of transferring micro devices, the method comprising: positioning a donor substrate comprising micro devices proximal to a receiver substrate, wherein the receiver substrate comprises a current curable bonding layer; and transferring the micro devices by applying current to the bonding layer of selected micro devices.

In one case, the current is applied using a circuit in the receiver substrate.

In one case, the circuit in the receiver substrate is shared with a circuit associated the driving or controlling the selected micro devices.

In another case, the bonding layer comprises one or more contact pads and selectively curing a portion of the bonding layer comprises curing a portion of the bonding layer between one or more contact pads.

In another aspect of the invention, a receiver substrate used to receive a micro device from a donor substrate, the receiver substrate comprising: an array of one or more pad structures, wherein each pad structure comprises a conductive layer and a dielectric layer In one case, the dielectric layer can be modulated to be a conductive layer.

In another case, the dielectric layer is modulated to the conductive layer during operation to couple a circuit in the receiver substrate to the micro device.

In another case, the dielectric layer is modulated to the conductive layer using a doped layer.

In another alternative case, the dielectric layer is modulated to the conductive layer using a laser to induce dielectric breakdown.

In another alternative case, the dielectric layer creates electrostatic force that attracts the micro device from the donor substrate.

Another aspect of the invention is a method of transferring a micro device, the method comprising: positioning a donor substrate comprising a micro device proximal to a receiver substrate, wherein the receiver substrate comprises a pad structure having a dielectric layer and a conductive layer; transferring the micro device from the donor substrate to the pad structure; and coupling transferred micro devices and the conductive layer by removing the dielectric layer.

In one case, the dielectric layer is removed by the means of mechanical force.

In another case, the dielectric layer is removed by the means of thermal force.

Another aspect of the invention is a method of using a deformable layer on top of the receiver pads or landing area to adjust for different height in the micro devices.

In one aspect, the deformable layer is an either conductive layer, high resistive layer, or a dielectric layer.

The conformal layer can be used in combination with any of the transfer methods.

Many micro devices, including light emitting diodes (LEDs), Organic LEDs, sensors, solid state devices, integrated circuits, MEMS (micro-electro-mechanical systems) and other electronic components, are typically fabricated in batches, often on planar substrates. To form an operational system, micro devices from at least one donor substrate need to be selectively transferred to a receiver substrate.

Figure 1B:
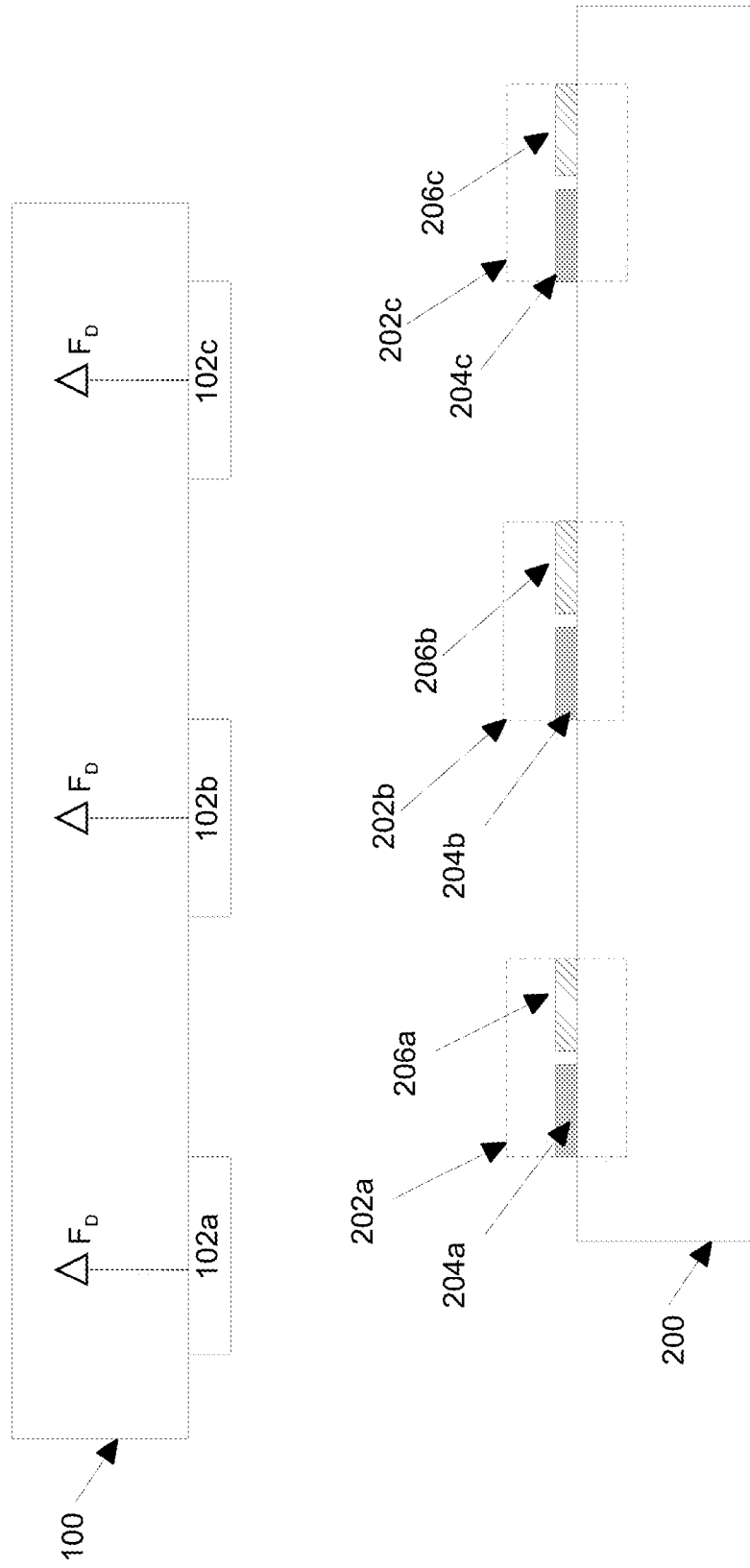
FIG. 1B shows a donor substrate and a receiver substrate before the transfer process begins.
Figure 3A:
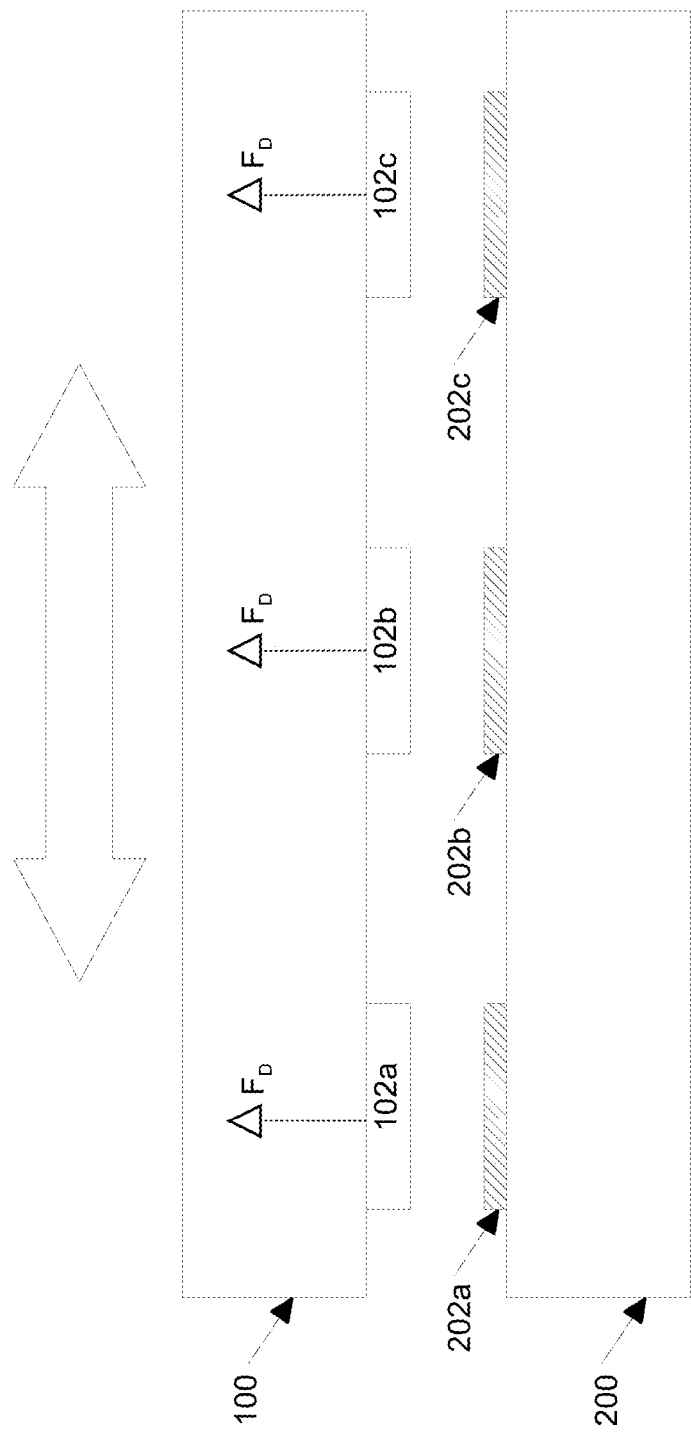
Figure 3B:
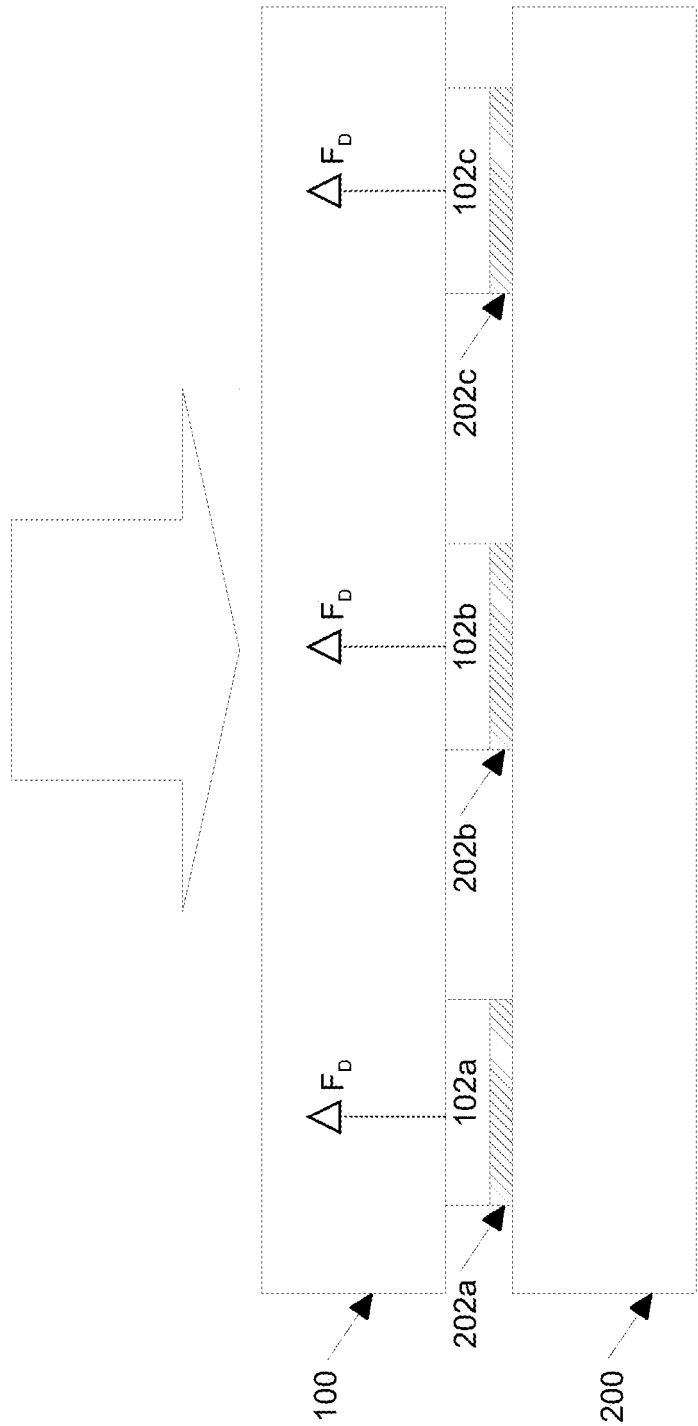
Figures 1, 3C:
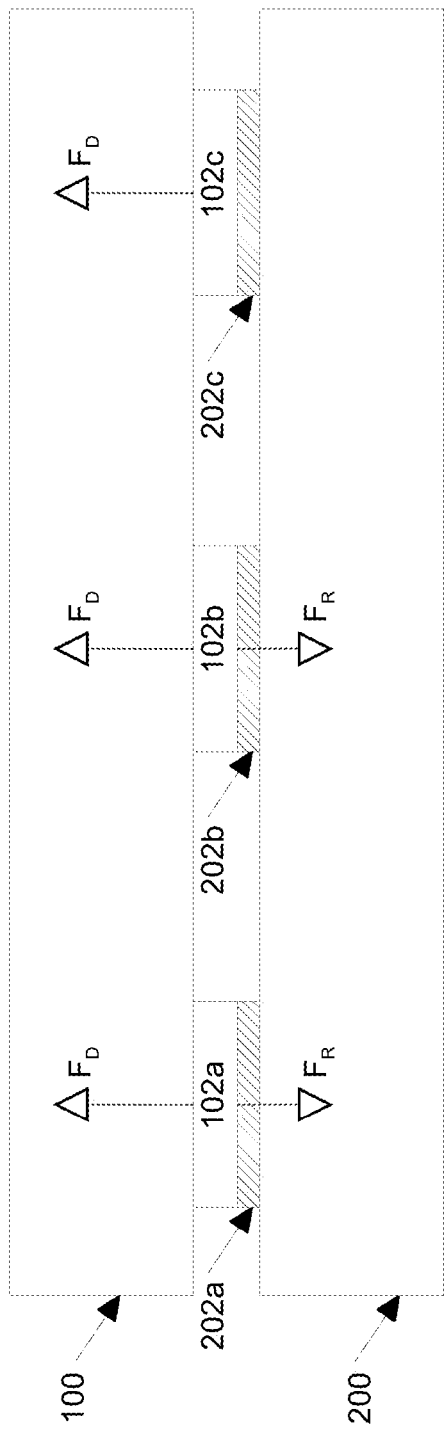

Substrate and Transfer Structure:

FIG. 1 shows a donor substrate 100 and receiver substrate 200, before the transfer process begins. Micro devices 102a, 102b, 102c begin in an array attached to donor substrate 100. The receiver substrate consists of an array of landing areas 202a, 202b, 202c where the micro devices will sit. The landing areas 202a, 202b, 202c each include at least one force modulation element 204a, 204b, 204c and at least a contact pad 206a, 206b, 206c. The force modulation element and contact pads can be different as shown in FIG. 1A or can be the same structure as shown in FIG. 1B. The micro devices 102 may be coupled or connected to a circuit or a potential on the receiver substrate 200 through contact pads 206a, 206b, 206c. The force modulation elements 204a, 204b, 204c create a transfer force to hold the micro device 102a, 102b, 102c selectively on the receiver substrate 200 and separate them from the donor substrate 100. The donor substrate 100 is the substrate upon which micro devices 102 are manufactured or grown or another temporary substrate onto which they have been transferred. Micro devices 102 can be any micro device that is typically manufactured in planar batches including LEDs, OLEDs, sensors, solid state devices, integrated circuit, MEMS, and other electronic components. Donor substrate 100 is chosen according to the manufacturing process for a particular type of micro device 102. For example, in the case of conventional GaN LEDs, donor substrate 100 is typically sapphire. Generally, when growing GaN LEDs, the atomic distance of donor substrate 100 should match that of the material being grown in order to avoid defects in the film. Each micro device 102 is attached to donor substrate 100 by a force, FD, determined by the manufacturing process and the nature of the micro devices 102. FD will be substantially the same for each micro device 102. Receiver substrate 200 can be any more desirable location for micro devices 102. It can be, for example, a printed circuit board (PCB), a thin film transistor backplane, an integrated circuit substrate, or, in the case of optical micro devices 102 such as LEDs, a component of a display, for example a driving circuitry backplane. The landing area on the receiver substrate as shown in FIG. 1B refers to the location where micro device sits on the receiver substrate and may consist of at least one contact pad 101a and at least one force modulation element 101b. Although in some of the figures the landing area may be the same size as the contact pads 202, the contact pads 202 can be smaller than the landing area. Contact pads 202 are the locations where micro devices may be coupled or directly connected to the receiver substrate 200. In this description, landing area and contact pads are used interchangeably.

The goal in selective transfer is to transfer some, selected micro devices 102, from donor substrate 100 to receiver substrate 200. For example, the transfer of micro devices 102a and 102b onto contact pads 206a and 206b without transferring micro device 102c will be described.

Transfer Process

The following steps describe a method of transferring selected micro devices in an array of micro devices each of which is bonded to a donor substrate with a donor force to contact pads in an array on a receiver substrate:
  a. aligning the donor substrate and the receiver substrate so that each of the selected micro devices are in line with a contact pad on the receiver substrate; (in case the contact pad does not pre-exist on the receiver substrate, the alignment can be also done using other marks; or device can be aligned to transfer force modulation element).
  b. moving the donor substrate and the receiver substrate together until each of the selected micro devices are in contact with or proximity with at least one contact pad on the receiver substrate;
  c. generating a receiver force that acts to hold the selected micro devices to their contact pads;
  d. moving the donor substrate and the receiver substrate apart leaving the selected micro devices on the receiver substrate while other non-selected micro devices from donor substrate stays on donor substrate despite possible contact with or proximity contact with the receiver substrate during steps b and c.

In some cases, the contact pad can be deposited after the device is transferred to the receiver substrate. If the donor force is too strong for receiver force to overcome for transferring the micro device to the receiver substrate, the donor force for micro devices is weakened to assist micro device transfer. In addition, if the receiver force is applied globally or selective receiver force is not enough to transfer the micro devices selectively, the donor force for the selected micro devices is weakened selectively to improve selectivity in micro device transfer.

Figure 2A:
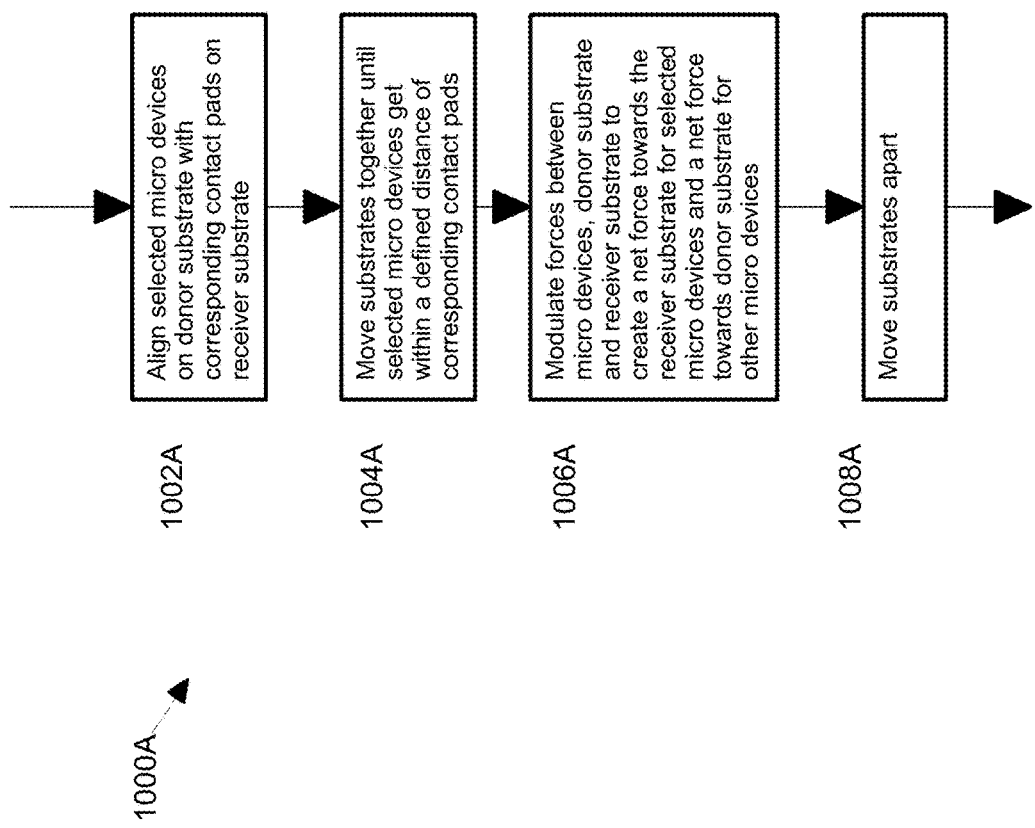
FIG. 2A shows a flowchart of modulating at least one of the donor or receiver forces after donor and receiver substrates are in contact or proximity with each other.
Figure 2B:
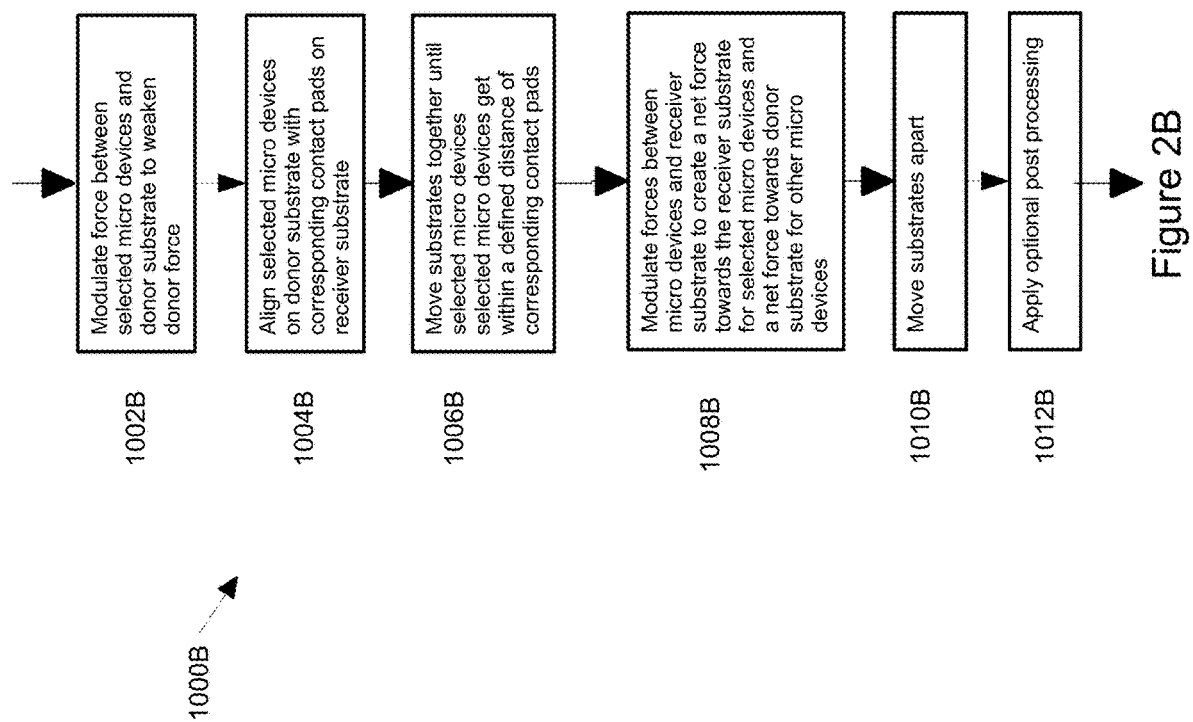
FIG. 2B shows a flowchart of modulating the donor forces in advance and modulating receiver forces if needed after donor and receiver substrates are in contact or proximity with each other.
Figure 2C:
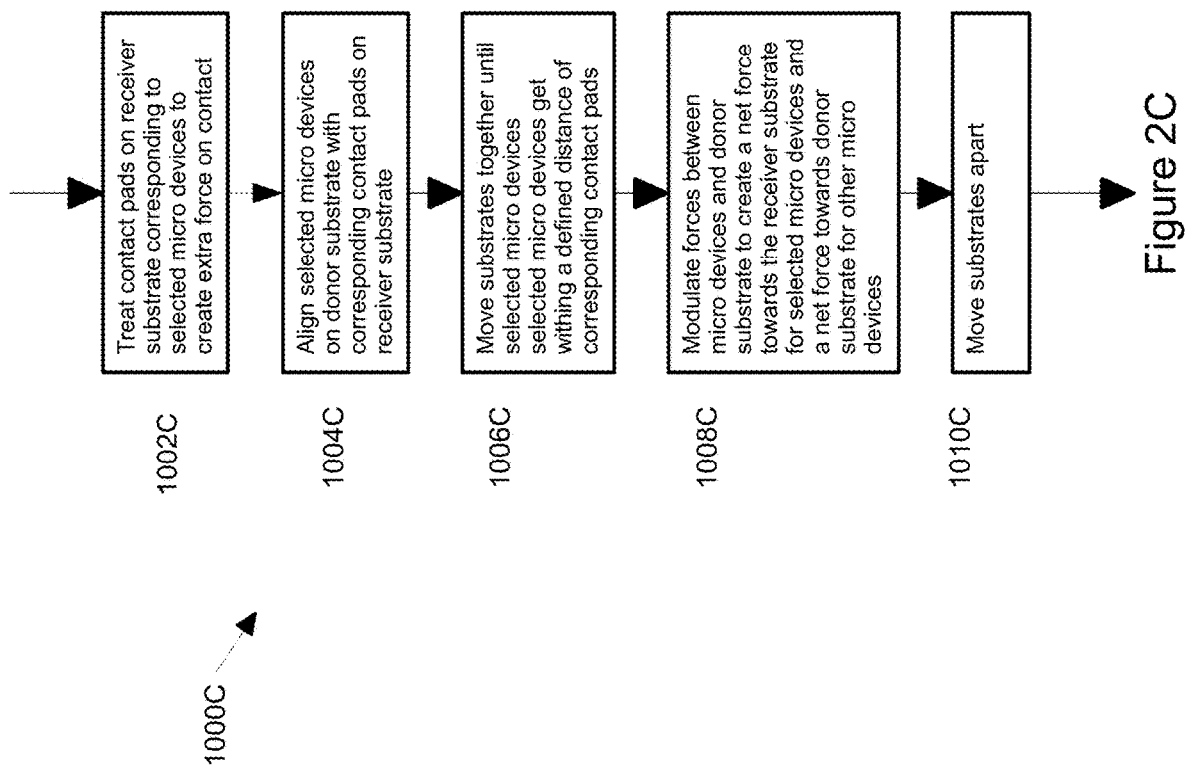
FIG. 2C shows a flowchart of modulating the receiver forces in advance and modulating donor forces if needed after donor and receiver substrates are in contact or proximity with each other.

FIGS. 2A-2C show exemplary flowcharts of selective transfer methods 1000A-1000C. FIG. 1 shows a donor substrate 100 and a receiver substrate 200 suitable for performing any of methods 1000. Method 1000A will be described with reference to FIGS. 3A-3E. Methods 1000B and 1000C are analogous variations of method 1000A. One can use the combination of methods 1000A-1000C to further enhance the transfer process.

At 1002A donor substrate 100 and receiver substrate 200 are aligned so that selected micro devices 102a, 102b are in line with corresponding contact pads 202a, 202b, as shown in FIG. 3A. Micro device 102c is not to be transferred so, although shown as aligned, it may or may not align with contact pad 202c.

At 1004A, donor substrate 100 and receiver substrate 200 are moved together until the selected micro devices 102a, 102b are positioned within a defined distance of contact pads 202a, 202b, as shown in FIG. 3B. The defined distance may correspond to full or partial contact but is not limited thereto. In other words, it may not be strictly necessary that selected micro devices 102a, 102b actually touch corresponding contact pads 202a, 202b, but must be near enough so that the forces described below can be manipulated.

At 1006A, forces between selected micro devices 102, donor substrate 100 and receiver substrate 200 (and contact pads 202) are modulated so as to create a net force towards receiver substrate 200 for selected micro devices and a net force towards donor substrate 100 (or zero net force) for other micro devices 102c.

Consider the forces acting one of the selected micro devices 102. There is a pre-existing force holding it to donor substrate 100, FD. There is also a force generated between micro device 102 and receiver substrate 200, FR, acting to pull or hold micro device 102 towards receiver substrate 200 and cause a transfer. For any given micro device 102, when the substrates are moved apart, if FR exceeds FD the micro device 102 will go with receiver substrate 200, while if FD exceeds FR the micro device 102 will stay with donor substrate 100. There are several ways to generate FR that will be described in later sections. However, once FR has been generated, there are at least four (4) possible ways to modulate FR and FD to achieve transfer of selected micro devices.
  1. Weaken FD to be less than FR on micro devices selected for transfer.
  2. Strengthen FR to be greater than FD on micro devices selected for transfer.
  3. Weaken FR to be less than FD on micro devices NOT selected for transfer.
  4. Strengthen FD to be greater than FR on micro devices NOT selected for transfer.

Figures 2, 3C:
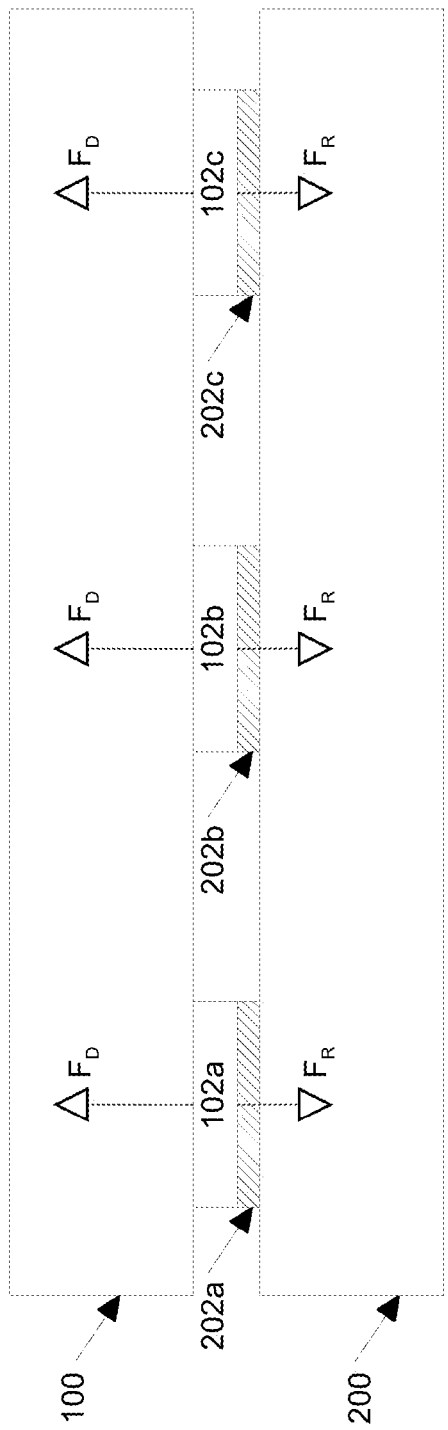

Different combinations and arrangements of the above are also possible. Using combinations may, in some cases, be desirable. For example, if the required change in FD or FR is very high, one can use a combination of modulation of FD and FR to achieve the desired net forces for the selected and the non-selected micro devices. Preferably, FR can be generated selectively and therefore act only on selected micro devices 102a, 102b, as shown in FIG. 3C-1. FR can also be generated globally and apply across all of receiver substrate 200 and therefore act on micro devices 102a, 102b, 102c, as shown in FIG. 3C-2 here donor forces may selectively get weakened. The landing area on the receiver substrate may include a force modulation element to cause FR force modulation, fully or partially. Methods for selective and global generation of FR will be described below, including adhesive, mechanical and electrostatic and magnetic techniques. Additionally, examples of force modulation elements in landing area are described below. However, one of skill in the art knows that different variations of the force modulation elements that are not listed here are possible. Moreover, it should be understood that the shapes and structures of the contact pads and the force modulation elements are used for explanation and are not limited to the ones used in this description.

Figure 3D:
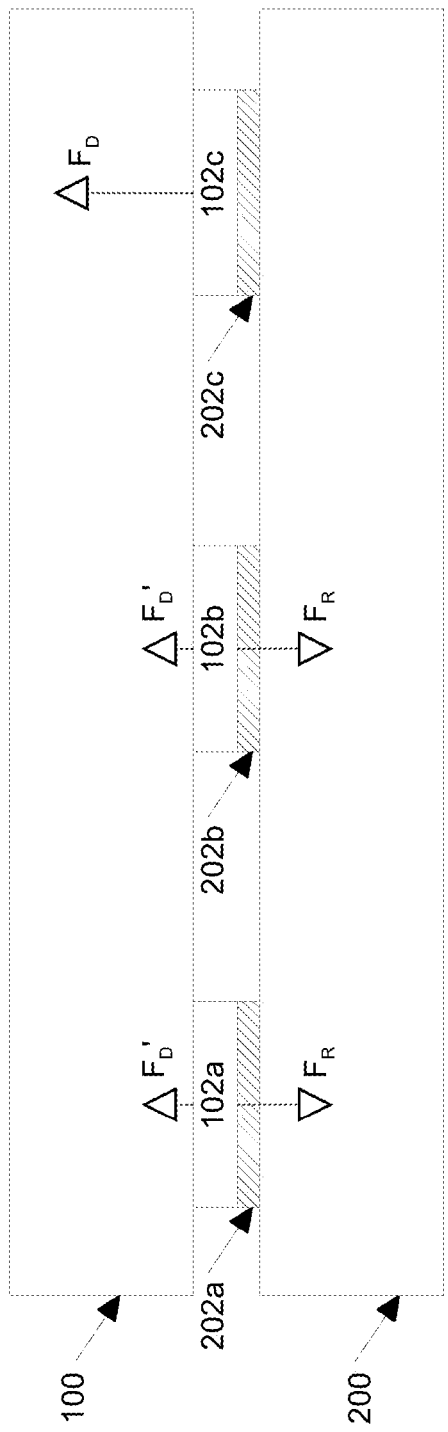

In one embodiment, donor force FD is selectively weakened for selected micro devices 102a, 102b, so that FD' is less than FR, as shown in FIG. 3D. This may be done, for example, using laser lift off techniques, lapping or wet/dry etching, or temperature. In case of temperature, localized temperature can change the material characteristics bonding the devices 102 to donor substrate 100 and so reducing the donor force FD. In another case, the donor force FD is weakened globally. This process can be done part of transferring the devices 102 to a temporarily substrate or it can be done at the original substrate. In both cases, the donor force FD can be weak prior to transfer to the receiver substrate or some extra trigger force or effects may be needed during the transfer to make the donor force FD weak. The trigger effect can be higher temperature, pressure, or chemical reaction. In some cases, it may be desirable to use selective and global generation of FR simultaneously. For example, it may be infeasible to generate a selective FR of sufficient magnitude to overcome FD' alone. In that case, the global component of FR should preferably remain small, ideally less than FD', while the sum of the global and the selective components of FR is greater than FD', but less than FD.

It should also be noted that activities performed during steps 1002A-1006A can sometimes be interspersed with one another. For example, selective or global weakening of FD could take place before the substrates are brought together.

Figure 3E:
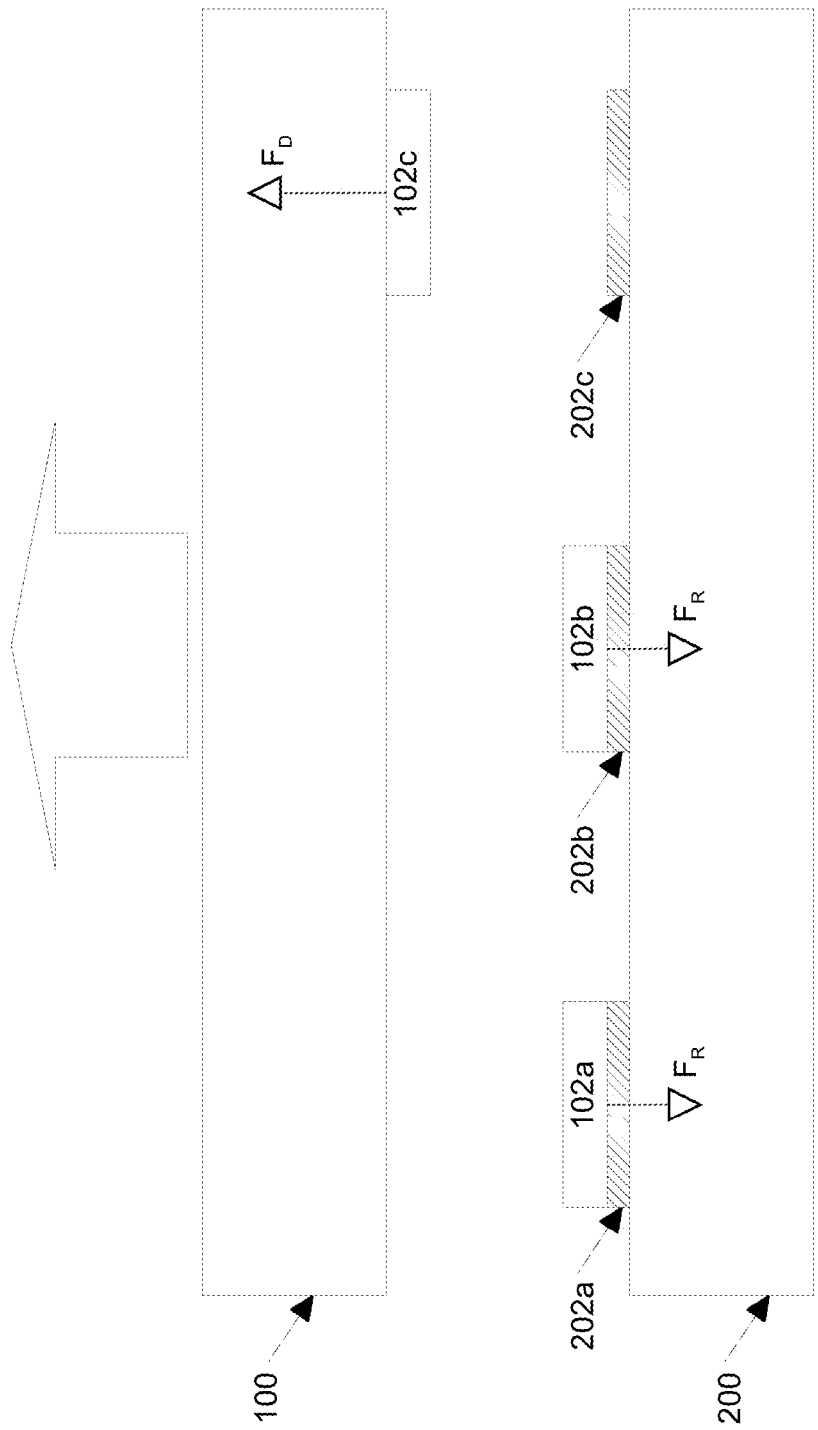

At 1008A, donor substrate 100 and receiver substrate 200 are moved apart, leaving selected micro devices 102a, 102b attached to corresponding contact pads 202a, 202b, as shown in FIG. 3E. Once donor substrate 100 is separated from receiver substrate 200, further processing steps can be taken place. For example, donor substrate 100 and receiver substrate 200 can be re-aligned and steps 1002A to 1008A can be repeated in order to transfer a different set of micro devices 102 to a different set of contact pads 202. Additional layers can also be deposited on top of or in between micro devices 102, for example, during the manufacture of a LED display, transparent electrode layers, fillers, planarization layers and other optical layers can be deposited.

FIG. 2B shows method 1000B; an alternative embodiment of method 1000A.

At 1002B, the force between micro devices 102a, 102b and donor substrate 100 are modulated globally (for all devices in an area of donor substrate) or selectively (for selected micro devices 102a, 102b only) so as to weaken donor force, FD.

At 1004B donor substrate 100 and receiver substrate 200 are aligned so that selected micro devices 102a, 102b are in line with corresponding contact pads 202a, 202b.

At 1006B, donor substrate 100 and receiver substrate 200 are moved together until the selected micro devices 102a, 102b touch contact pads 202a, 202b. It may not be strictly necessary that selected micro devices 102a, 102b actually touch corresponding contact pads 202a, 202b, but must be near enough so that the forces described below can be manipulated.

At 1008B, if needed the forces between selected micro devices 102 and receiver substrate 200 (and contact pads 202) are modulated so as to create a net force towards receiver substrate 200 for selected micro devices and a net force towards donor substrate 100 (or zero net force) for other micro devices 102c.

At 1010B, donor substrate 100 and receiver substrate 200 are moved apart, leaving selected micro devices 102a, 102b attached to corresponding contact pads 202a, 202b.

At 1012B, optional post processing is applied to selected micro devices 102a, 102b. Once donor substrate 100 is separated from receiver substrate 200, further processing steps can be taken. Additional layers can be deposited on top of or in between micro devices 102, for example, during the manufacture of a LED display, transparent electrode layers, fillers, planarization layers and other optical layers can be deposited. Step 1012B is optional and may be applied at the conclusion of method 1000A or 1000C as well.

FIG. 2C shows method 1000C; an alternative embodiment of method 1000A.

At 1002C, contact pads 202a, 202b corresponding to selected micro devices 102a, 102b are treated to create extra force upon contact. For example, an adhesive layer may be applied, as described in greater detail below.

At 1004C donor substrate 100 and receiver substrate 200 are aligned so that selected micro devices 102a, 102b are in line with corresponding contact pads 202a, 202b.

At 1006C, donor substrate 100 and receiver substrate 200 are moved together until the selected micro devices 102a, 102b touch contact pads 202a, 202b.

At 1008C, if needed the forces between selected micro devices 102 and donor substrate 100 are modulated so as to create a net force towards receiver substrate 200 for selected micro devices and a net force towards donor substrate 100 (or zero net force) for other micro devices 102c.

At 1010B, donor substrate 100 and receiver substrate 200 are moved apart, leaving selected micro devices 102a, 102b attached to corresponding contact pads 202a, 202b.

Multiple Applications

Any of the methods 1000A, 1000B, 1000C can be applied multiple times to the same receiver substrate 200, using different or the same donor substrates 100 or the same donor substrate 100 using different receiver substrates 200. For example, consider the case of assembling a display from LEDs. Each pixel may comprise red, green and blue LEDs in a cluster. However, manufacturing LEDs is more easily done in batches of a single color and on substrates that are not always suitable for incorporation into a display. Accordingly, the LEDs must be removed from the donor 100 substrate, possibly where they are grown, and placed on a receiver substrate, which may be the backplane of a display, in RGB clusters. In case, the color This is simplest when the pitch of the array of pixels can be set to match the pitch of the array of LEDs on the donor substrate.

Figure 4A:
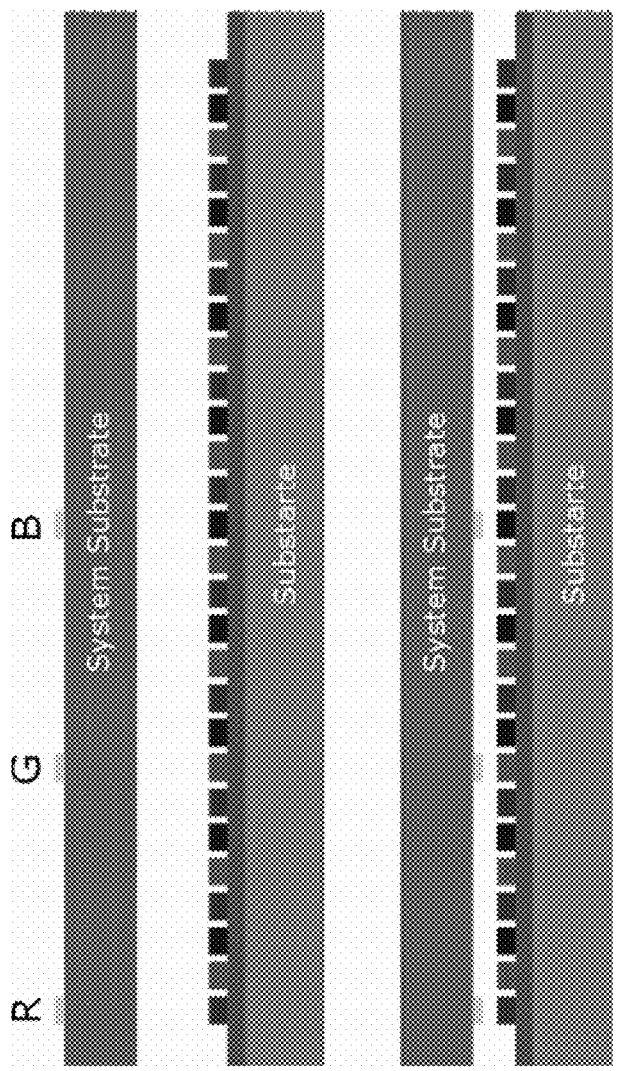
FIG. 4A shows a donor substrate with different micro devices interleaved and the corresponding contact pads in the receiver substrate are aligned with each micro devices accordingly enabling transferring different micro devices at once.
Figure 4B:
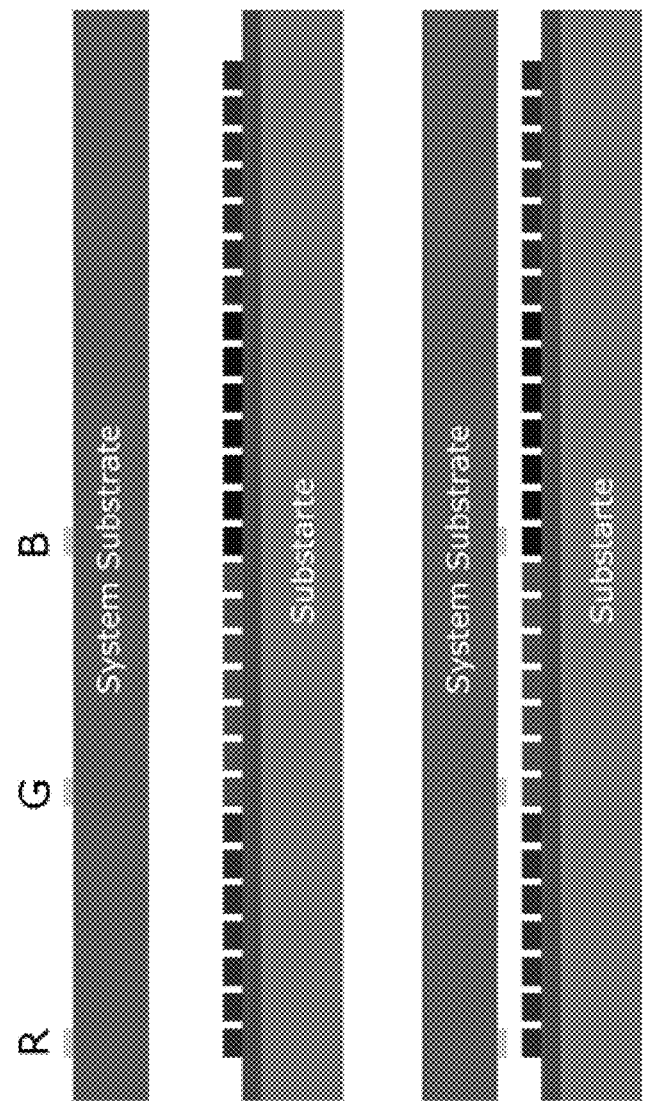
FIG. 4B shows a donor substrate with different micro devices in groups and the corresponding contact pads in the receiver substrate are aligned with each micro devices accordingly enabling transferring different micro devices at once.

When this is not possible, the pitches of each array can be set proportionally. FIGS. 4A and 4B show arrangements where the pitch of the LEDs on the donor substrate is one seventh the pitch of the contact pads on the receiver substrate.

Figure 4C:
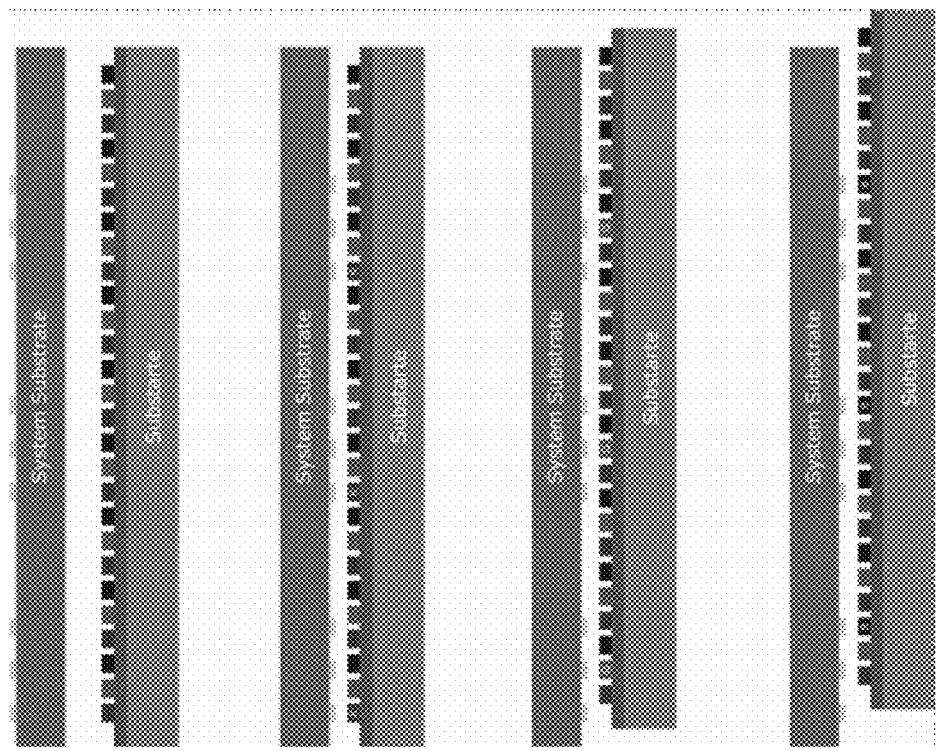
FIG. 4C shows a donor substrate with different micro devices interleaved and only one set of the corresponding contact pads in the receiver substrate with one of the micro device types is aligned with each micro devices accordingly so multiple transferring process is needed to transfer all different types of micro devices.

In general, however, matching the pitch of an array of pixels to the donor substrate is likely to be infeasible. For example, one generally tries to manufacture LEDs with the smallest possible pitch on the donor substrate to maximize yield, but the pitch of the pixels and the array of contact pads on the receiver substrate is designed based on desired product specifications such as size and resolution of a display. In this case, one may not be able to transfer all the LEDs in one step and repetition of any of the methods 1000A, 1000B, 1000C will be necessary. Accordingly, it may be possible to design the donor substrate and the receiver substrate contact pad array so that a portion of each pixel can be populated during each repetition of any of methods 1000A, 1000B, 1000C as shown in FIG. 4C. At I, receiver substrate and donor substrate are not aligned. At II, all red LEDs are transferred. At III, all green LEDs are transferred. At IV, all blue LEDs are transferred. Repositioning of donor substrate and receiver substrate is required between each transfer step.

Those of skill in the art will now understand that that additional variations and combinations of methods 1000A, 1000B and 1000C are also possible. Specific techniques and considerations are described below that will apply to any of methods 1000, alone or in combination.

Use of Heat for Force Modulation

Selective and global heating can be used in multiple ways to assist in method 1000A. For example, heat can be used in step 1008A to weaken FD or after step 1008A to create a permanent bond between micro devices 102 and contact pads 202. In one embodiment, heat can be generated using resistive elements incorporated into donor substrate 100 and/or receiver substrate 200.

Figure 5B:
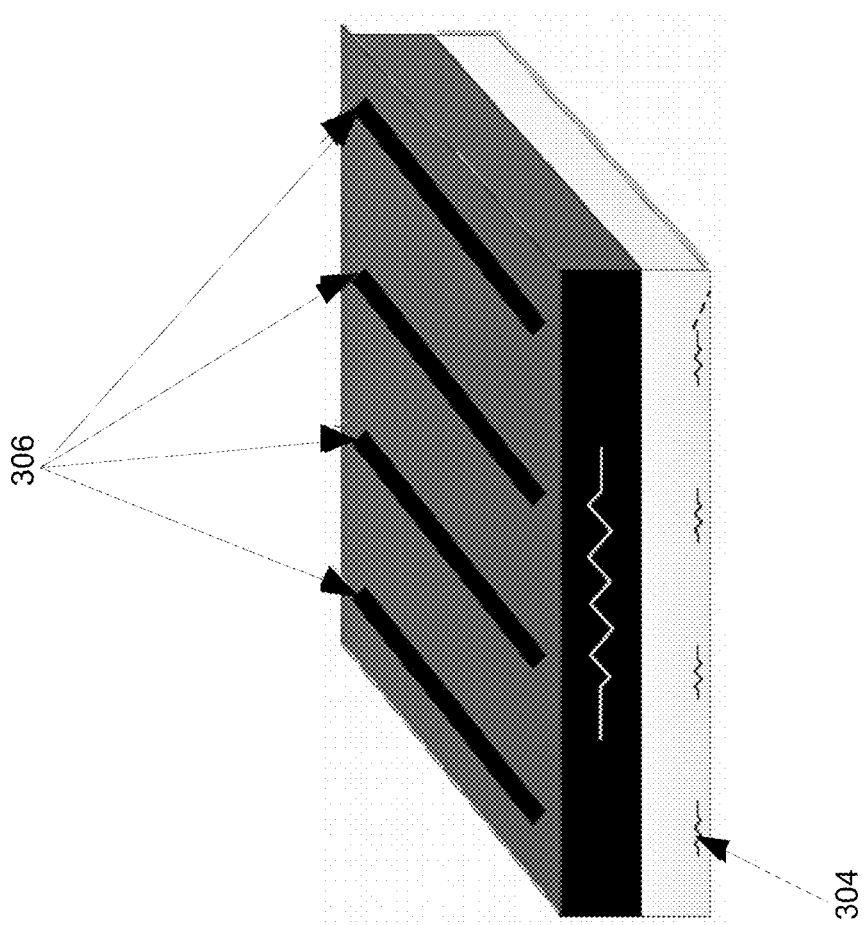
FIG. 5B shows one embodiment for pattering selective and global heating elements incorporated into substrates.

FIG. 5A shows selective and global heating elements incorporated into substrates. Selective heating elements 300 and global heating element 302 may be incorporated into donor substrate 100 while selective heating elements 304 and global heating element 306 may be incorporated into receiver substrate 200. In another embodiment, selective heating can be achieved using a patterned global heater, shown in FIG. 5B.

FD can be weakened by applying heat to the interface between a micro device 102 and donor substrate 100. Preferably, selective heating elements 300 are sufficient to heat the interface past a threshold temperature where micro devices 102 will detach. However, when this is not feasible, global heater 302 can be used to raise the temperature to a point below the threshold while selective heaters 300 raise the temperature further, only for selected micro devices 102a, 102b above the threshold. An environmental heat source, e.g. a hot room, can substitute for the global heater.

Heat can also be used to create a permanent bond between micro devices 102 and contact pads 202. In this case, contact pads 202 should be constructed of a material that will cure when heated, creating a permanent bond. Preferably, selective heating elements 304 are sufficient to heat contact pads 202 past a threshold temperature to cause curing. However, when this is not feasible, global heater 306 can be used to raise the temperature to a point below the threshold for curing while selective heaters 304 raise the temperature for selected contact pads 202a, 202b above the threshold. An environmental heat source, e.g. a hot room, can substitute for the global heater. Pressure may also be applied to aid in permanent bonding.

Figure 5C:
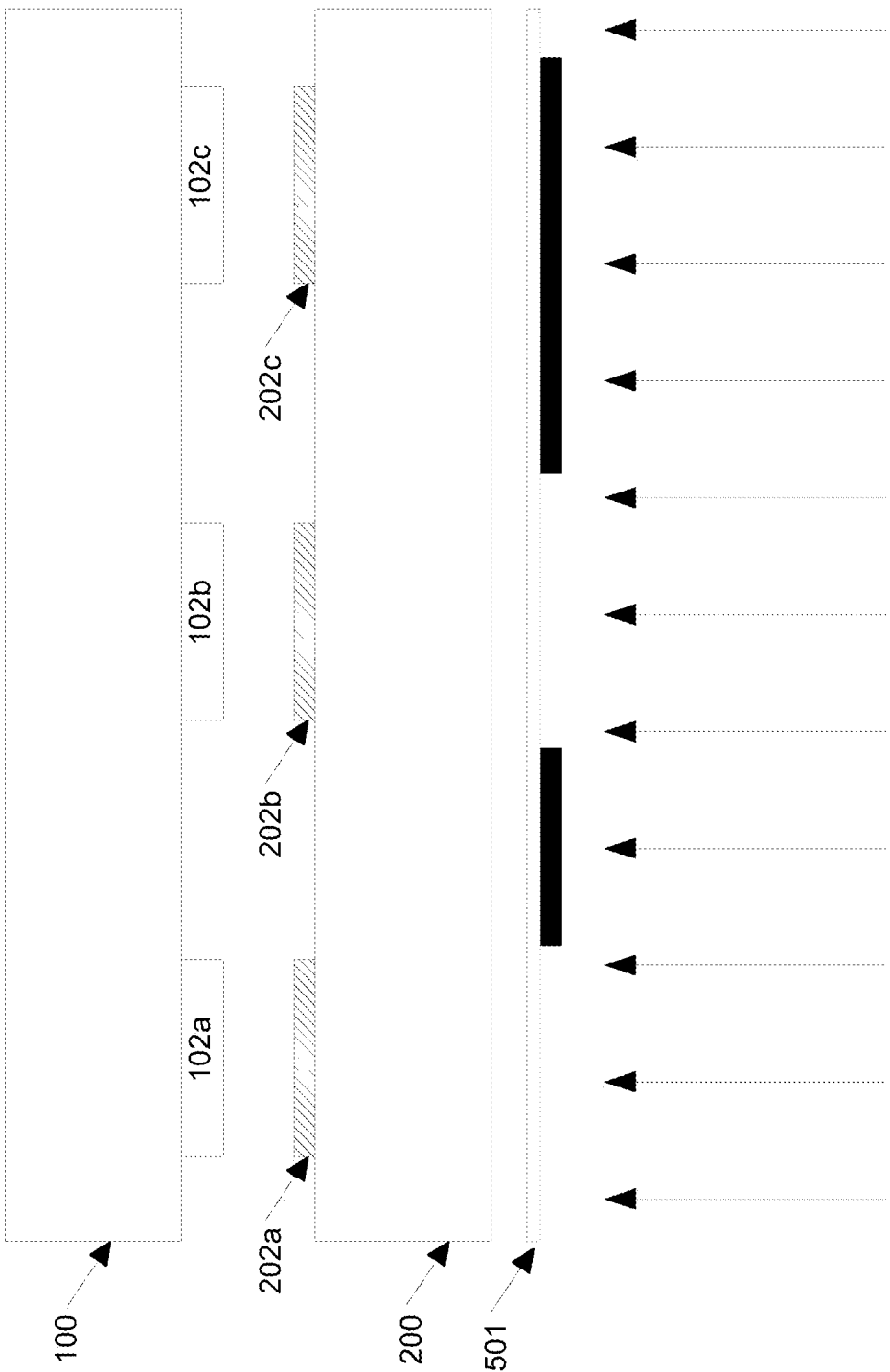
FIG. 5C shows use of external sources to selectively heat up at least one substrate.

Other variations are possible. In some cases, it may be feasible for micro devices 102 or contact pads 202 to themselves act as the resistive elements in selective heaters 300, 304. Heat can also be applied in a selective manner using lasers. In the case of lasers, it is likely that at least one of the donor substrate 100 and the receiver substrate 200 will have to be constructed of material that is at least semi-transparent to the laser being used. As shown in FIG. 5C, in one case, shadow mask can be used to selectively block the laser from the non-selected devices. Here, the shadow mask 501 is aligned with the receiver substrate or donor substrate depending on direction of laser. Then laser can cover the either substrate partially or fully. In case of partial coverage, raster scan or step-and-repeat may be used to cover the entire intended area on the substrate. To further improve the heat transfer from the laser, a layer with higher laser absorption rate can be added to the force modulation element. It is possible to use the contact pad as the force modulation element in the receiver substrate.

Adhesive Force Modulation

In another embodiment of selective transfer, FR is generated by adhesive. Here, the FR is modulated either by selective application of adhesive to the landing area on the receiver substrate (or selected micro devices) or by selective curing of an adhesive layer. This method can be used in combination with weakening the donor force selectively or globally and is compatible with any of the methods 1000A, 1000B, and 1000C or any combination of them. Although, the following description is based on 1000A similar approaches can be used for 1000B, 1000C and the combination of the methods. In addition, the order of donor force weakening step 1110 can be changed in reference to other steps without affecting the results.

Figure 6A:
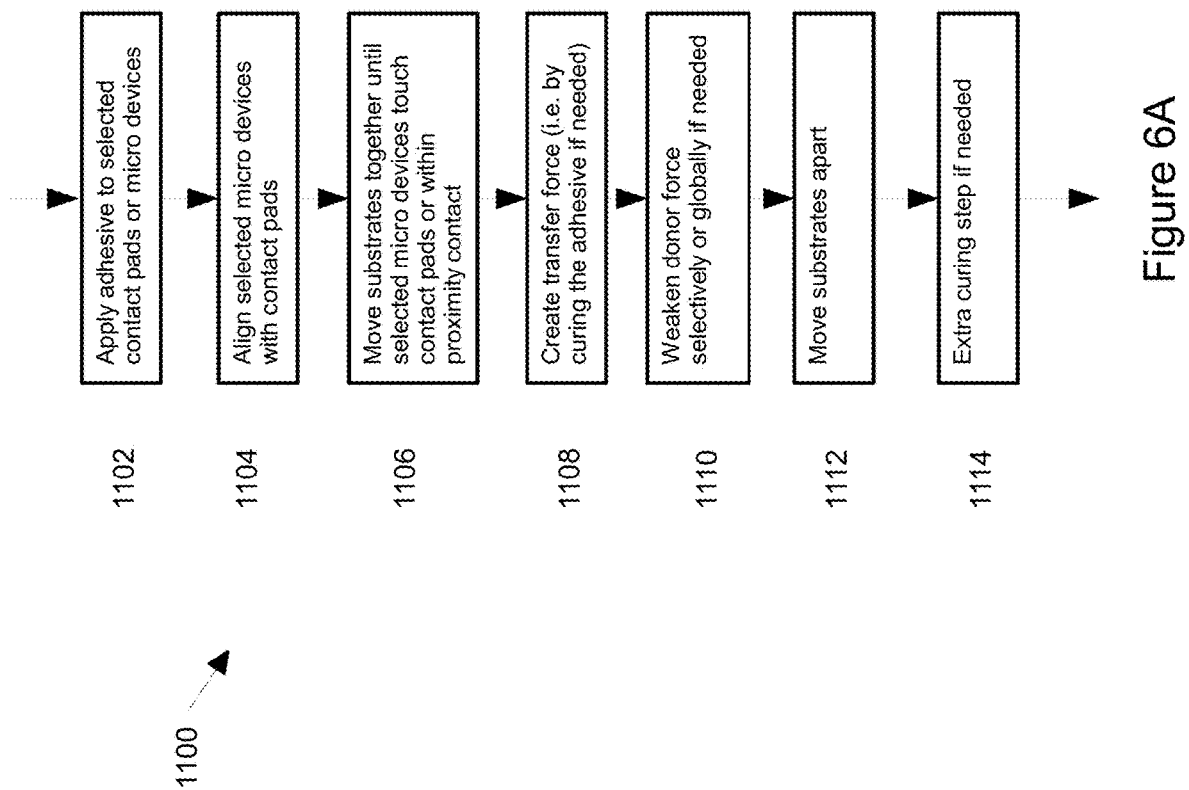
FIG. 6A shows a flowchart of method 1100 for selectively transferring micro devices from a donor substrate to a receiver substrate.
Figure 6B:
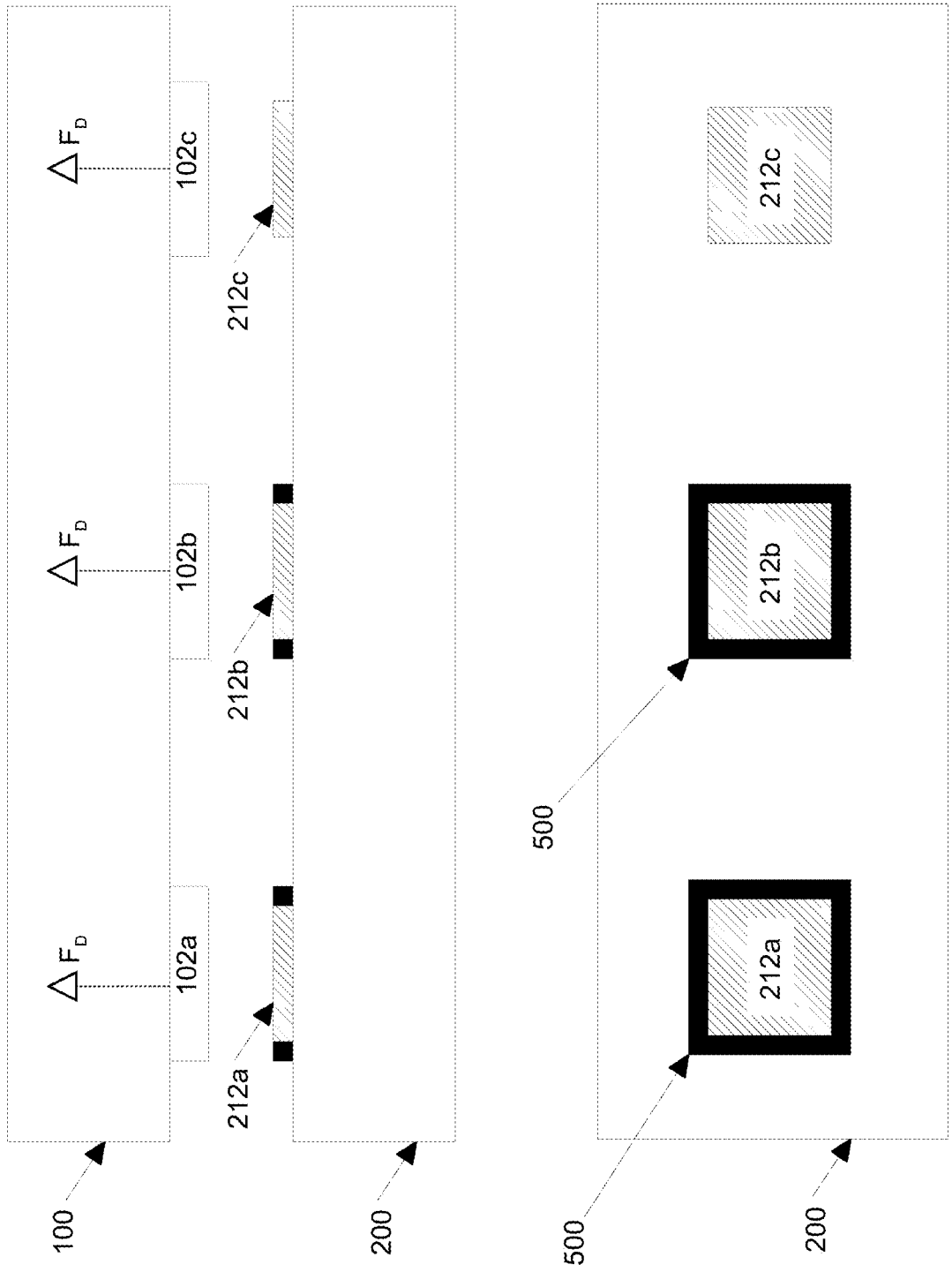
FIGS. 6B-6G show one method of implementing steps described in method 1100.

FIG. 6A shows a flowchart of method 1100, a modified version of method 1000 specific to the use of adhesive to generate FR. FIG. 6B shows donor substrate 100 and receiver substrate 200 setup to perform method 1100. Donor substrate 100 is shown in cross section and receiver substrate 200 is shown in cross section and plan view. Donor substrate 100 has an array of micro devices 102 attached. Donor force FD acts to hold micro devices 102 to donor substrate 100.

Receiver substrate 200 has an array of contact pads 212 attached. Although FIG. 6B shows the force modulation element 500 connected to the contact pads 212, they can be physically separated.

As shown in FIG. 6B, contact pads 212a, 212b are surrounded by a ring of adhesive 500. Adhesive 500 has been applied selectively to contact pads 212 where transfer of a micro device is desired so that when donor substrate 100 and receiver substrate 200 are moved together, micro devices 102a, 102b will make contact with adhesive 500 as well as contact pads 212a, 212b.

Method 1100 will be explained with reference to FIGS. 6B-6F. At 1102, adhesive is selectively applied as shown in FIG. 6B.

Figure 6C:
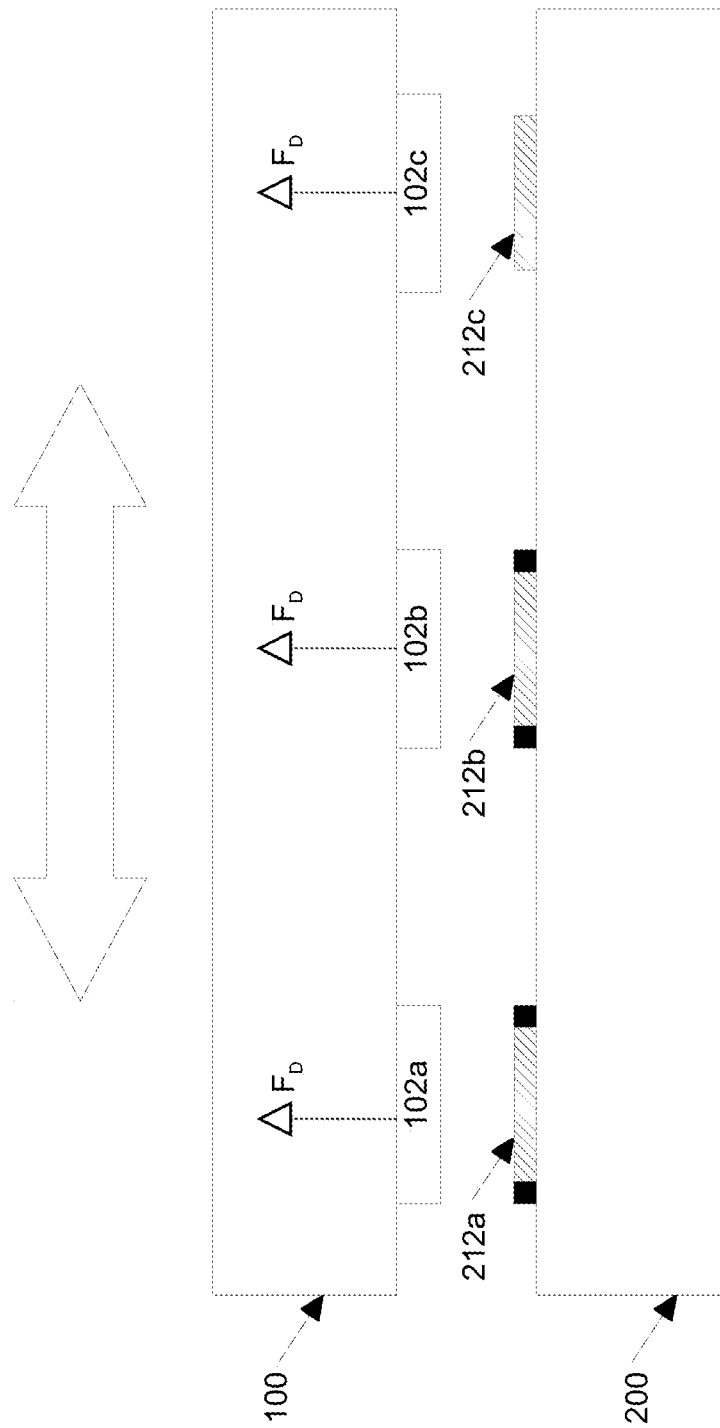

At 1104 donor substrate 100 and receiver substrate 200 are aligned so that selected micro devices 102a, 102b are in line with corresponding selected contact pads 212a, 212b, as shown in FIG. 6C.

Figure 6D:
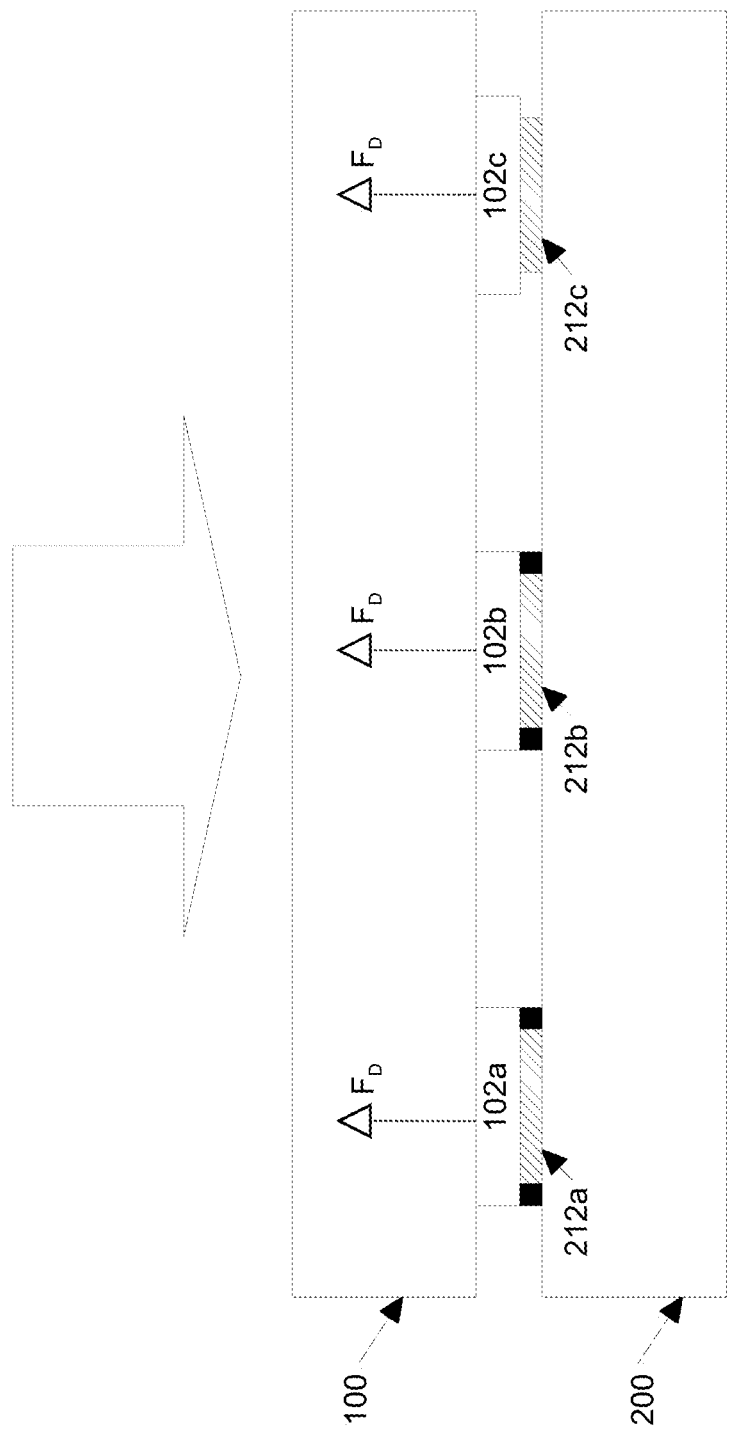

At 1106, donor substrate 100 and receiver substrate 200 are moved together until selected micro devices 102a, 102b are in contact with corresponding selected contact pads 212a, 212b and adhesive 500, as shown in FIG. 6D.

Figure 6E:
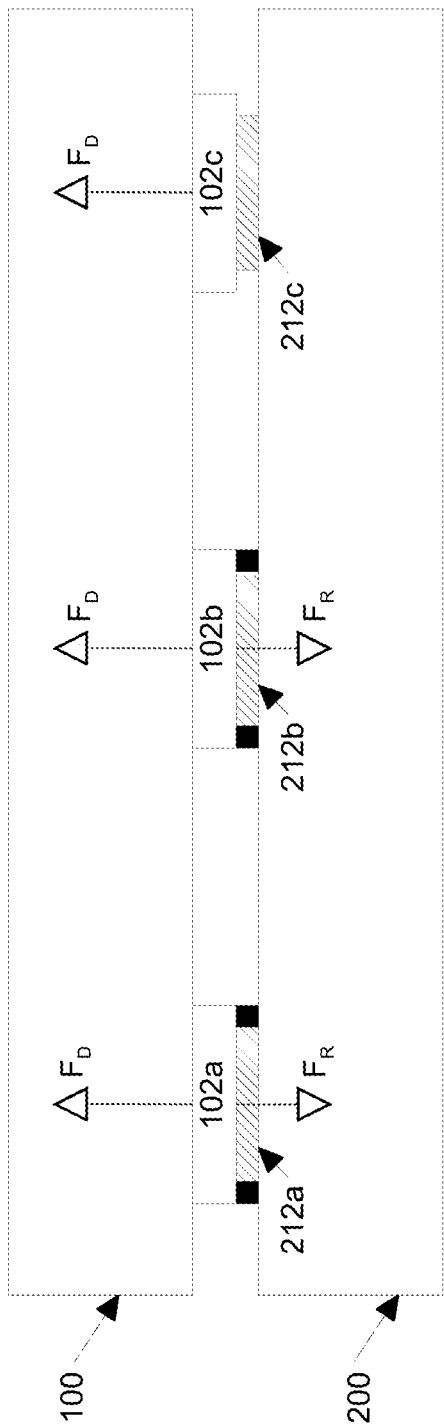

At 1108, receiver force, FR, is generated, as shown in FIG. 6E. FR is generated by adhesion between micro devices 102a, 102b, adhesive 500 and at least one of contact pads 212a, 212b and receiver substrate 200. FR acts to hold selected micro devices 102 to corresponding selected contact pads 212. Preferably, FR can be generated selectively by applying adhesive 500 selectively, as shown.

Figure 6F:
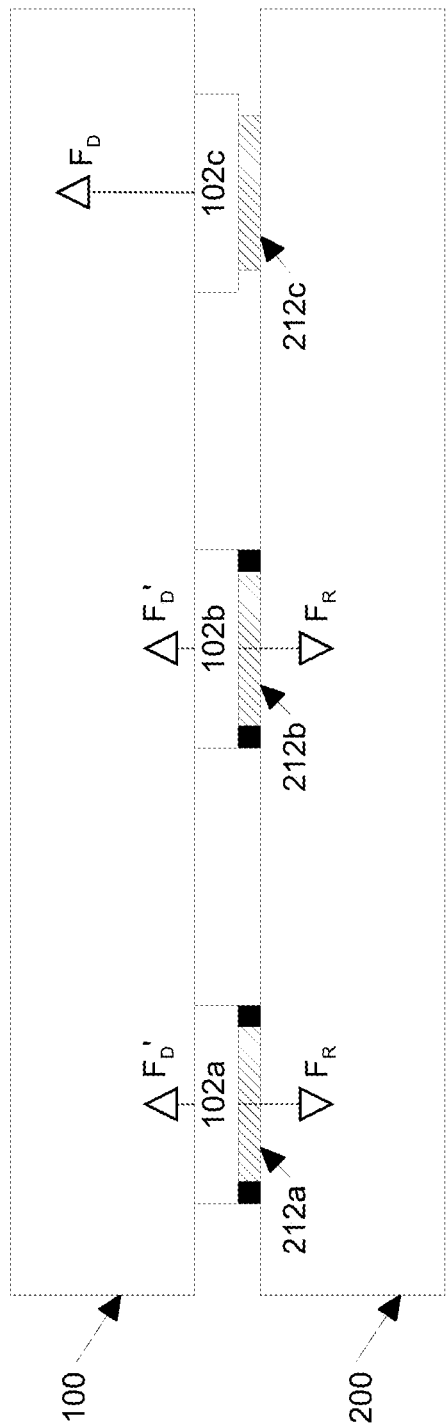

At 1110, donor force FD is selectively (or globally) weakened for selected micro devices 102a, 102b, so that FD' is less than FR, as shown in FIG. 6F. The may be done, for example, using laser lift off techniques, lapping or wet/dry etching. In another case, donor force FD can be weakened for all the micro devices. In this case, force modulation is done by selective adhesive application to the selected force element on the receiver substrate. The order of FD and FR modulation can be changed. This step may be eliminated if the adhesive force modulation is selective and FR is larger than FD.

Figure 6G:
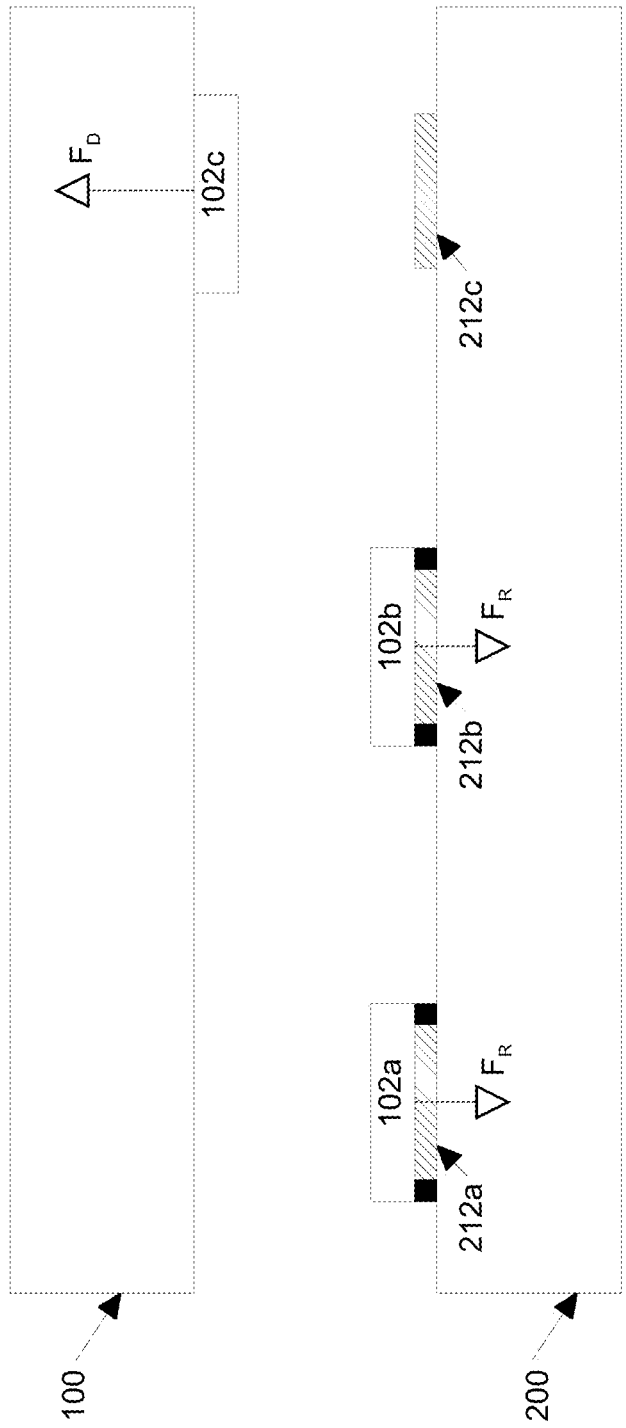

At 1112, donor substrate 100 and receiver substrate 200 are moved apart, leaving selected micro devices 102a, 102b attached to corresponding selected contact pads 212a, 212b, as shown in FIG. 6G. Once donor substrate 100 is separated from receiver substrate 200, further processing steps can be taken. For example, donor substrate 100 and receiver substrate 200 can be re-aligned and steps can be repeated in order to transfer a different set of micro devices 102 to contact pads 212. Additional layers can also be deposited on top of or in between micro devices 102, for example, during the manufacture of a LED display, a transparent electrode layers, fillers, planarization layers and other optical layers can be deposited.

One possible additional step, at 1114, is curing adhesive 500. Curing may create a permanent bond between micro devices 102 and contact pads 212. In another embodiment, curing takes place as part of step 1108 and is part of generating FR. If several sets of selected micro devices 102 are to be transferred to a common receiver substrate 200 curing may be done after all the transfers are complete or after each set is transferred.

Figure 7A:
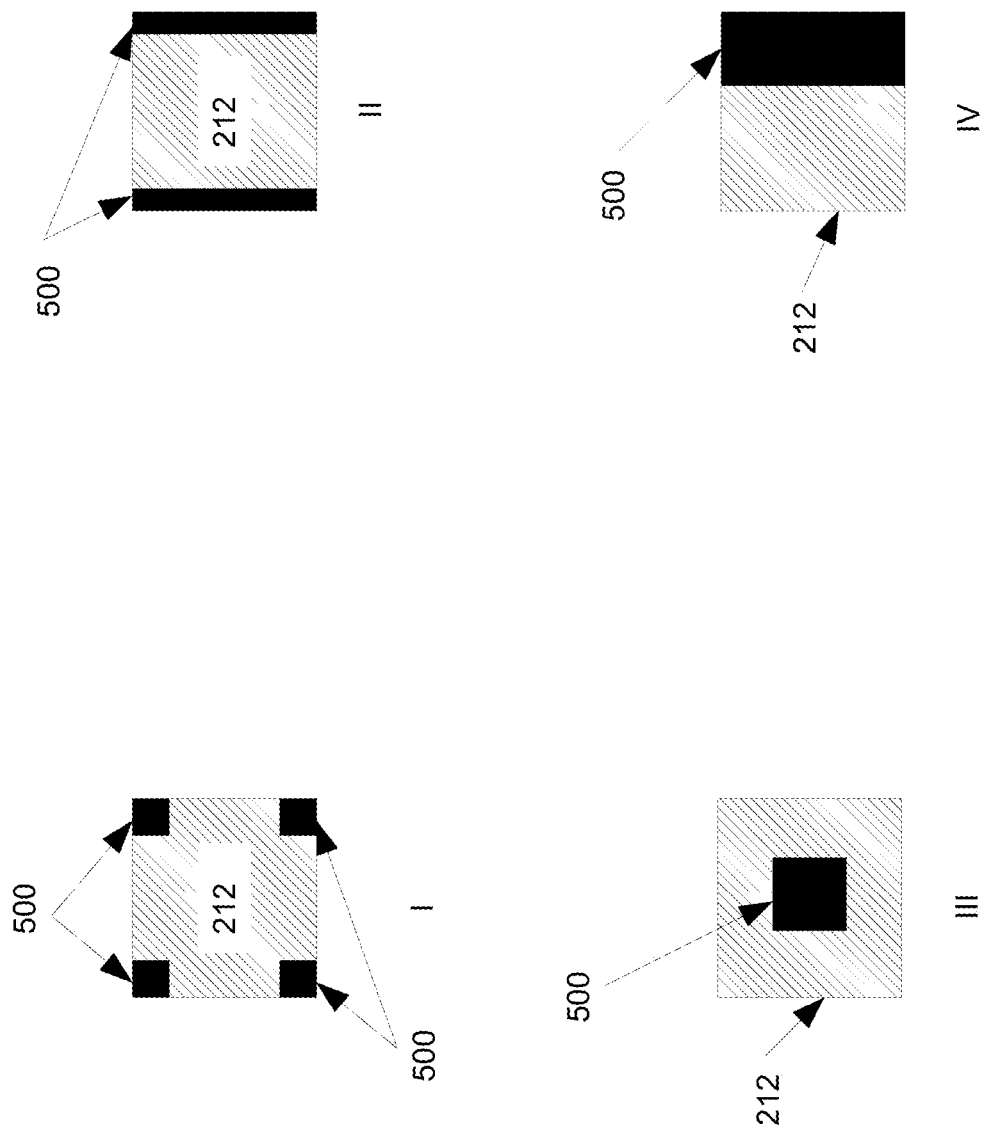
FIG. 7A shows other possible arrangements of adhesive on receiver substrate.

Adhesive 500 can be applied in many ways. For example, adhesive 500 can be applied to any or all of micro devices 102, contact pads 212 or receiver substrate 200. It will often be desirable that an electrical coupling exist between a micro device 102 and its corresponding contact pad 202. In this case, the adhesive may be selected for its conductivity. However, suitable conductive adhesives are not always available. In any case, but especially when a conductive adhesive is not available, adhesives can be applied near contact pads or may cover only a portion of the contact pad. FIG. 7A shows some other possible arrangements of adhesive on receiver substrate 200, (I) including four corners, (II) opposite sides, (III) center and (IV) one side geometries.

Figure 7B:
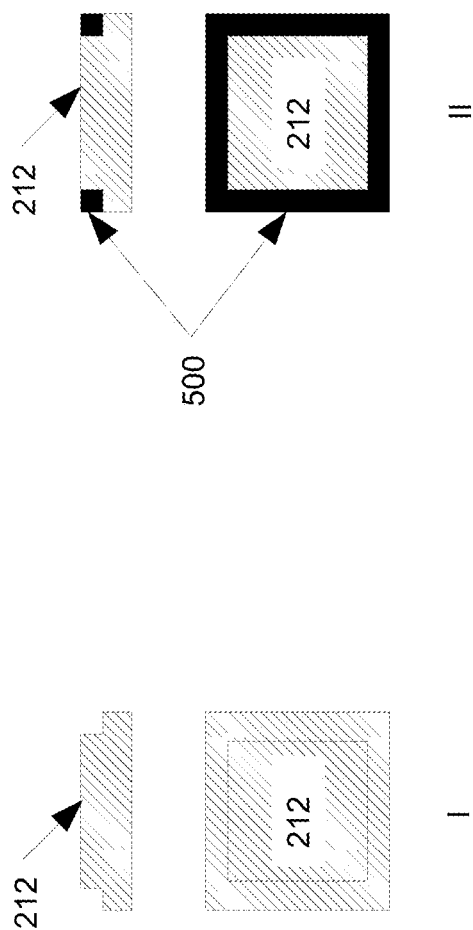
FIG. 7B shows a contact pad with a cut out before and after application of an adhesive.

In another embodiment, one or more cut-outs can be provided for the adhesive 500. FIG. 7B shows a contact pad 212 with a cut out (I) before and (II) after application of an adhesive.

Figure 8:
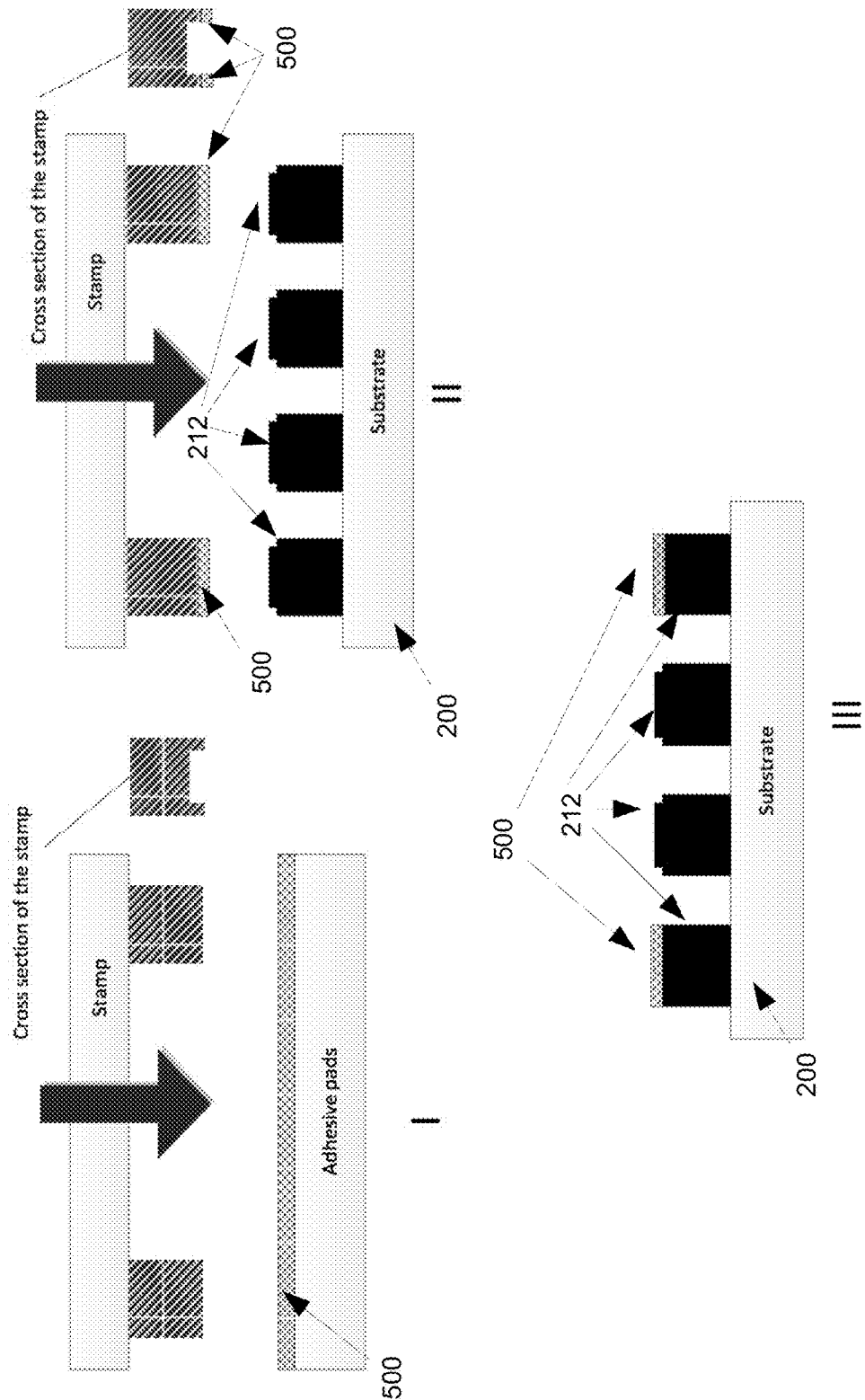
FIG. 8 shows a stamping process that can be used to apply adhesive to contact pads.

The adhesive 500 can be stamped, printed or patterned onto the contact pads 212, micro devices 102 or receiver substrate 200 by any normal lithography techniques. For example, FIG. 8 shows a stamping process that can be used to apply adhesive 500 to, for example, contact pads 212. Selectivity in generating FR can be achieved by selecting which contact pads 212 will receive adhesive 500. An analogous procedure can be used to apply adhesive to micro devices 102 or receiver substrate 200. At (I), a stamp with a profile matching the desired distribution of adhesive 500 is wet. At (II), the stamp is brought into contact with the receiver substrate 200 and selected micro devices 102. At (III), receiver substrate is now wet with adhesive and ready to receive transfer of selected micro devices 102. Depending on the needs of the process, stamps with reverse profiles can also be used. In another embodiment, both the micro devices 102 and contact pads 212 may be wet with adhesive.

Adhesive 500 may be selected so that it will cure when heat is applied. Any of the techniques described with regard to heating can be suitably applied by one of skill in the art, according to the needs of a specific application.

Mechanical Force Modulation

In another embodiment of selective transfer, FR is generated by mechanical force. Here, the FR is modulated by application of mechanical forces between the landing area on the receiver substrate and the micro device. This method can be used in combination with weakening the donor force selectively or globally and is compatible with any of the methods 1000A, 1000B, and 1000C or any combination of them. Although, the following description is based on 1000A similar approaches can be used for 1000B, 1000C and the combination of the methods. In addition, the order of donor force weakening step 1210 can be changed in reference to other steps without affecting the results.

In one example, differential thermal expansion or pressure force can be used to achieve a friction fit that will hold micro devices 102 to contact pads 202. In another example, thermal and pressure can be applied to create a bonding and this bonding can act as FR as well.

Figure 9:
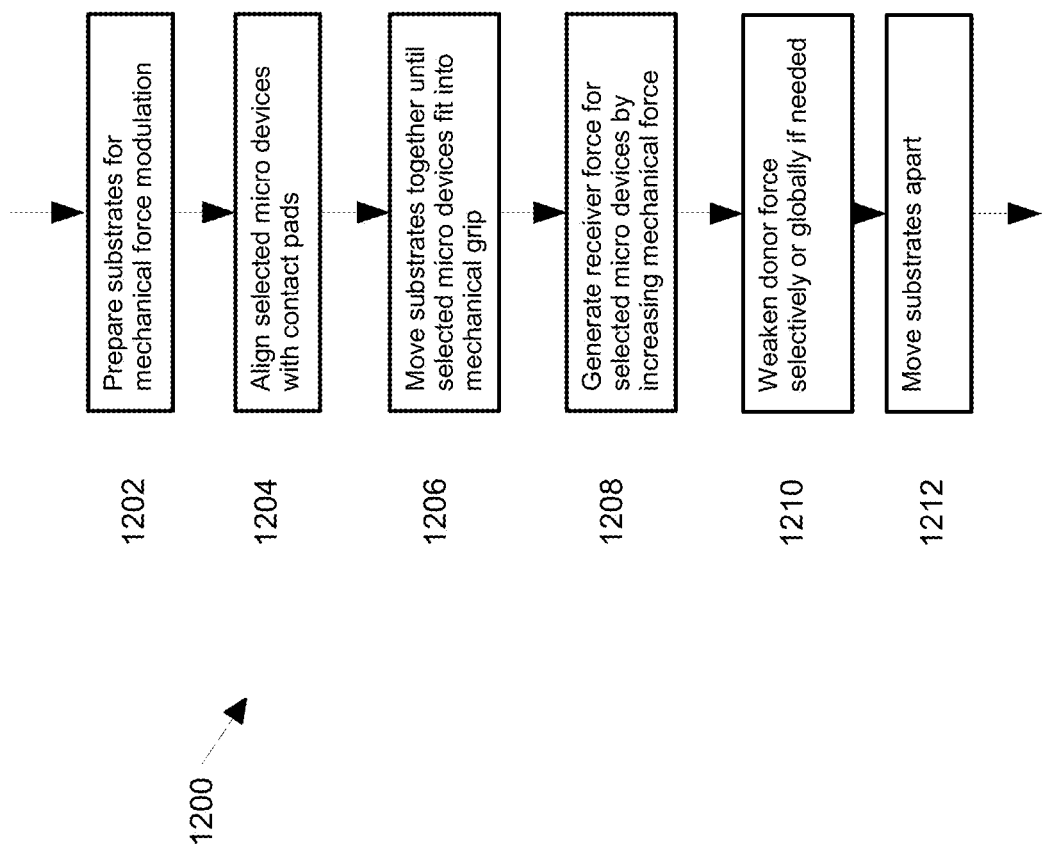
FIG. 9 shows a flowchart of method 1200 for selectively transferring micro devices from a donor substrate to a receiver substrate.
Figure 10:
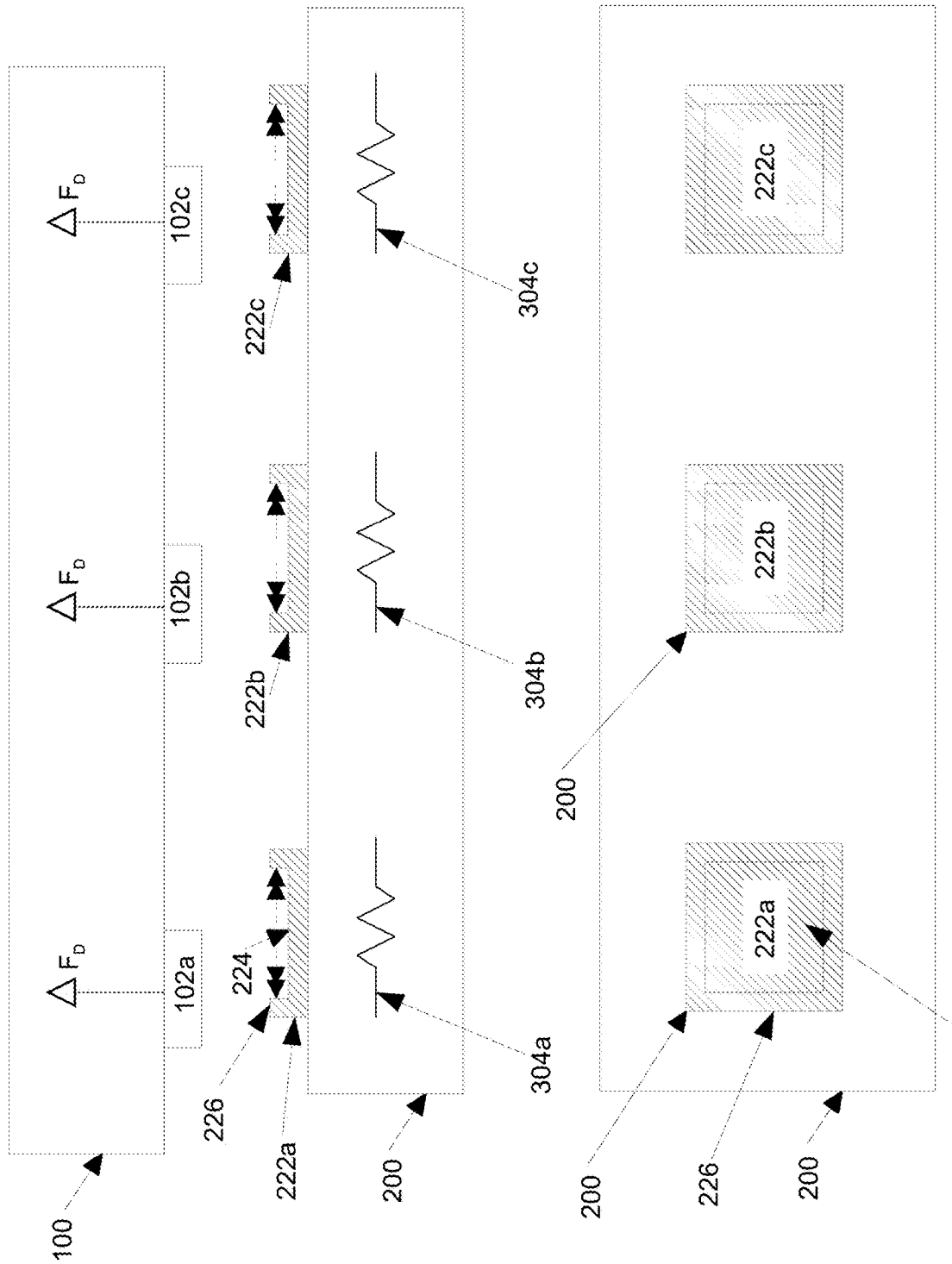
FIG. 10 shows a donor substrate and a receiver substrate setup to perform method 1200.

FIG. 9 shows a flowchart of method 1200, a modified version of method 1000A suitable for mechanical generation of FR. FIG. 10 shows a donor substrate 100 and a receiver substrate 200 setup to perform method 1200. Donor substrate 100 is shown in cross section and receiver substrate 200 is shown in cross section and plain view. Donor substrate 100 has an array of micro devices 102 attached. Donor force FD acts to hold micro devices 102 to donor substrate 100. Micro devices 102 and donor substrate 100 are shown as connected to ground 244.

Receiver substrate 200 has an array of contact pads 232 attached. In the embodiment shown, the array of contact pads 232 is of the same pitch as the array of micro devices 102; i.e. there is one micro device 102 for each contact pad 232. As discussed above, this need not be true, although it is preferable that the pitch of the array of contact pads 232 and the pitch of the array of micro devices 102 be proportional as this facilitates the transfer of multiple devices simultaneously.

Method 1200 will be described with reference to FIGS. 11A-11E. At 1202 the substrates are prepared for mechanical force modulation. In case of a mechanical grip, the grip is opened by different means. In one example heat is applied to force modulation element 222 which can be the same a contact pad on the landing area. Here, mechanical grip and contact pads are used interchangeably. However, it is obvious to one of skill in the art that the mechanical grip and contact pad can be different. It is possible to integrate the mechanical grip in the micro devices as well. The heat can be applied globally or selectively using heaters 304 causing the grip to open, as shown by the double arrows in FIG. 11A. Note that contact pads 222 are constructed with a central depression 224 and peripheral walls 226. It should also be noted that a combination of selective heaters 304 and global heater 306 or a combination of selective heaters 304 and an environmental heat source or external heat source in combination or alone could also be used.

Figure 11A:
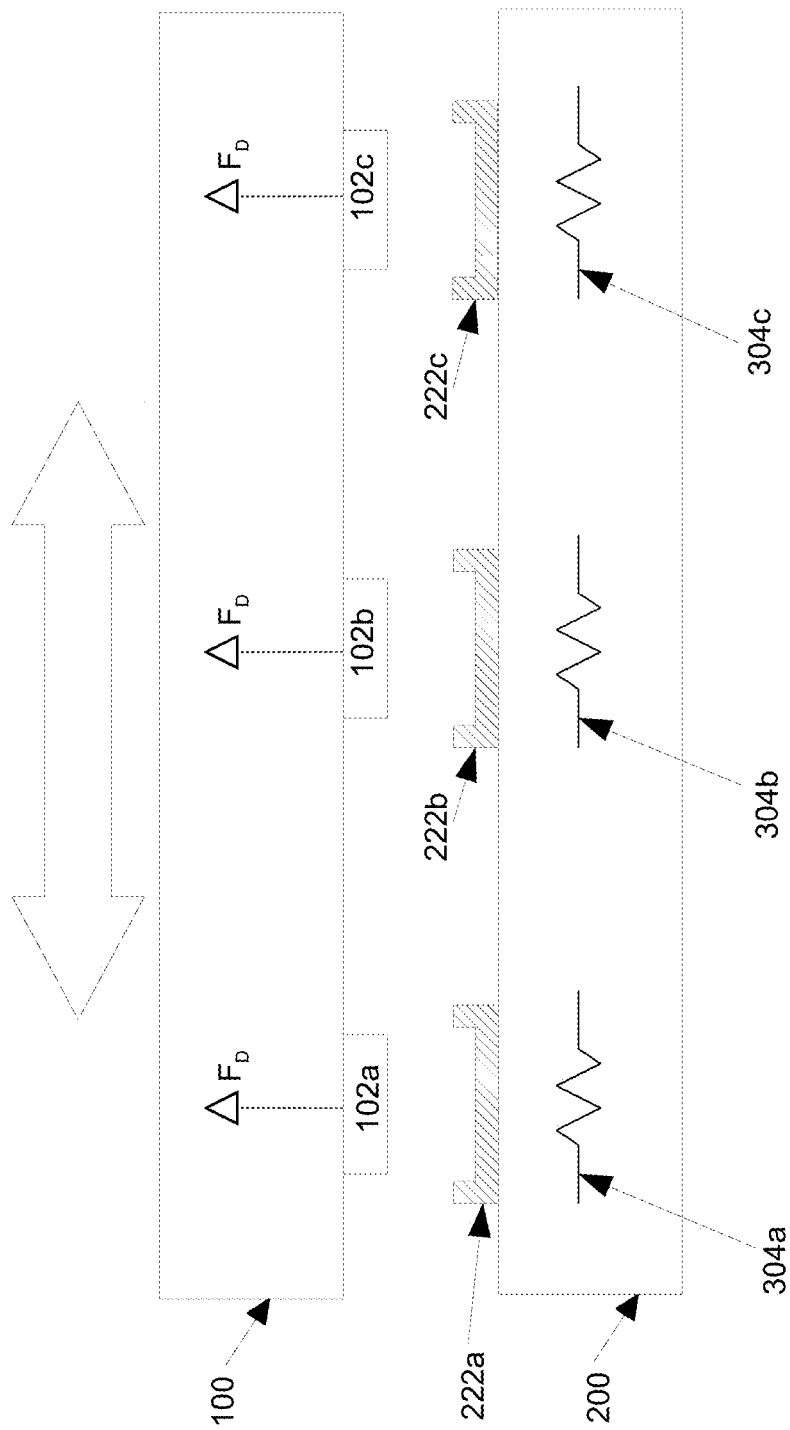
FIGS. 11A-11E show one embodiment for implementing steps in method 1200.
Figure 11B:
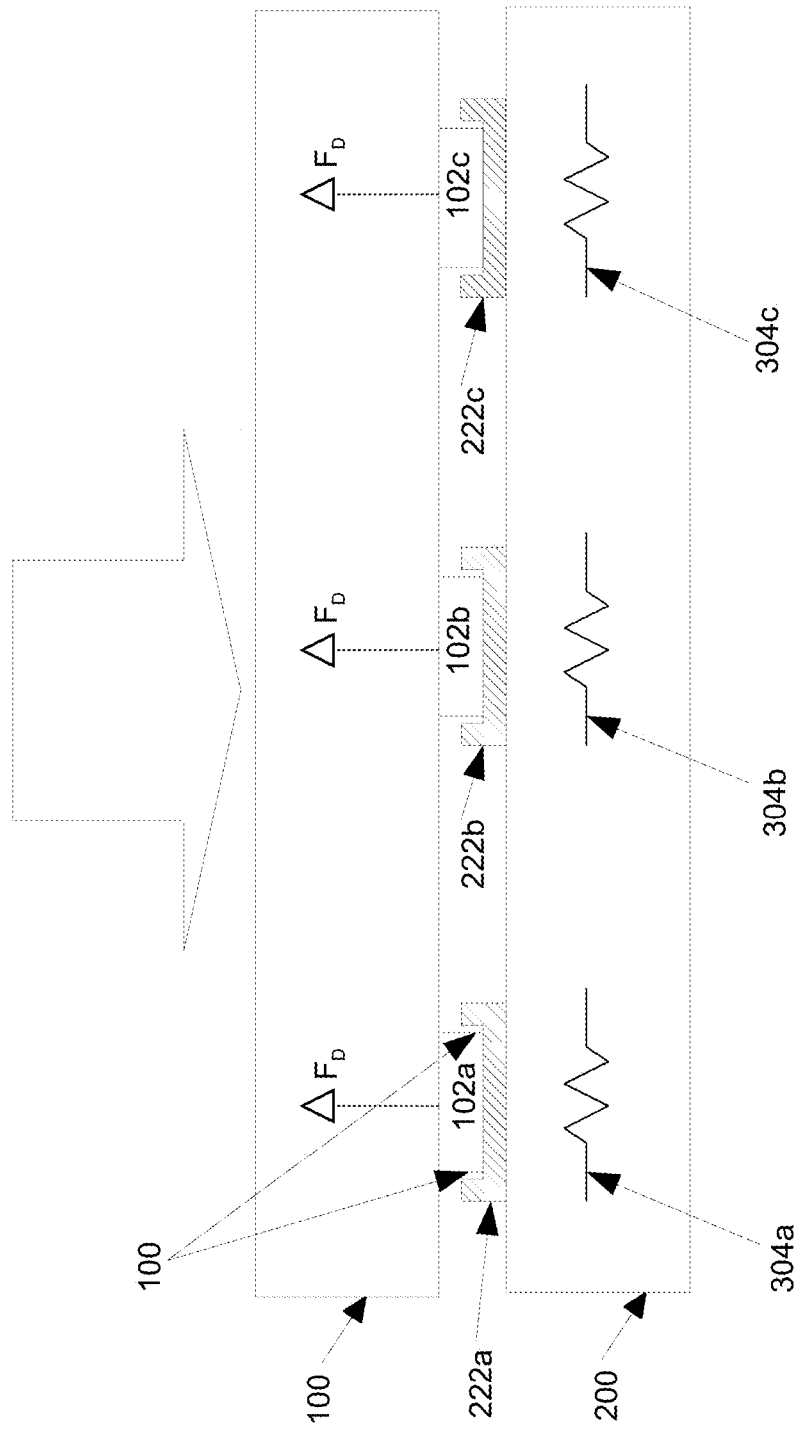

At 1204, donor substrate 100 and receiver substrate are aligned so that selected micro devices 102a, 102b are in line with corresponding contact pads 222a, 222b, as shown in FIG. 11B.

At 1206, donor substrate 100 and receiver substrate 200 are moved together until the selected micro devices 102a, 102b fit into the space defined by the peripheral walls of corresponding mechanical grip as shown in FIG. 11B. As noted above, each contact pad 222 is constructed with a central depression 224 and peripheral walls 226. These features of contact pads 222 are sized so as to fit snugly around a micro device 102. The material of the mechanical grips is chosen, in part, due to thermal properties; specifically, so that the mechanical grips have a higher coefficient of thermal expansion than micro devices 102. Accordingly, when heat is applied to the mechanical grips they expand more than a micro device 102 would expand at the same temperature so that the central depression and peripheral walls will be able to accommodate a micro device 102 with a gap 228. The expanded size of mechanical grip allows micro devices 102 to fit easily.

Figure 11C:
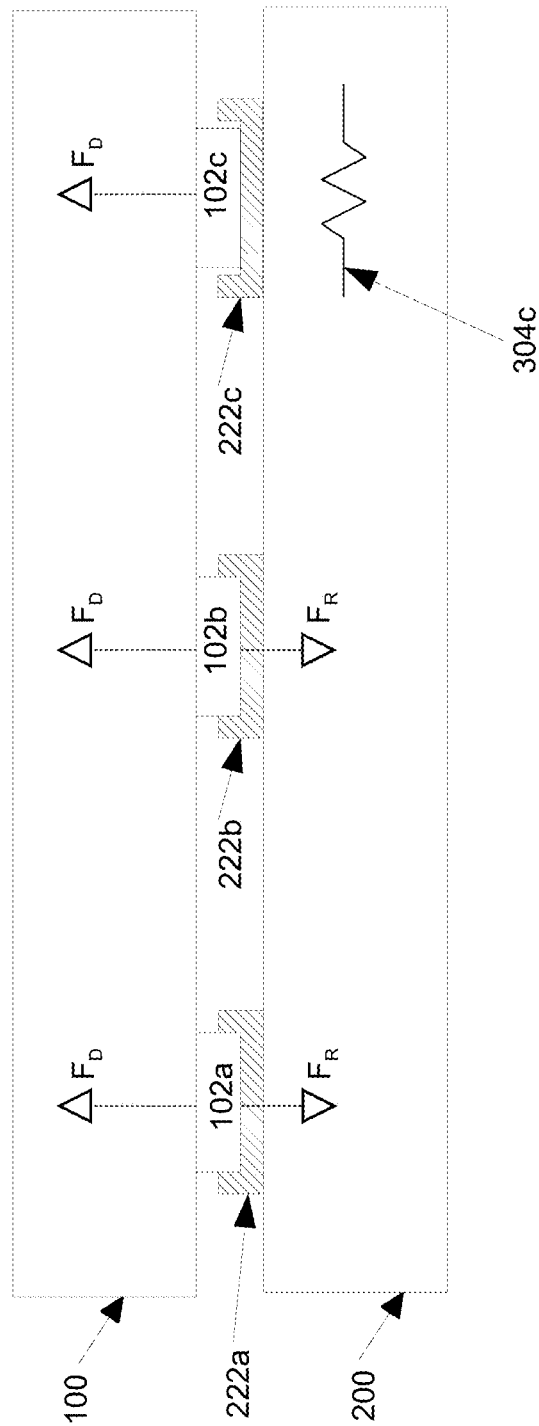

At 1208, a receiver force, FR, is generated. FR is generated by selectively cooling contact pads 222 corresponding to selected micro devices 102, causing peripheral walls 226 to contract around selected micro devices 102, closing gap 228 and exerting a compressive force on micro device 102, holding it in place, as shown in FIG. 11C. Selectivity can be achieved by selectively turning off selective heaters 304.

Figure 11D:
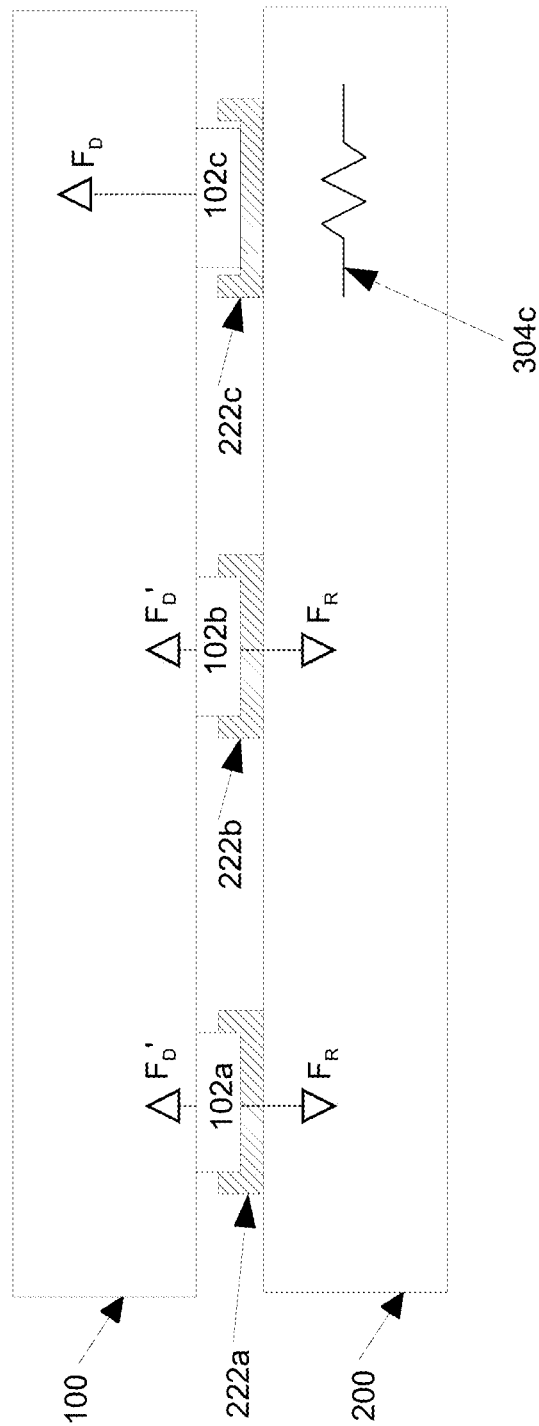

At 1210, donor force FD is selectively (or globally) weakened for selected micro devices 102a, 102b, so that FD' is less than FR, as shown in FIG. 11D. This may be done, for example, using laser lift off techniques, lapping or wet/dry etching. In some embodiments FD is weaker than FR, in which case selective weakening of FD is not required. This step may be eliminated if the mechanical force modulation is selective and the FR is larger than FD.

Figure 11E:
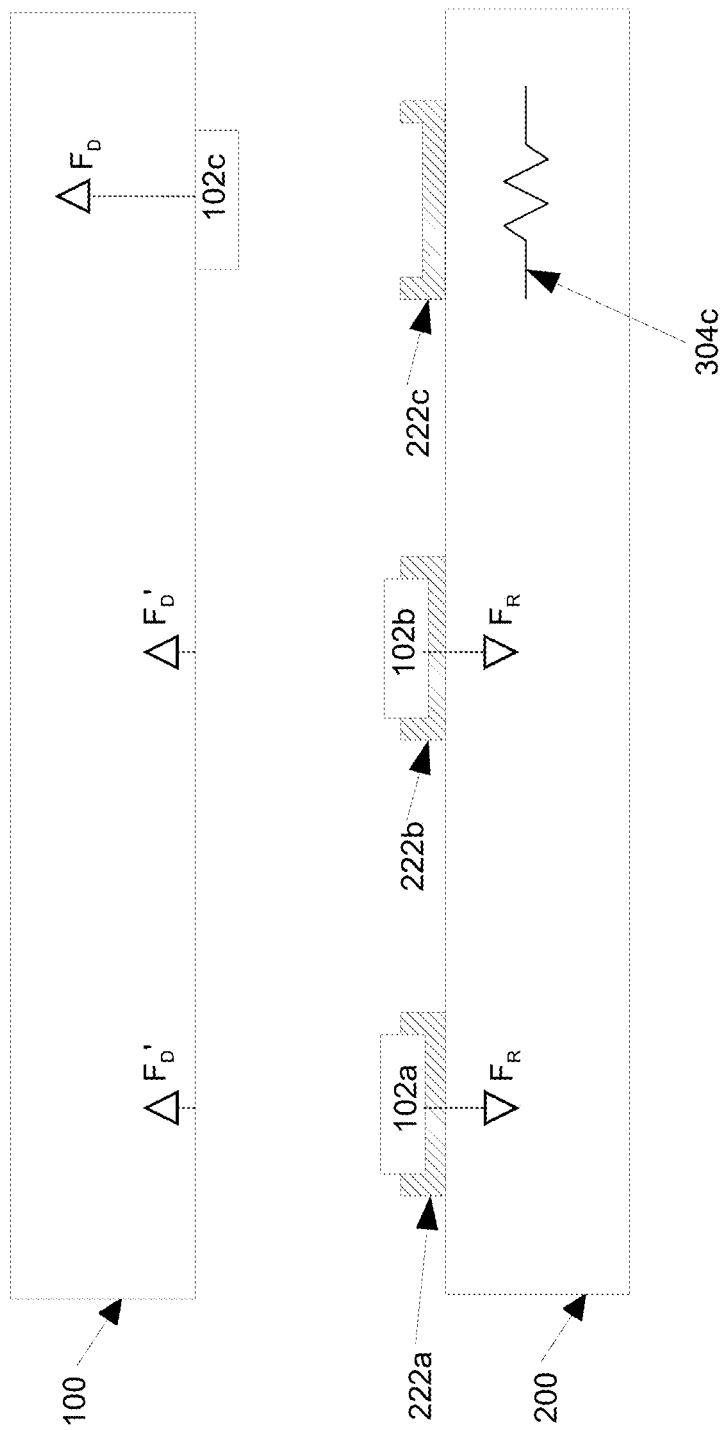

At 1212, donor substrate 100 and receiver substrate 200 are moved apart, leaving selected micro devices 102a, 102b attached to corresponding contact pads 222a, 222b, as shown in FIG. 11E. Once donor substrate 100 is separated from receiver substrate 200, further processing steps can be taken. For example, donor substrate 100 and receiver substrate 200 can be re-aligned and steps can be repeated in order to transfer a different set of micro devices 102 and to contact pads 222. Additional layers can also be deposited on top of or in between micro devices 102, for example, during the manufacture of a LED display, transparent electrode layers, fillers, planarization layers and other optical layers can be deposited.

Electrostatic Force Modulation

In another embodiment of selective transfer, FR is generated by an electrostatic force or magnetic force. Although the structures here are used to describe the electrostatic force similar structures can be used for magnetic force. In embodiments where magnetic force is used instead of electrostatic force, a current pass through a conductive layer instead of charging a conductive layer for electrostatic force.

Using electrostatic force for selective transfer, the FR is modulated by application of selective electrostatic forces between the landing area on the receiver substrate and the micro device. This method can be used in combination with weakening the donor force selectively or globally and is compatible with any of the methods 1000A, 1000B, and 1000C or any combination of them. Although, the following description is based on 1000A similar approaches can be used for 1000B, 1000C and the combination of the methods. In addition, the order of donor force weakening step 1410 can be changed in reference to other steps without affecting the results.

Figure 12A:
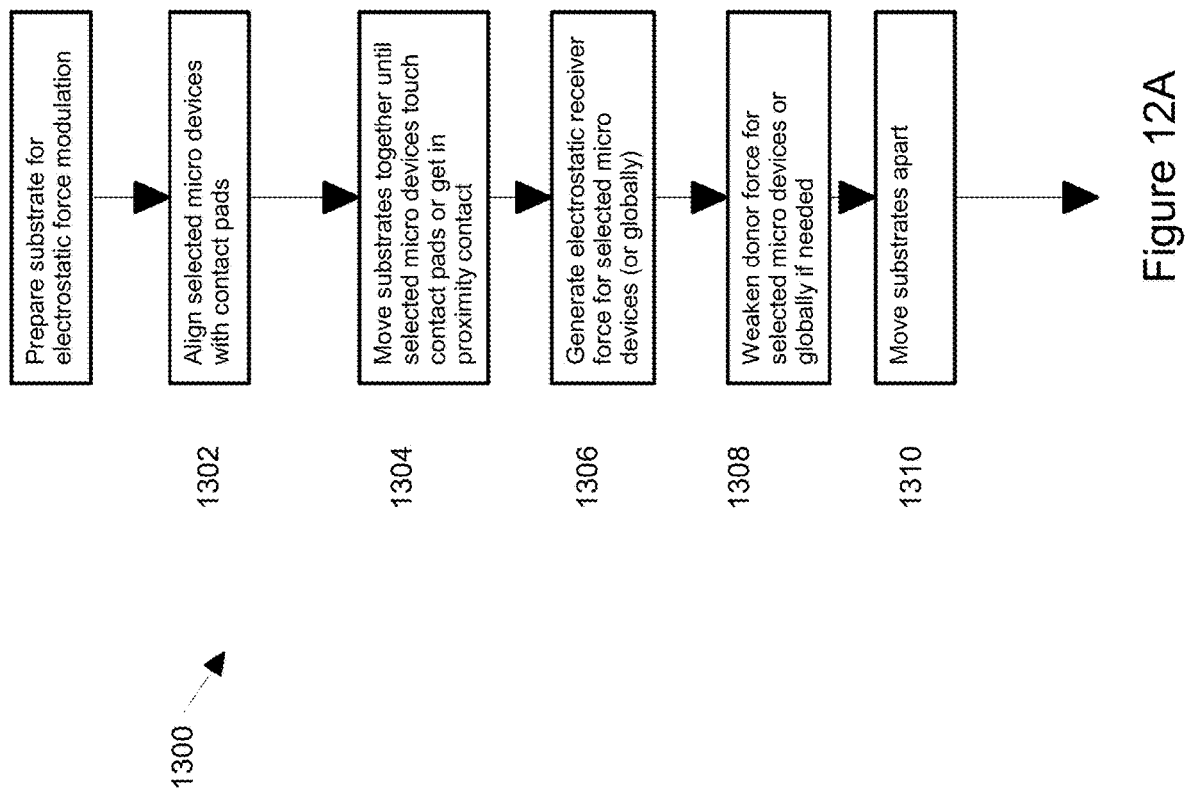
FIG. 12A shows a flowchart of method 1300 for selectively transferring micro devices from a donor substrate to a receiver substrate.
Figure 12B:
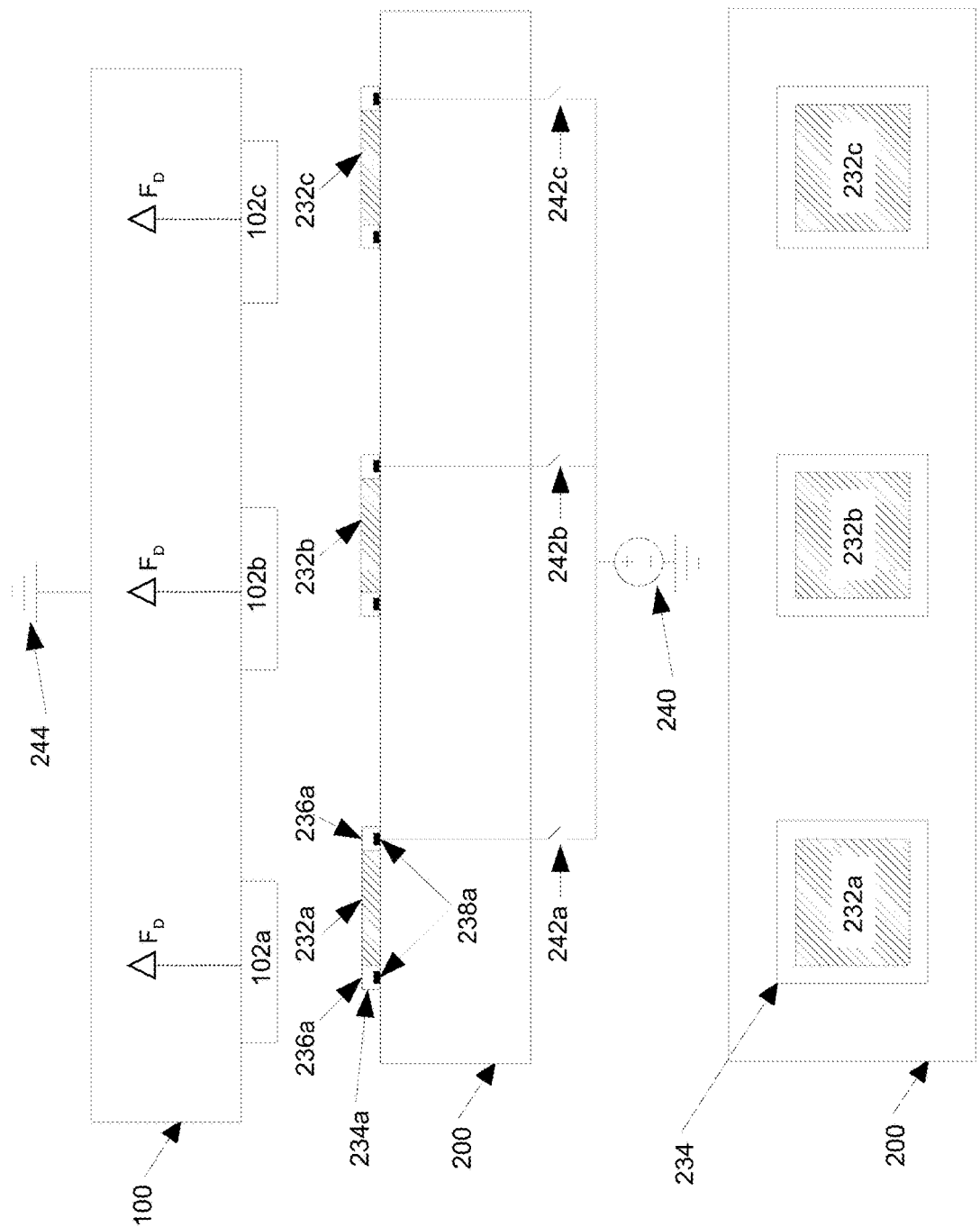
FIG. 12B shows a donor substrate and a receiver substrate setup to perform method 1300.

FIG. 12A shows a flowchart of method 1300, a modified version of method 1000 suitable for electrostatic generation of FR. FIG. 12B shows a donor substrate 100 and a receiver substrate 200 setup to perform method 1300. Donor substrate 100 is shown in cross section and receiver substrate 200 is shown in cross section and in plain view. Donor substrate 100 has an array of micro devices 102 attached. Donor force FD acts to hold micro devices 102 to donor substrate 100. Micro devices 102 and donor substrate 100 are shown as connected to ground 244.

The landing area on the receiver substrate 200 has at least a contact pad 232 attached and a force modulation element 234.

Contact pads 232 are surrounded by a ring of conductor/dielectric bi-layer composite, hereinafter called an electrostatic layer 234. The shape and location of force modulation element 234 can be changed in the landing area and in relation to the contact pad. Electrostatic layer 234 has a dielectric portion 236 and a conductive portion 238. Dielectric portion 236 comprises a material selected, in part, for its dielectric properties, including dielectric constant, dielectric leakage and breakdown voltage. The dielectric portion can also be part of the micro device or a combination of the receiver substrate and the micro device. Suitable materials may include SiN, SiON, SiO, HfO and various polymers. Conductive portion 238 is selected, in part, for its conductive properties. There are many suitable single metals, bi-layers and tri-layers that can be suitable for use as a conductive portion 238 including Ag, Au and Ti/Au. Each conductive portion 238 is coupled to a voltage source 240, via a switch 242. Note that although conductive portions 238 are shown as connected in parallel to a single voltage source 240 via simple switches 242, this is to be understood as an illustrative example. Conductive portions 238 might be connected to one voltage source 240 in parallel. Different subsets of conductive portions 238 may be connected to different voltage sources. Simple switches 242 can be replaced with more complex arrangements. The desired functionality is the ability to selectively connect a voltage source 240, having a potential different than that of the micro devices 102, to selected conductive portions 238 when needed to cause an electrostatic attraction between the selected conductive portions 238 and corresponding selected micro devices 102.

Figure 13A:
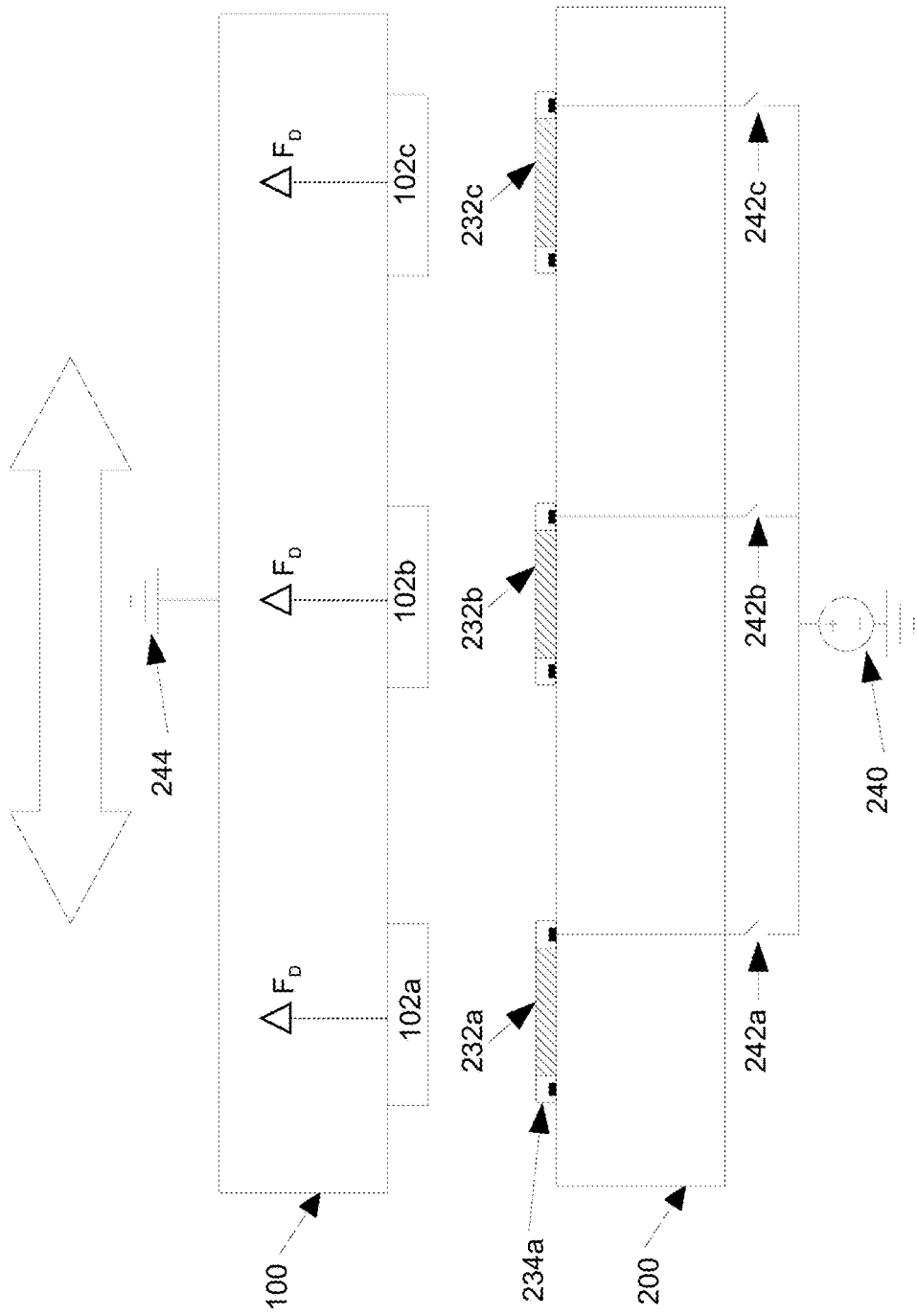
FIGS. 13A-13E show a specific embodiment for implementing steps in method 1300.

Method 1300 will be explained in conjunction with FIGS. 13A-13E. At 1302, donor substrate 100 and receiver substrate are aligned so that selected micro devices 102a, 102b are in line with corresponding contact pads 232a, 232b, as shown in FIG. 13A.

Figure 13B:
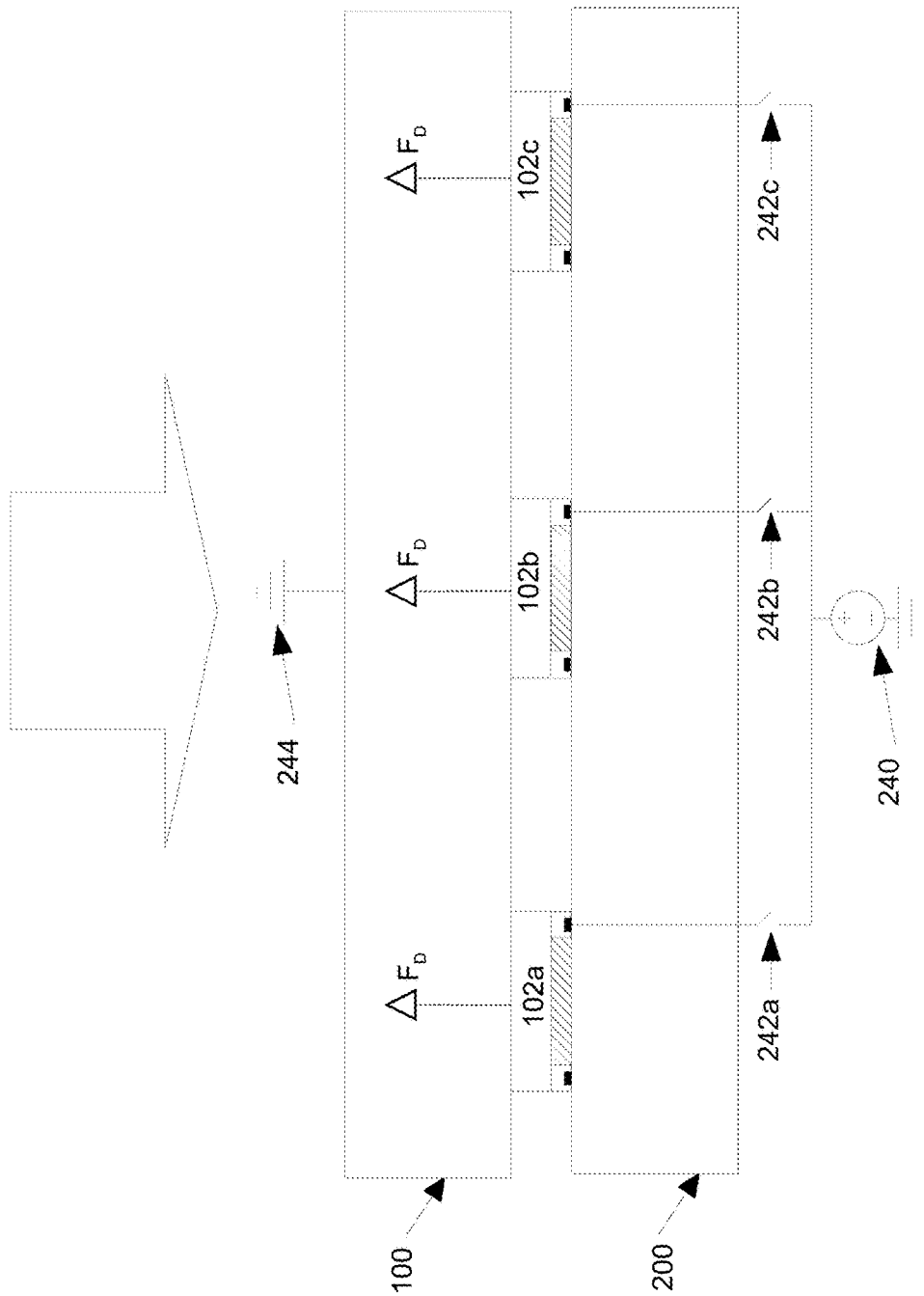

At 1304, donor substrate 100 and receiver substrate 200 are moved together until the micro devices 102 come into contact with contact pads 232, as shown is FIG. 13B.

Figure 13C:
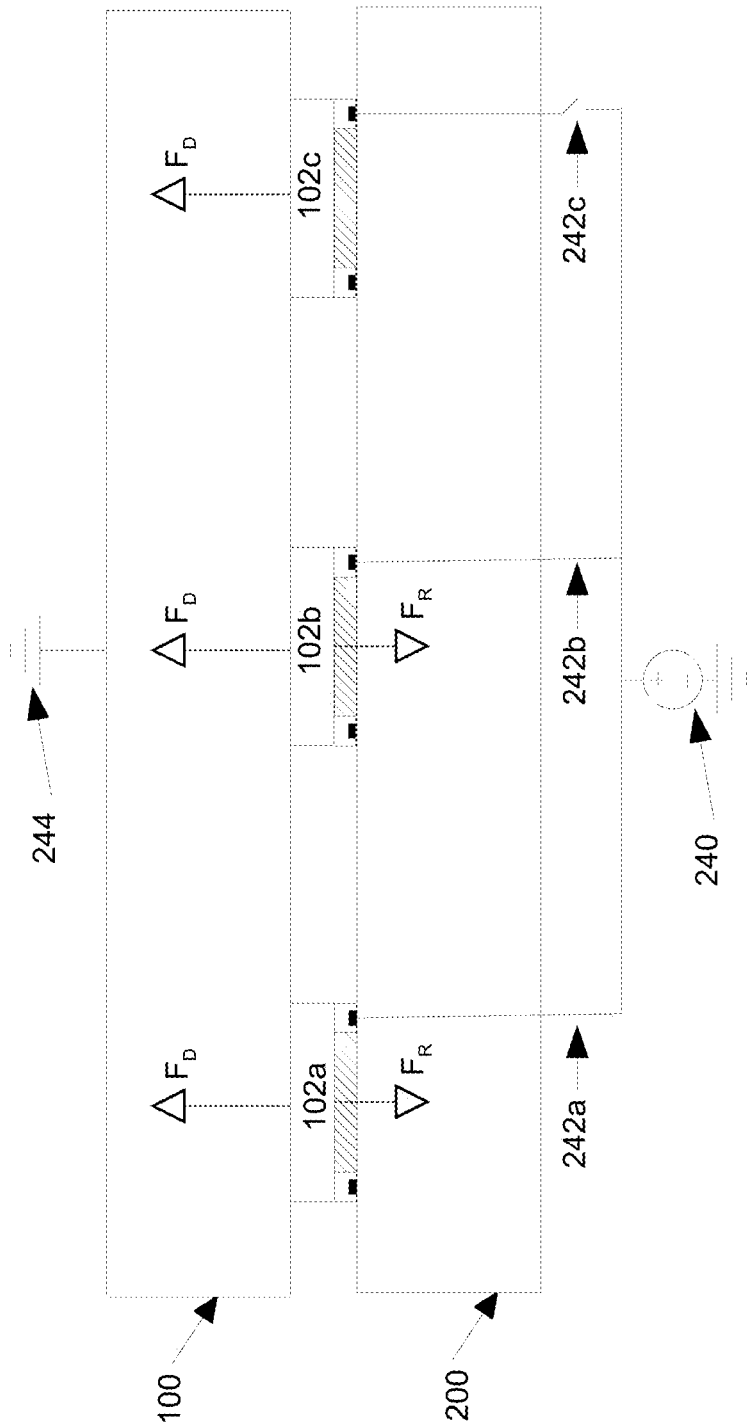

At 1306, a receiver force, FR, is generated, as shown in FIG. 13C. FR is generated by closing switches 242a, 242b that connect conductive portions 238 of electrostatic layers 234 to voltage source 240 creating charged conductive portions 238 at the potential of voltage source 240. Selected micro devices 102a, 102b, being at a different potential, e.g. ground potential (or other relative potential), will be electrostatically attracted to conductive portions 238. The electrostatic charge can be generated by different potential levels. For example, for a 300 nm dielectric, to get a proper grip on a micro device, a voltage difference between 20V to 50V may need to be applied to the electrostatic force element. However, this voltage can be modified depending on the device, gap size, and the dielectric constant.

Figure 13D:
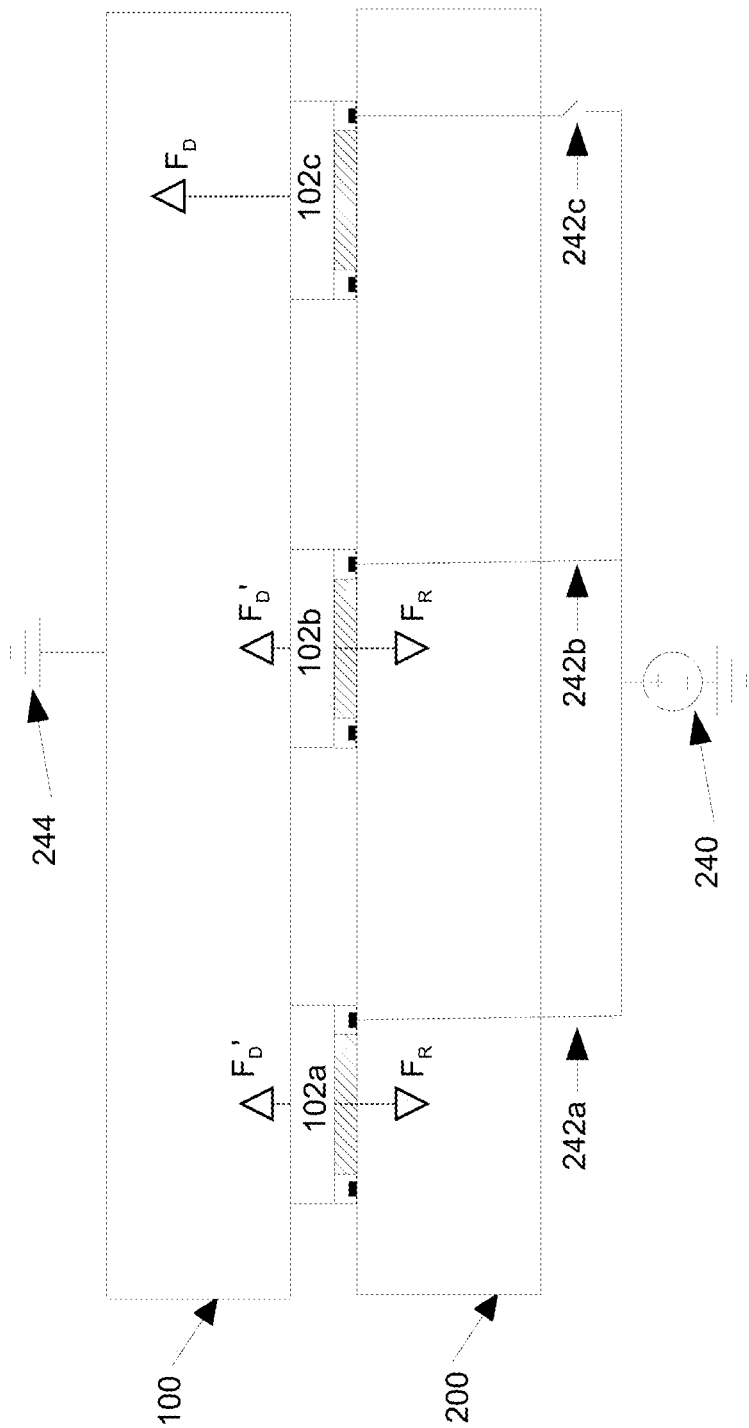

At 1308, donor force FD is selectively weakened for selected micro devices 102a, 102b, so that FD' is less than FR, as shown in FIG. 13D. This may be done, for example, using laser lift off techniques, lapping or wet/dry etching.

Figure 13E:
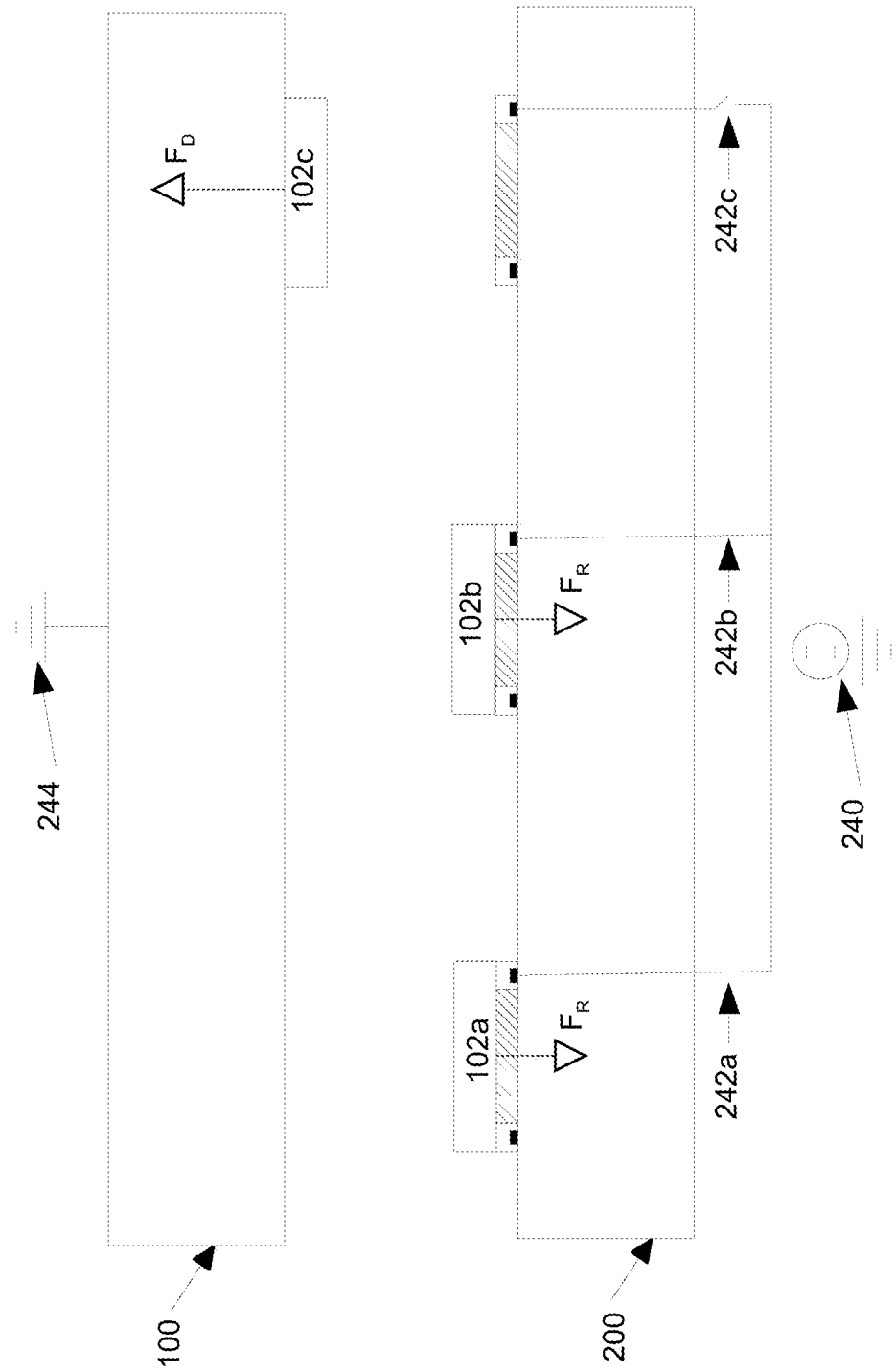
Figure 14B:
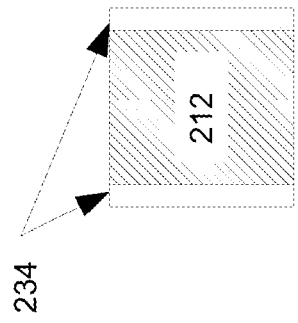
FIG. 14B shows another alternative placement for electrostatic layer.
Figure 14D:
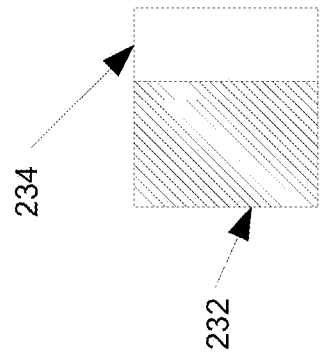
FIG. 14D shows another alternative placement for electrostatic layer.
Figure 14A:
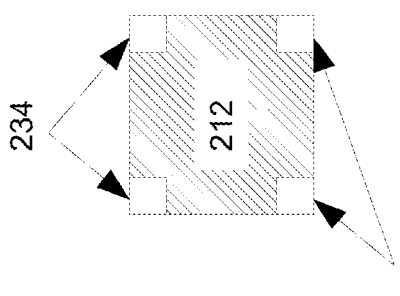
FIG. 14A shows another alternative placement for electrostatic layer.
Figure 14C:
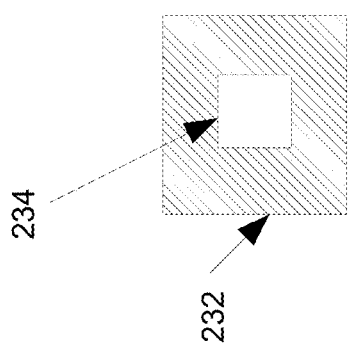
FIG. 14C shows another alternative placement for electrostatic layer.

At 1310, donor substrate 100 and receiver substrate 200 are moved apart, leaving selected micro devices 102a, 102b attached to corresponding contact pads 232a, 232b, as shown in FIG. 13E. Once donor substrate 100 is separated from receiver substrate 200, further processing steps can be taken and the ground 244 may be removed. For example, donor substrate 100 and receiver substrate 200 can be re-aligned and steps can be repeated in order to transfer a different set of micro devices 102 and to contact pads 232. Additional layers can also be deposited on top of or in between micro devices 102, for example, during the manufacture of a LED display, transparent electrode layers, fillers, planarization layers and other optical layers can be deposited. It should be noted that FR will cease to operate if the connection to voltage source 240 is removed. Accordingly, further processing steps to create a permanent bond between micro devices 102 and contact pads 232 are desirable. Curing contact pads 232, as described above, is a suitable further processing step that will create such a bond and enable further working or transporting receiver substrate 200.

In other embodiments, electrostatic layer 234 can take on other configurations. FIG. 14 shows some alternative placements for electrostatic layer 234. Possible alternative placements of electrostatic layer 234 relative to each contact pad 232 include: (A) four corners, (B) opposite sides, (C) center and (D) one side. Those of skill in the art will now be able to design a configuration suitable to particular applications.

In other embodiments, the geometry of contact pads 232, electrostatic layer 234 and micro devices 102 can be changed to varying effect. FIG. 15 illustrates some possible alternative geometries. FIG. 15A shows an embodiment where electrostatic layer 234 extends above the top of contact pad 232 to form a hollow 240 and micro device 102 has a mesa 242 that will fit within hollow 240. FIG. 15B shows an embodiment where electrostatic layer 234 extends above the top of contact pad 232 to form a hollow 240 and micro device 102 has an extension 244 attached to it that will fit within hollow 240. Extension 240 may be made of the same material as contact pad 232 so that later curing will fuse extension 244 and contact pad 232. Sloping geometries, as shown in FIG. 15E, are also possible. Geometries with mesa 242 or extension 244 can help guide micro devices 102 into contact pads 232 and insure a proper fit and prevent tilting of micro devices 102 when detaching from donor substrate 100. Preferably, the geometry of micro devices 102 and contact pads 232 are chosen to match so as to maximize the electrostatic force.

FIG. 15C shows an embodiment where electrostatic layer 234 forms a hollow 240, but conductive portion 238 remains in the same plane as contact pad 232. FIG. 15D shows an embodiment where electrostatic layer 234 forms a hollow 240, but also overlaps with contact pad 232 and conductive portion 238 is in a different plane than contact pad 232, allowing the fine tuning of the electrostatic force.

Transfer of Micro Devices of Different Heights

In another embodiment of selective transfer, the force on the donor substrate is modulated to push the device toward the receiver substrate. In one example, after removing the donor force other forces such as electrostatic forces can be used to push the device toward the receiver substrate. In another case, a sacrificial layer can be used to create a push force in presence of heat or light sources. To selectively create the push force, a shadow mask can be used for applying a light source (e.g. laser) to the selected micro devices. In addition, the FR can be generated by one of aforementioned methods (e.g. mechanical, heating, adhesive, electrostatic). For example, the FR can be modulated by application of selective electrostatic forces between landing area on the receiver substrate and the micro device. This method is compatible with any of the methods 1000A, 1000B, and 1000C or any combination of them. Although, the following description is based on 1000A, similar approaches can be used for 1000B, 1000C and the combination of the methods. In addition, the order of donor force modulation step 1410 can be changed in reference to other steps without affecting the results. However, the most reliable results can be achieved by applying the FR first and then applying the push force to the micro device.

Figure 16:
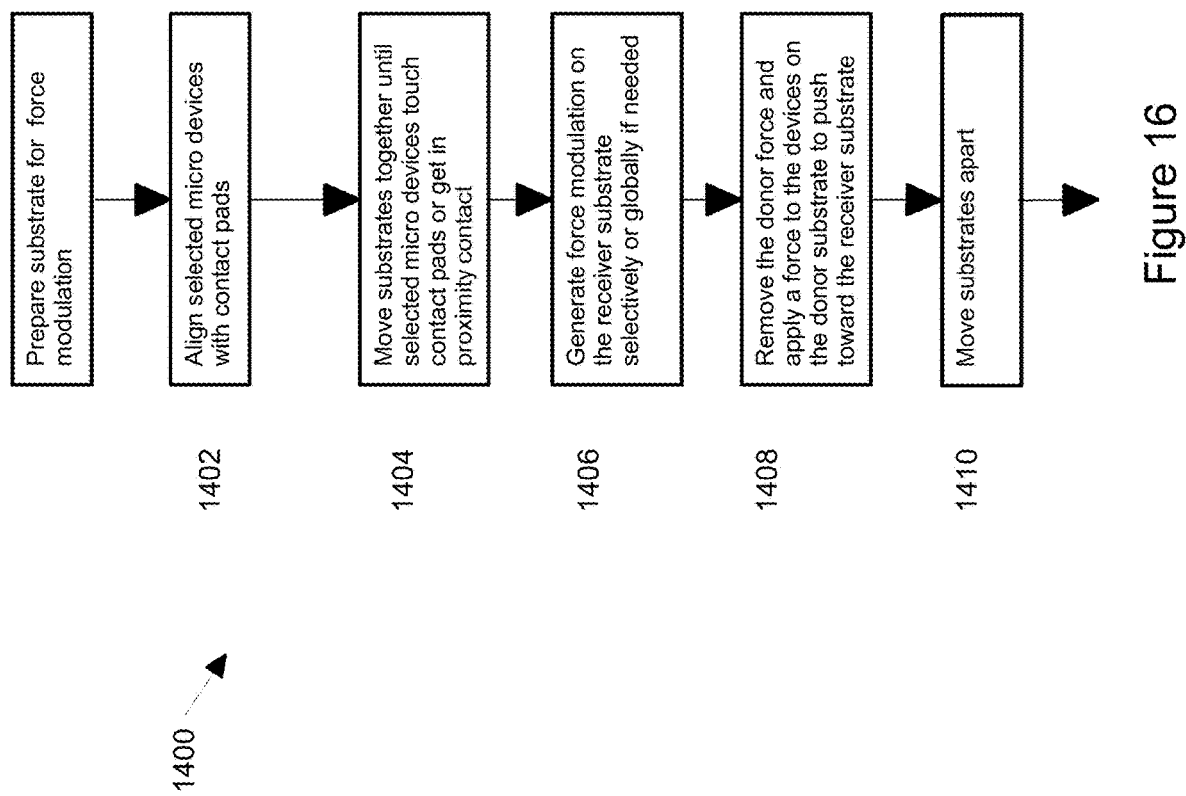
FIG. 16 shows a flowchart of method 1400 for selectively transferring micro devices from a donor substrate to a receiver substrate.
Figure 17A:
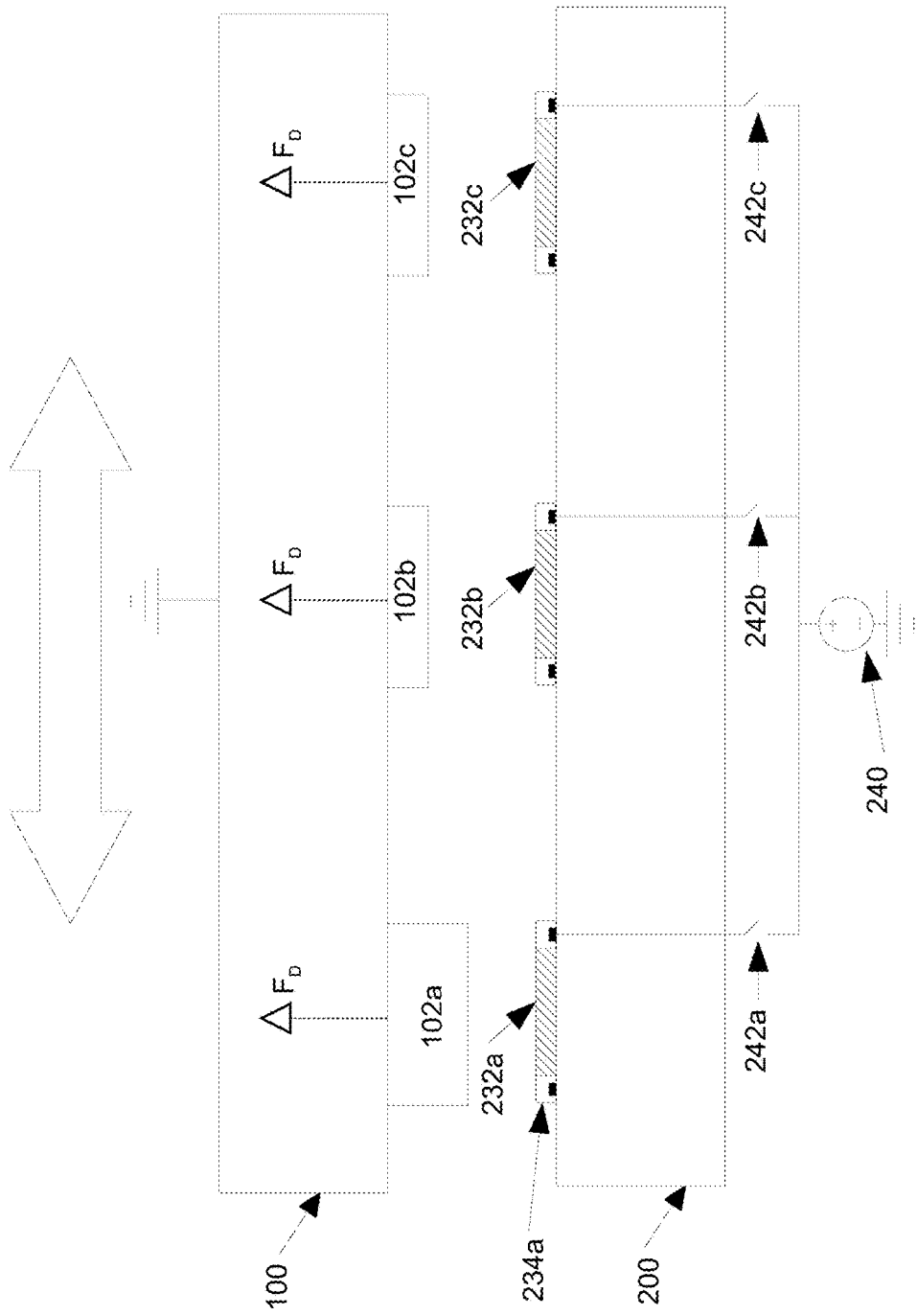
FIG. 17A-17E show one embodiment for implementing steps in method 1400.

FIG. 16 shows a flowchart of method 1400 based on electrostatic FR. However, other FR forces can be applied as well. Method 1400 is a modified version of method 1300 and is particularly suited to simultaneous transfer of micro devices 102 of different heights. At 1402, donor substrate 100 and receiver substrate are aligned so that selected micro devices 102a, 102b are in line with corresponding contact pads 232a, 232b, as shown in FIG. 17A. Note that micro device 102a is of a different height than micro device 102b.

Figure 17B:
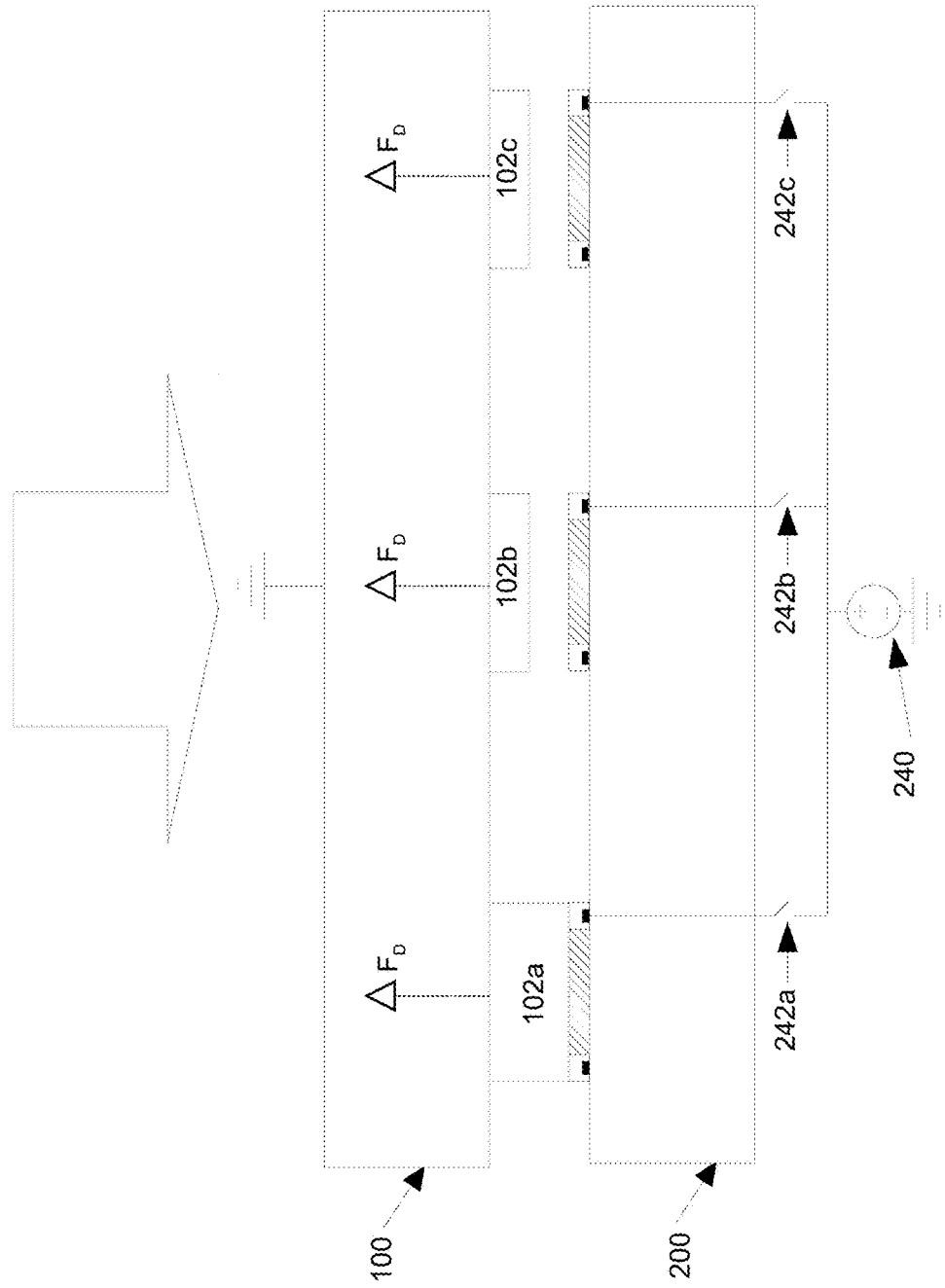

At 1404, donor substrate 100 and receiver substrate 200 are moved together until the micro devices 102 are close enough for electrostatic FR to act on micro devices 102. Donor substrate 100 and receiver substrate 200 may be held so that no micro devices 102 make contact with contact pads 232 or, as shown in FIG. 17B, substrates 100, 200 may stop approaching when some micro devices 102 make contact with contact pads 232.

Figure 17C:
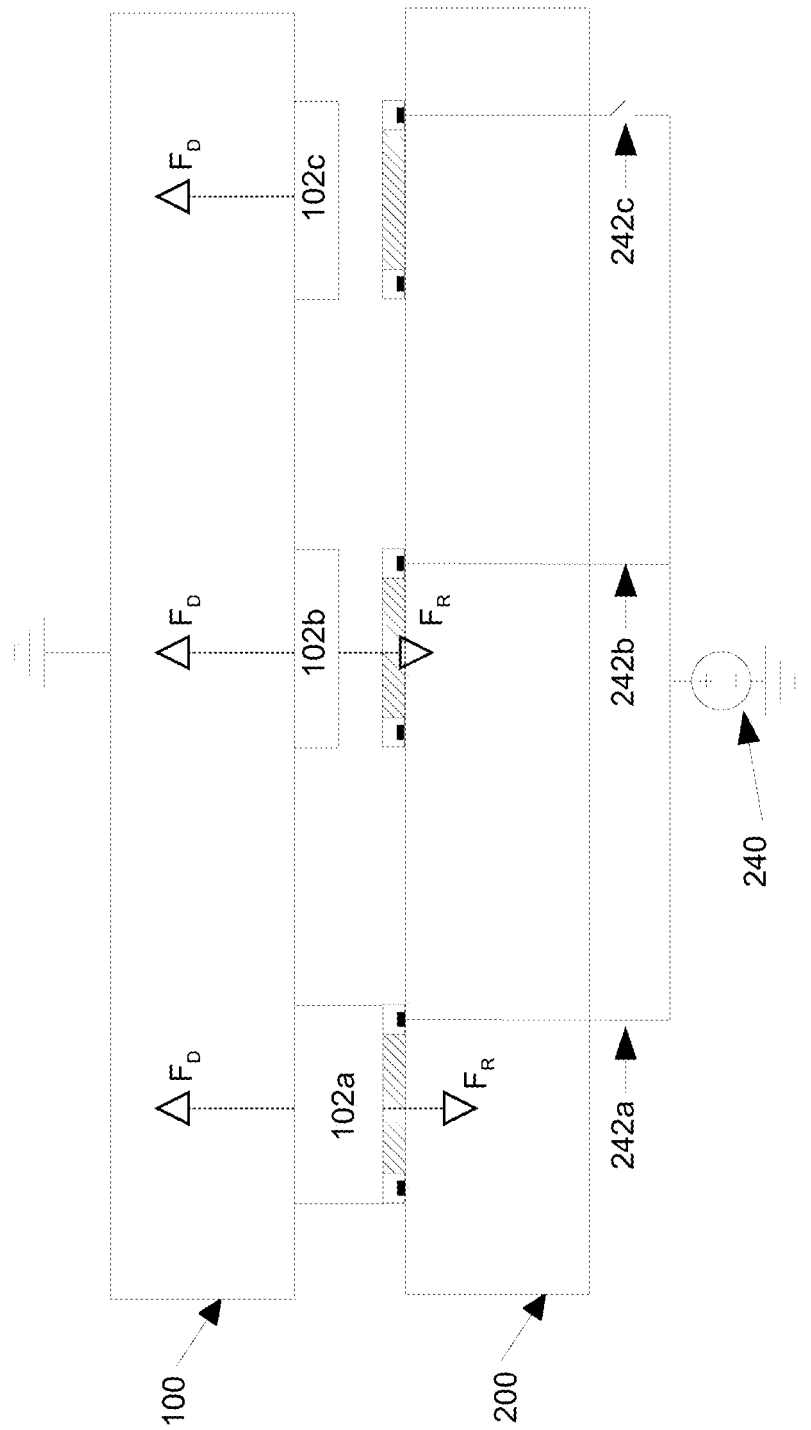
Figure 17D:
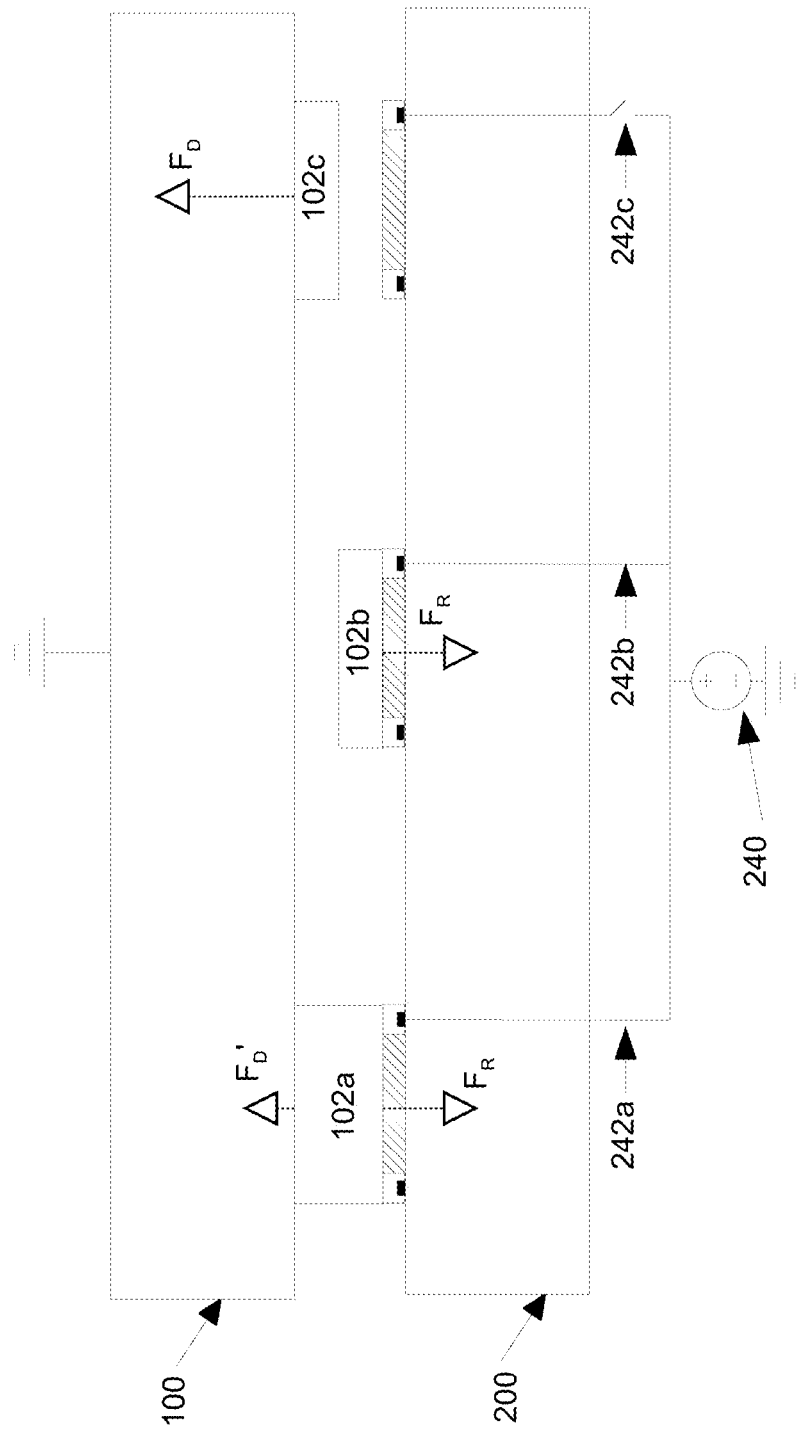

At 1406, a receiver force, FR, is generated, as shown in FIG. 17C. FR is generated by closing switches 242a, 242b that connect conductive portions 238 of electrostatic layers 234 to voltage source 240 creating charged conductive portions 238 at the potential of voltage source 240. Selected micro devices 102a, 102b, being at a different potential, e.g. ground potential, will be electrostatically attracted to conductive portions 238.

At 1408, donor force FD is selectively weakened for selected micro devices 102a, 102b, so that FD' is less than FR. This may be done, for example, using laser lift off techniques, lapping or wet/dry etching. At this point, micro devices 102a, 102b will detach from donor substrate 100. Micro device 102b will jump the gap to their corresponding contact pads 232a, 232b on receiver substrate 200.

Figure 17E:
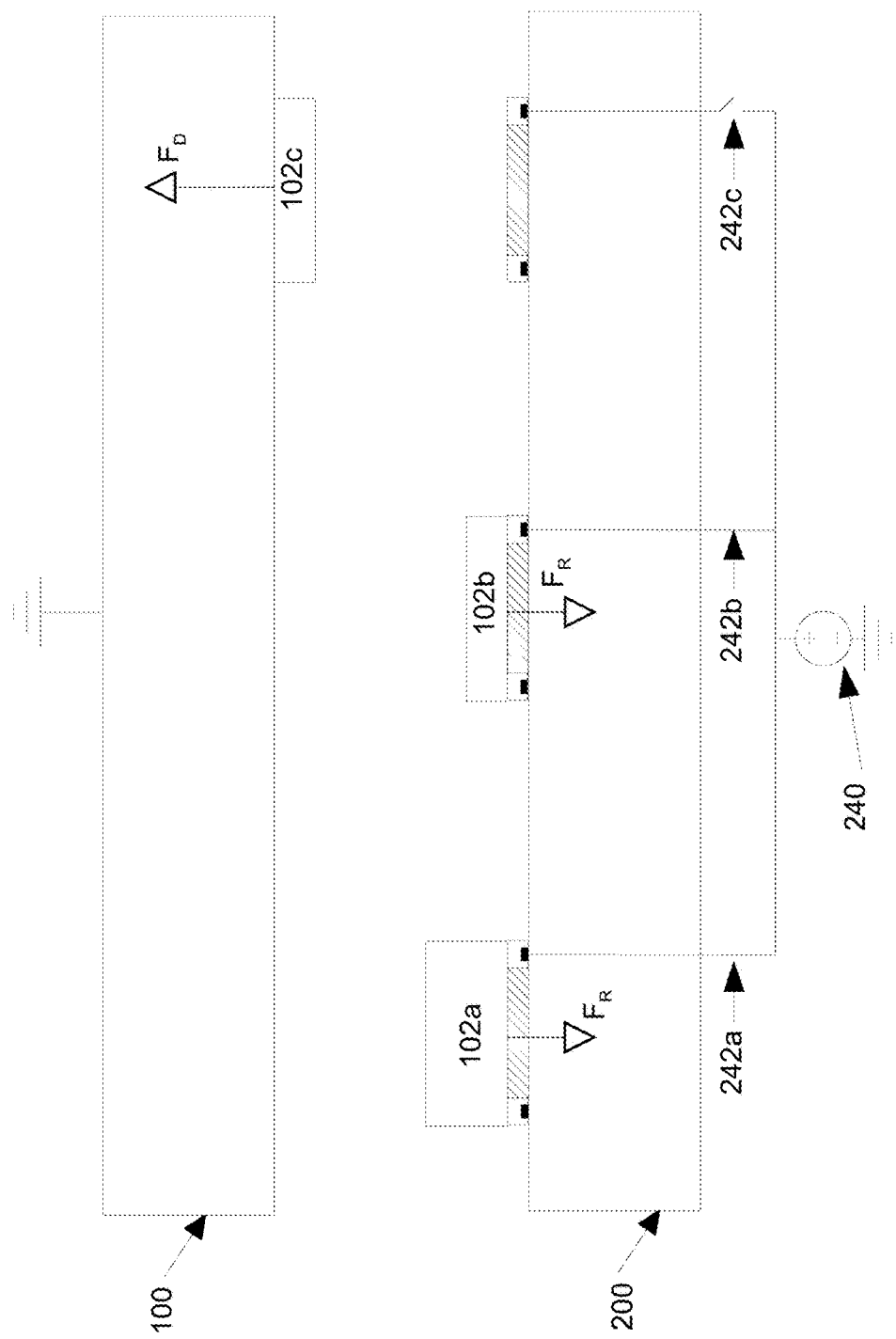

At 1410, donor substrate 100 and receiver substrate 200 are moved apart, leaving selected micro devices 102a, 102b attached to corresponding contact pads 232a, 232b, as shown in FIG. 17E. Once donor substrate 100 is separated from receiver substrate 200, further processing steps can be taken. For example, donor substrate 100 and receiver substrate 200 can be re-aligned and steps can be repeated in order to transfer a different set of micro devices 102 and to contact pads 232. Additional layers can also be deposited on top of or in between micro devices 102, for example, during the manufacture of a LED display, transparent electrode layers, fillers, planarization layers and other optical layers can be deposited. It should be noted that FR will cease to operate if the connection to voltage source 240 is removed. Accordingly, further processing steps to create a permanent bond between micro devices 102 and contact pads 232 are desirable. Curing contact pads 232, as described above, is a suitable further processing step that will create such a bond and enable further working or transporting receiver substrate 200.

One application of this method is development of displays based on micro-LED devices. An LED display consists of RGB (or other pixel patterning) pixels made of individual color LEDs (such as red, green or blue or any other color). The LEDs are manufactured separately and then transferred to a backplane. The backplane circuit actively or passively drives these LEDs. In the Active form each sub-pixel is driven by a transistor circuit by either controlling the current, the ON time, or both. In the Passive form, each sub-pixel can be addressed by selecting the respective row and column and is driven by an external driving force.

The LEDs conventionally are manufactured in the form of single color LEDs on a wafer and patterned to individual micro-devices by different processes such as etching. As the pitch of the LEDs on their substrate is different from their pitch on a display, a method is required to selectively transfer them from their substrate to the backplane. The LEDs' pitch on their substrate is the minimum possible to increase the LED manufacturing yield on a wafer, while the LED pitch on the backplane is dictated by the display size and resolution. According to methods implemented here, one can modulate the force between the LED substrate and the micro-LEDs and uses any of the technique presented here to increase the force between selected LED and backplane substrate. In one case, the force for LED wafer is modulated first. In this case, the force between LED devices and substrate is reduced either by laser, backplane etching, or other methods. The process can selectively weaken the connection force between selected LEDs for transfer and the LED substrate or it can be applied to all the devices to reduce the connection force of all the LED devices to the LED substrate. In one embodiment, this is accomplished by transferring all LEDs from their native substrate to a temporary substrate. Here, the temporary substrate is attached to the LEDs from the top side, and then the first substrate is removed either by polishing and/or etching or laser lift off. The force between the temporary substrate and the LED devices is weaker than the force that the receiver substrate can selectively apply to the LEDs. To achieve that a buffer layer may be deposited on the temporary substrate first. This buffer layer can be a polyamide layer. If the buffer layer is not conductive, to enable testing the devices after transfer to the temporary and receiver substrate, an electrode before or after the buffer layer will be deposited and patterned. If the electrode is deposited before the buffer layer, the buffer layer maybe patterned to create an opening for contact.

In another method, the LED connection-force modulation happens after the LED substrate and the backplane substrate are in contact and the receiver substrate forces to LED are selectively modulated by the aforementioned methods presented here. The LED substrate force modulation can be done prior to the backplane substrate force modulation as well.

As the force holding the LEDs to the backplane substrate after transfer is temporary in most of the aforementioned methods, a post processing step may be needed to increase the connection reliability to the backplane substrate. In one embodiment, high temperature (and/or pressure can be used). Here, a flat surface is used to apply pressure to the LEDs while the temperature is increased. The pressure increases gradually to avoid cracking or dislocation of the LED devices. In addition, the selective force of the backplane substrate can stay active during this process to assist the bonding.

In one case, the two connections required for the LED are on the transfer side and the LED is in full contact with the backplane after the transfer process. In another case, a top electrode will be deposited and patterned if needed. In one case, a polarization layer can be used before depositing the electrode. For example, a layer of polyamide can be coated on the backplane substrate. After the deposition, the layer can be patterned to create an opening for connecting the top electrode layer to receiver substrate contacts. The contacts can be separated for each LED or shared. In addition, optical enhancement layers can be deposited as well before or after top electrode deposition.

Testing Process

Identifying defective micro devices and also characterizing the micro devices after being transferred is an essential part of developing a high yield system since it can enable the use of repair and compensation techniques.

Figure 18A:
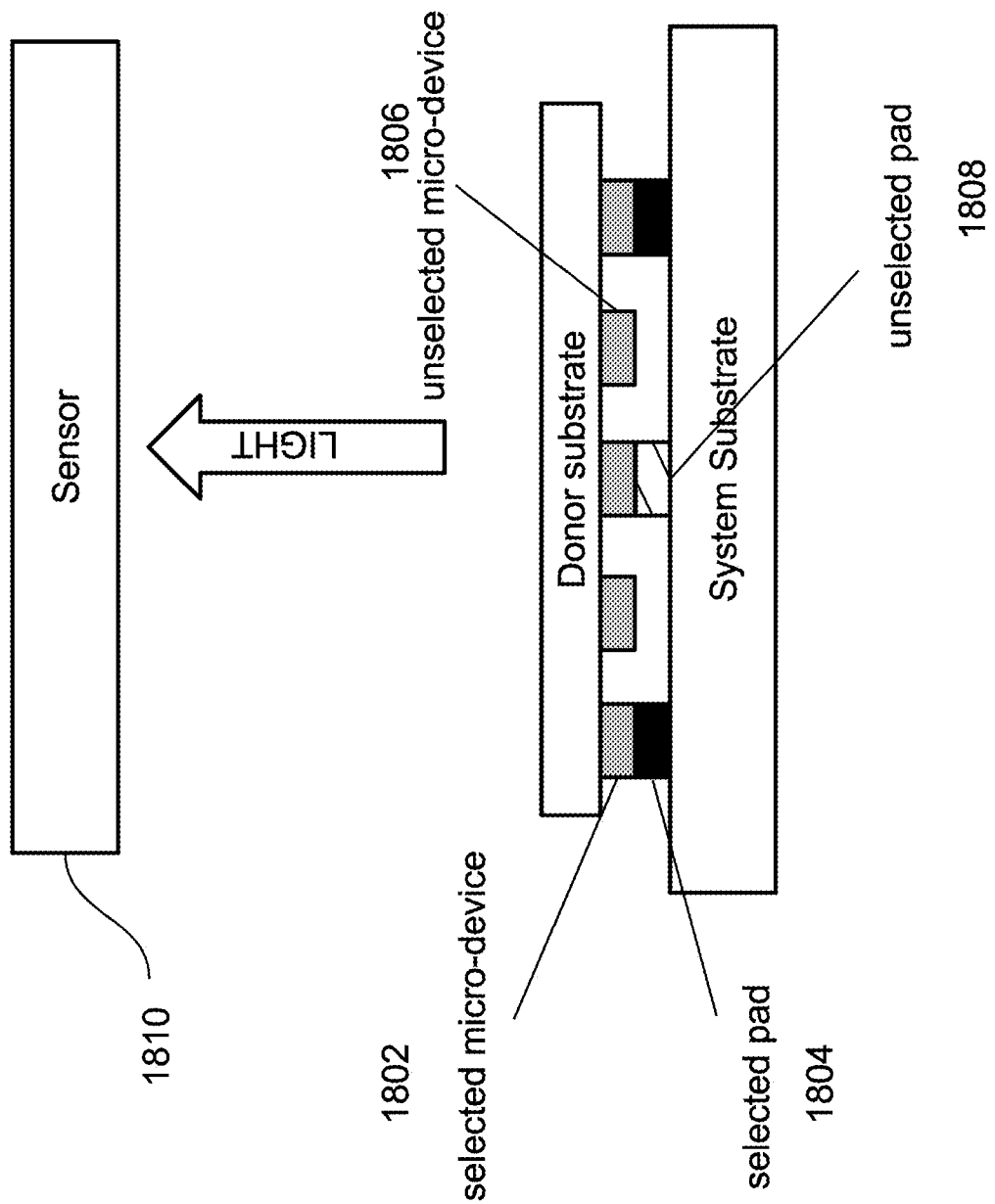
FIG. 18A shows a platform for testing by biasing at least one of the donor substrate or the receiver substrate to enable testing the micro devices for defects and performance. Here, the output of the micro device is through the receiver substrate.
Figure 18B:
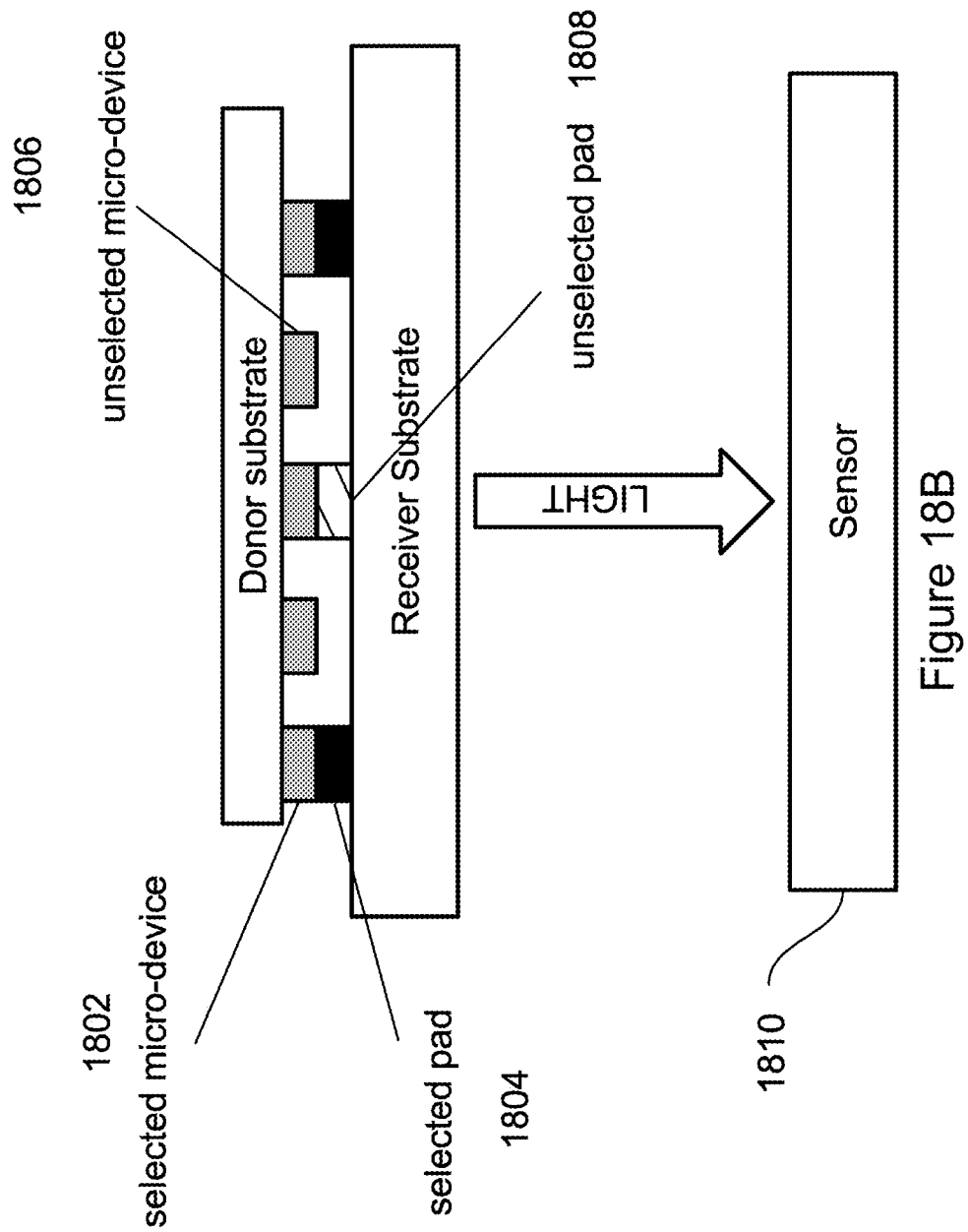
FIG. 18B shows a platform for testing by biasing at least one of the donor substrate or the receiver substrate to enable testing the micro devices for defects and performance. Here, the output of the micro device is through the donor substrate.
Figure 19:
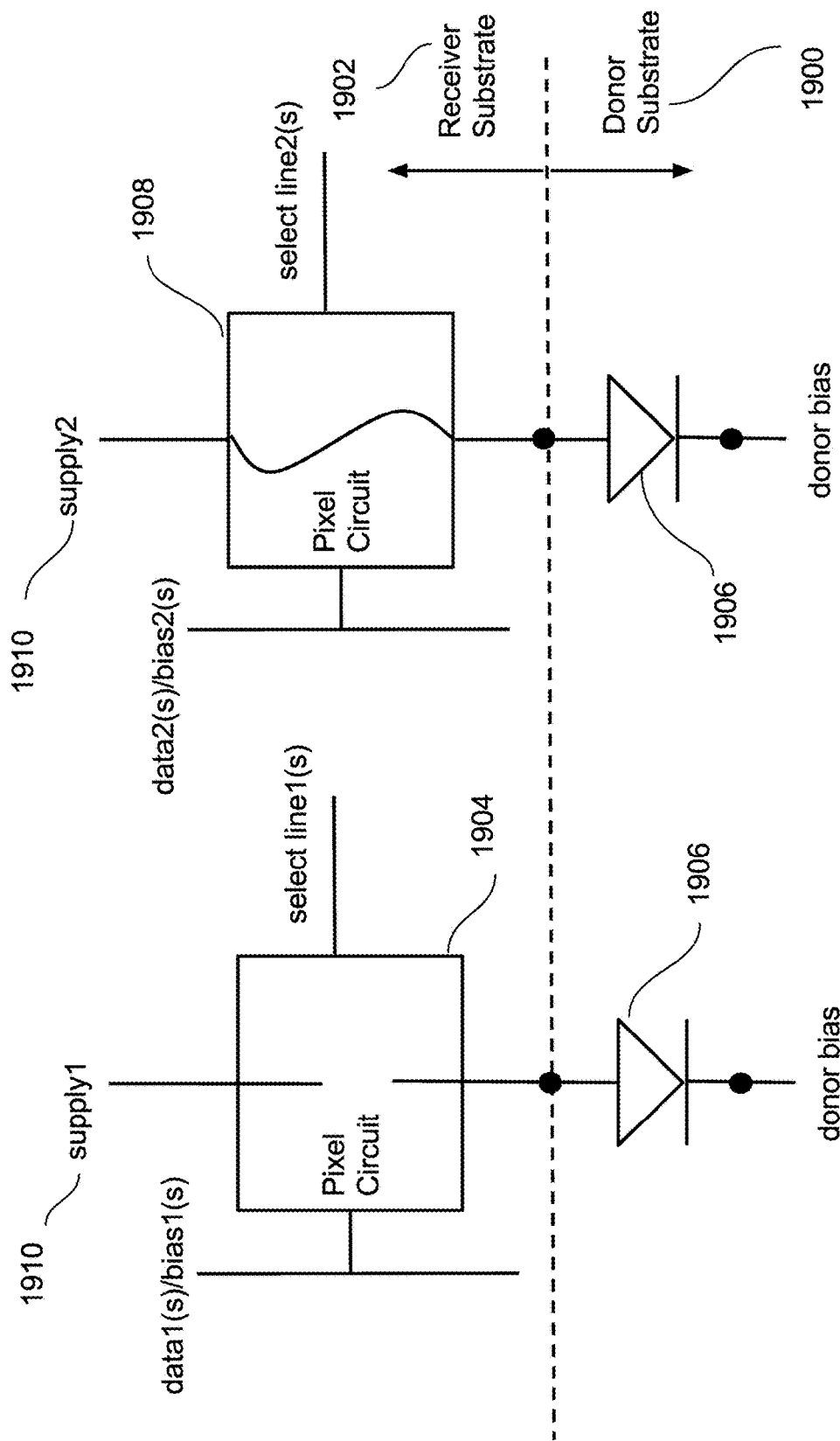
FIG. 19 shows a simplified biasing condition of receiver substrate for testing the micro devices for defect and performance analysis.

In one embodiment shown in FIG. 18, the receiver substrate is put in test mode during a transfer process. If needed, the donor substrate may be biased for test mode. If the micro device is an optoelectronic device, a sensor 1810 (or sensor array) is used to extract the optical characteristics of the transferred devices. Here, the receiver substrate is biased so that only the selected device 1802 is activated through selected contact pads 1804. Also, unselected devices 1806 stay deactivated and unselected pads 1808 stay inactive to prevent any interference. For connectivity testing, the micro device is biased to be active (for the LED case, it emits light). If a micro device is not active, the device can be flagged as defective. In another test, the micro device is biased to be inactive (for the LED case, it does not emit light). If a micro device is active, the device can be flagged as defective. FIG. 19 shows an example of a pixel biasing condition for activating or deactivating a micro device. Here, the micro device 1906 is coupled 1908 to a bias voltage 1910 (supply voltage) to become activated. For deactivating the micro device 1906, it is disconnected from the voltages. Here, the donor substrate 1900 can be biased for enabling the test. In another case, the micro devices are tested during post processing. While a surface is used to apply pressure to the devices to create permanent bonding, the circuit is biased to activate the micro devices. The surface can be conductive so that it can act as another electrode of the micro devices (if needed). The pressure can be adjusted if a device is not active to improve any malfunction in the connection to the receiver substrate. Similar testing can be performed to test for open defective devices. For performance testing, the micro device is biased with different levels and its performance (for the LED case, its output light and color point) is measured.

In one case, the defective devices are replaced or fixed before applying any post processing to permanently bond the device into receiver substrate. Here, the defective devices can be removed before replacing it with a working device. In another embodiment, the landing area on the receiver substrate corresponding to the micro devices comprises at least a contact pad and at least a force modulation element.

It should be understood that various embodiments in accordance with and as variations of the above are contemplated.

In another embodiment, the net transfer forces are modulated by weakening the donor force using laser lift off. In another embodiment, the net transfer forces are modulated by weakening the donor force using selectively heating the area of the donor substrate near each of the selected micro devices. In another embodiment, the net transfer forces are modulated by selectively applying adhesive layer to the micro devices. In another embodiment, a molding device is used to apply the adhesive layer selectively. In another embodiment, printing is used to apply the adhesive layer selectively. In another embodiment, a post process is performed on the receiver substrate so that the contact pads permanently bond with the selected micro devices. In another embodiment, the post process comprises heating the receiver substrate. In another embodiment, the heating is done by passing a current through the contact pads. In another embodiment, the method is repeated using at least one additional set of selected micro devices and corresponding contact pads. In another embodiment, the contact pads are located inside an indentation in the receiver substrate and each selected micro device fits into one such indentation. In another embodiment, the pitch of the array of micro devices is the same as the pitch of the array of contact pads. In another embodiment, the pitch of the array of micro devices is proportional to the pitch of the array of contact pads. In another embodiment, each of the selected micro devices comprises a protrusion and the contact pads comprise a depression sized to match the protrusion on each micro device. In another embodiment, the net transfer forces are modulated by generating electrostatic attraction between the selected micro devices and the receiver substrate. In another embodiment, the electrostatic forces are applied to the entire array of micro devices on the donor substrate by a force element on the receiver substrate or behind the receiver substrate. In another embodiment, the electrostatic forces are generated selectively by the force modulation element of the landing area. In another embodiment, the force modulation element of the landing area on the receiver substrate comprises a conductive element near each contact pad, each conductive element capable of being linked to a voltage source in order to sustain an electrostatic charge. In another embodiment, each conductive element comprises one or more sub-elements. In another embodiment, the sub-elements are distributed around the contact pad. In another embodiment, each conductive element surrounds a contact pad. In another embodiment, the force modulation element of the landing area on the receiver substrate comprises a conductive layer and a dielectric layer throughout a substantial portion of the landing area, the conductive layer capable of being linked to a voltage source in order to sustain an electrostatic charge. In another embodiment, the donor substrate and the receiver substrate are brought close together, but the selected micro devices and the contact pads do not touch until after the net transfer forces are modulated whereupon the selected micro devices move across the small gap to the contact pads. In another embodiment, the height of the selected micro devices differs. In another embodiment, the contact pads are concave. In another embodiment, the force modulation element of the receiver substrate generates a mechanical clamping force. In another embodiment, the mechanical force modulation element forms part of at least one contact pad. In another embodiment, the mechanical force modulation element is separate from the contact pad. In another embodiment, the mechanical force modulation is created by thermal expansion or compression of at least one of the force modulation element or micro device. In another embodiment, each contact pad has a concave portion and each selected micro device is inserted into a concave portion of a contact pad.

In another embodiment, the receiver substrate is heated before the donor substrate and the receiver substrate are moved together so that the concave portion of the contact pads expands to be larger than a selected micro device and the receiver substrate is cooled before the donor substrate and the receiver substrate are moved apart so that the concave portion of the contact pads contracts around the selected micro devices and provides the receiver force via mechanical clamping of the selected micro devices.

In another embodiment, the force modulation element in the landing area of the receiver substrate is an adhesive layer positioned between the selected micro devices and the receiver substrate. In another embodiment, the adhesive layer is conductive. In another embodiment, a portion of each of the contact pads on the receiver substrate is coated with an adhesive layer. In another embodiment, a portion of each of the selected micro devices is coated with an adhesive layer. In another embodiment, a portion of the area near the contact pads is coated with an adhesive layer.

In another embodiment, the net transfer force is modulated both on the donor substrate with at least one of the aforementioned methods and on the receiver substrate with at least one of the described methods.

In one embodiment, the force on the donor substrate is modulated by selectively lifting off the micro-devices. In one case, a shadow mask is used to block the laser from the unwanted devices. In one case as shown in FIG. 20(a), the shadow mask 2002 is made of an opaque substrate with opening 2002-1 in the substrate for allowing the laser to pass through. The laser separates the selected devices 2006 from the donor substrate 2004. The system (receiver) substrate 2008 can apply a transfer force 2010 to attract and hold the separated devices 2006. In another case, shadow mask 2002 can be made with patterning. A transparent substrate 2014 for the laser is used. An opaque film 2012 is deposited on the substrate and then it is patterned to create opening 2002-1 for the laser. The opaque film 2012 can be combination of few different films. The opaque film can be either on top or bottom of the substrate 2014. In another case, the laser is programmed to only target specific area.

Figure 21:
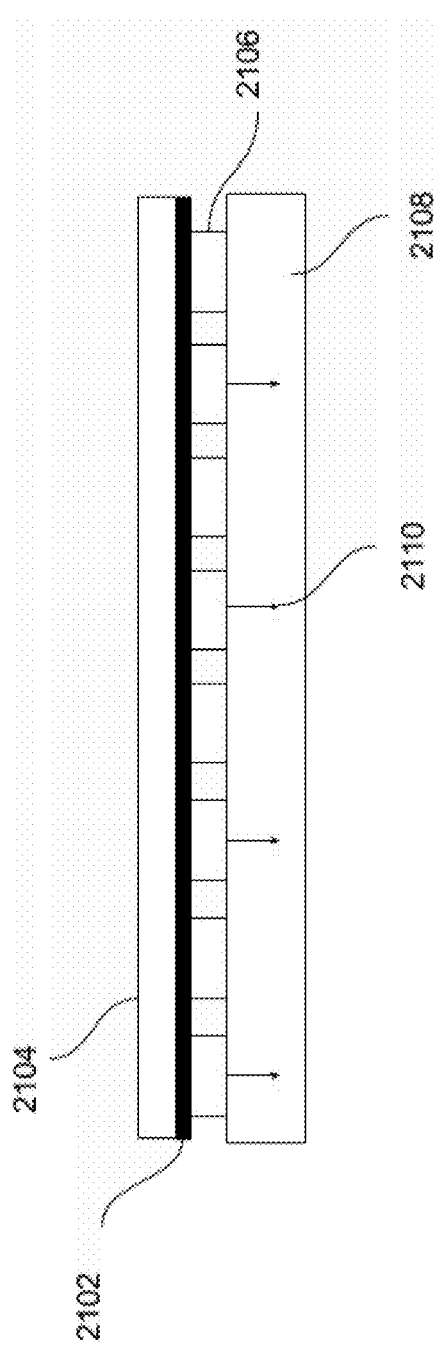
FIG. 21 shows a donor substrate with a sacrificial layer between micro devices and the substrate.

In another embodiment shown in FIG. 21, the donor substrate 2104 has a layer 2102 holding the micro devices 2106. The adhesion of the holding layer 2102 can change due to temperature, illumination, or electrical current. Using the adhesion modulation, the adhesion of the layer 2102 is decreased for selected devices or for the adhesion of unselected devices is increased. The receiver substrate 2108 can apply a transfer force 2110 to attract and hold the selected devices.

Figure 23:
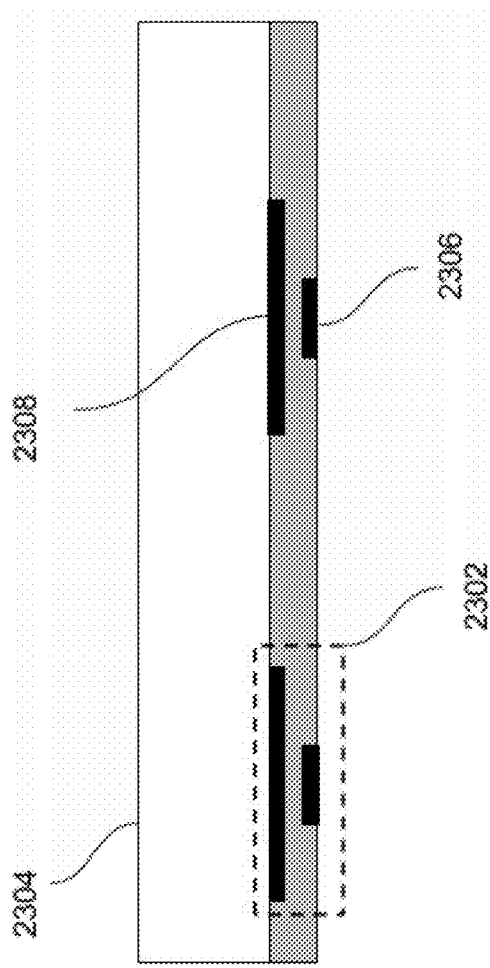
FIG. 23 shows a donor substrate with a force modulating element and a biasing pads.
Figure 25:
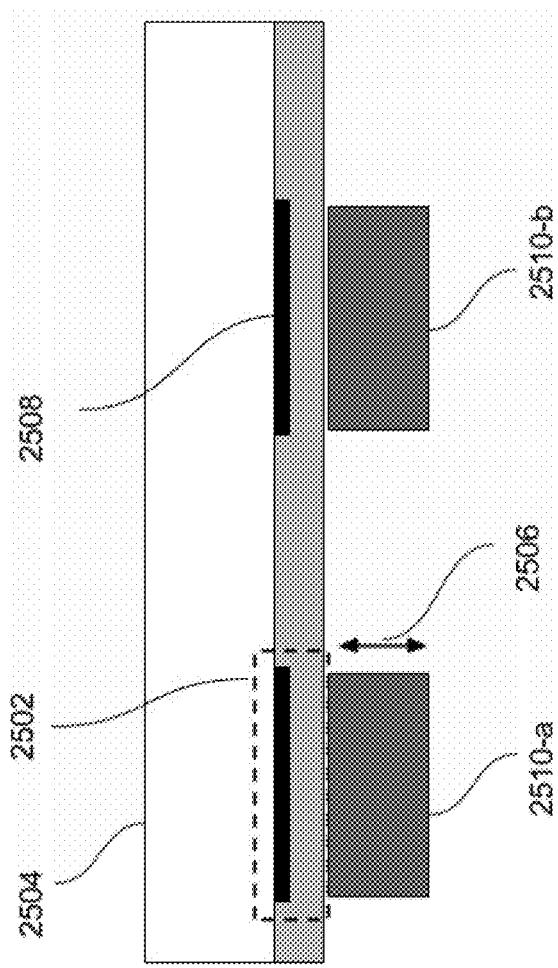
FIG. 25 shows an embodiment that change the distance between selected devices and receiver substrate with the distance between unselected device and receiver substrate.

In another embodiment, the donor substrate 2204 is using either electrostatic or electromagnetic force 2202 to hold an array of devices 2206. After picking the array of micro devices 2206 from the original substrate, the force for holding the selected micro devices 2206-a on the donor substrate is reduced (or the force for the unselected device 2206-b is increased). As a result, the transfer force 2210 from receiver substrate 2208 acts more effectively on selected devices 2206-a. The selected micro devices 2206-a are moved into receiver substrate 2208 while the remaining devices 2206-b on the donor substrate 2204 can be used to populate the rest of receiver substrate 2208 or another receiver substrate. In case of using electrostatic force for holding the array of micro devices 2206, the force can be changed by either manipulating the voltage or by changing dielectric characteristic. In case of manipulating the voltage, the device 2206 may need to be biased. As a result, either the micro devices 2206 are biased after being in contact with the receiver substrate 2208 contact pads (it can be similar to the contact pads described in the landing area or a different pad) or there is a contact pads on the donor substrate that bias the micro devices. FIG. 23 shows an exemplary electrostatic holding force 2302 with a biasing pad 2306 on the donor substrate 2304. Here, the electrostatic electrodes 2308 are used to pick up the array of devices. After moving to receiver substrate, the electrostatic force for selected micro devices is reduced by changing the voltage across two electrodes 2306 and 2308 (the same method can be used to increase the force for unselected micro devices). In addition, one can create a repelling force for selected micro devices by applying similar charges to both electrodes 2306 and 2308. The remaining micro devices on the donor substrate can be transferred similarly to either the other area of receiver substrate or a different receiver substrate. FIG. 24 shows two exemplary embodiment for changing the changing the characteristics of the donor substrate 2404 forces. In case of changing the capacitance 2402 characteristic, one can change the thickness of the dielectric. In this case, the thickness of dielectric can be changed by either moving 2406 the electrode 2408 or the dielectric structure. The movement can be done through MEMS structure or piezo materials. In all the cases, electrostatic electrode can be continuous or patterned for group or a single micro device. In another case, a shield layer 2410 can physically shield the electrostatic electrode of donor substrate 2404 from the selected devices. All the above methods can be applied to electromagnetic force as well.

Figure 26A:
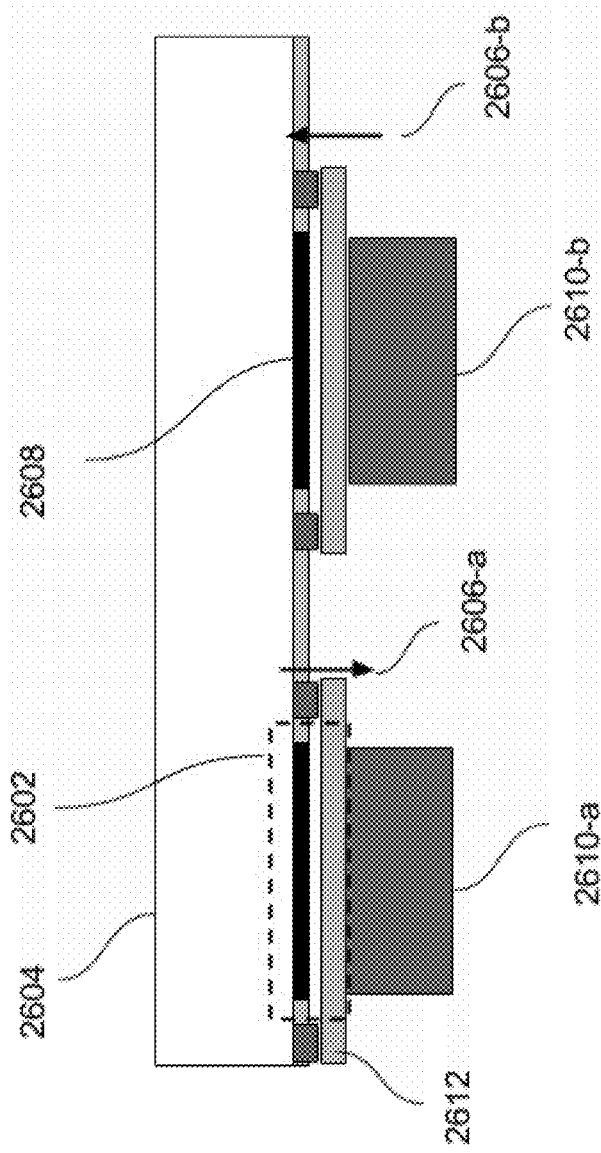
FIG. 26A shows an embodiment using membrane for moving the micro device backward or forward.
Figure 26B:
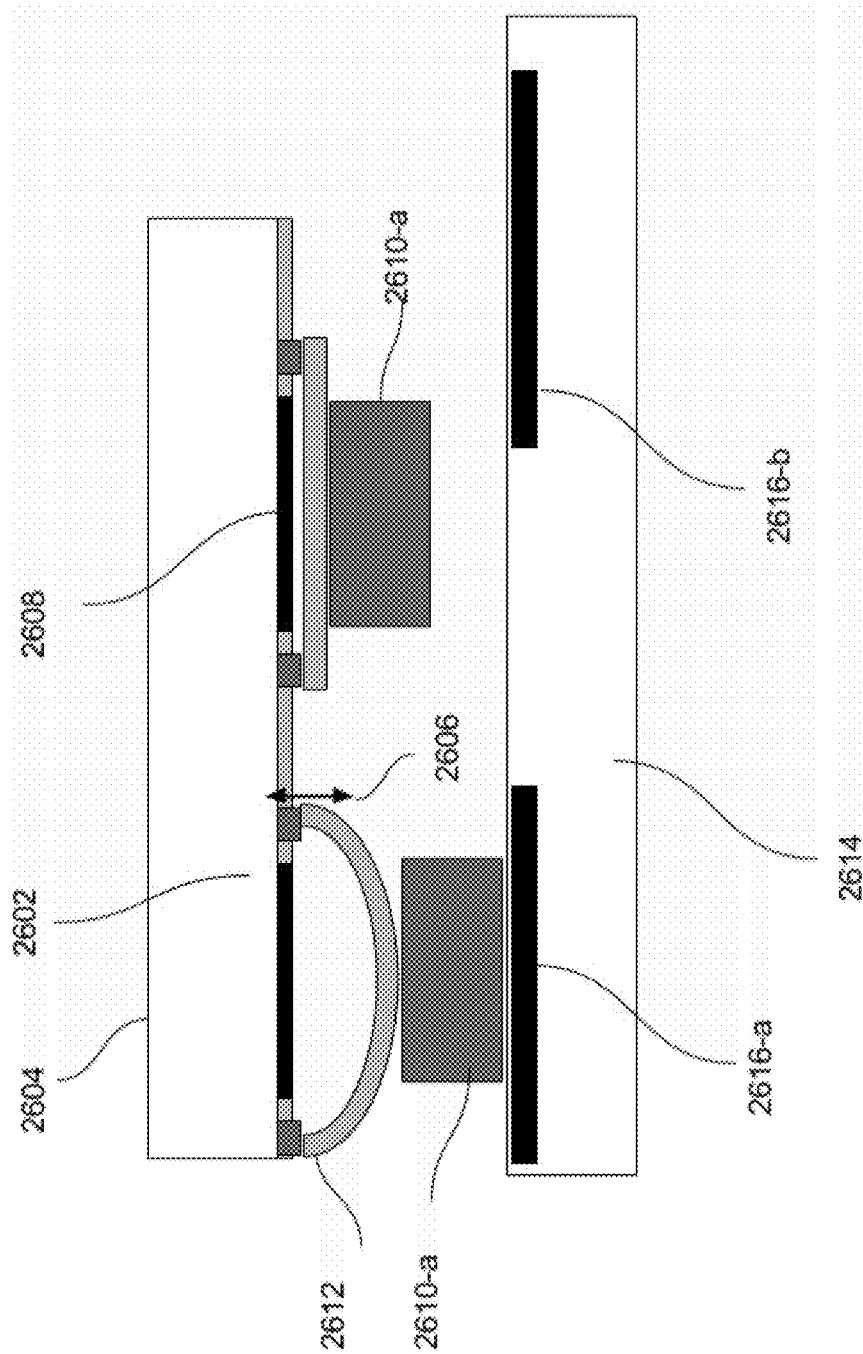
FIG. 26B shows an embodiment where the membrane moves the selected device closer to the receiver substrate.

In one embodiment, distance between selected micro devices 2510-*a* and receiver substrate is reduced compared to the distance between unselected micro devices 2510-*b* and receiver substrate. Here, the devices 2510 can move forward or backward 2506 by using proper structure 2502 in donor substrate. In one case shown in FIG. 26, MEMS membrane 2612 is used to create the movement 2606-*a* for the selected device 2610-*a* forward or movement 2606-*b* for the unselected devices backward 2610-*b*. Here, the holding force element 2608 can be on the moving part 2612 or on stationary part. In one embodiment, the movement can be controlled by electromagnetic force created by current passing through membrane 2612 or a current through a wire on the donor substrate 2604. In another embodiment, the movement is controlled by electrostatic force. In another embodiment, the movement is controlled by piezo materials. Also, different techniques can be used for moving the micro devices closer to the receiver substrate. In another case, micro fluid and membrane is used to move the devices forward or backward. After picking the devices 2610 from original substrate, the donor substrate 2604 moves to receiver substrate 2614. Here, the selected devices 2610-*a* are moved closer to the receiver substrate 2614. Here, the force modulation elements 2616 on the receiver substrate create transfer force for picking the selected devices 2610-*a*. The transfer force can be either the same for all the devices (in this case the force modulation elements 2616 can be uniform or patterned) or different for selected devices 2610- and unselected devices 2610-*b* to enhance selective transfer.

Figure 27A:
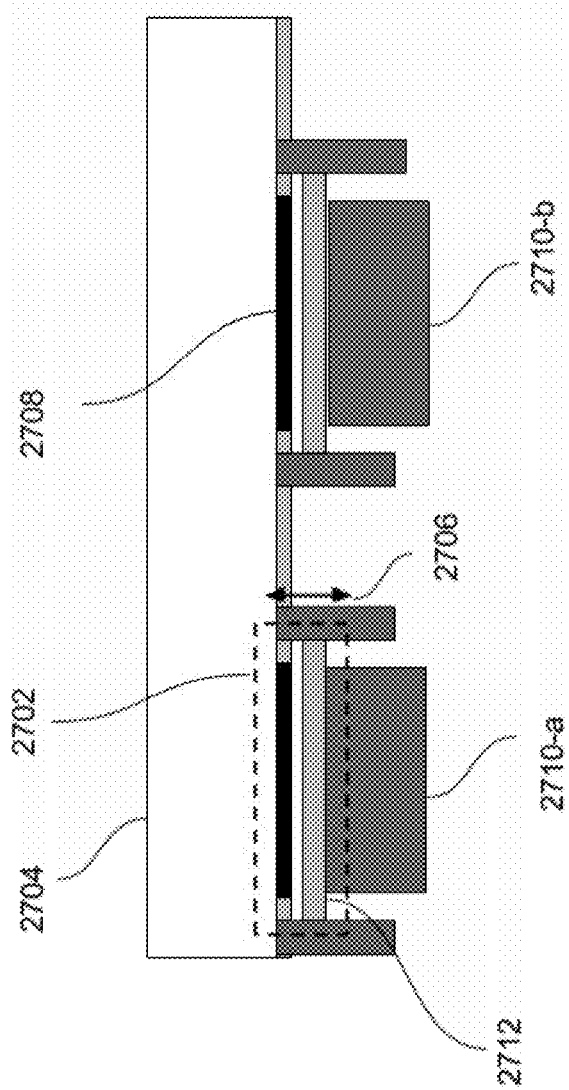
FIG. 27A shows an embodiment using a cantilever (membrane) for moving the micro devices forward or backward.
Figure 27B:
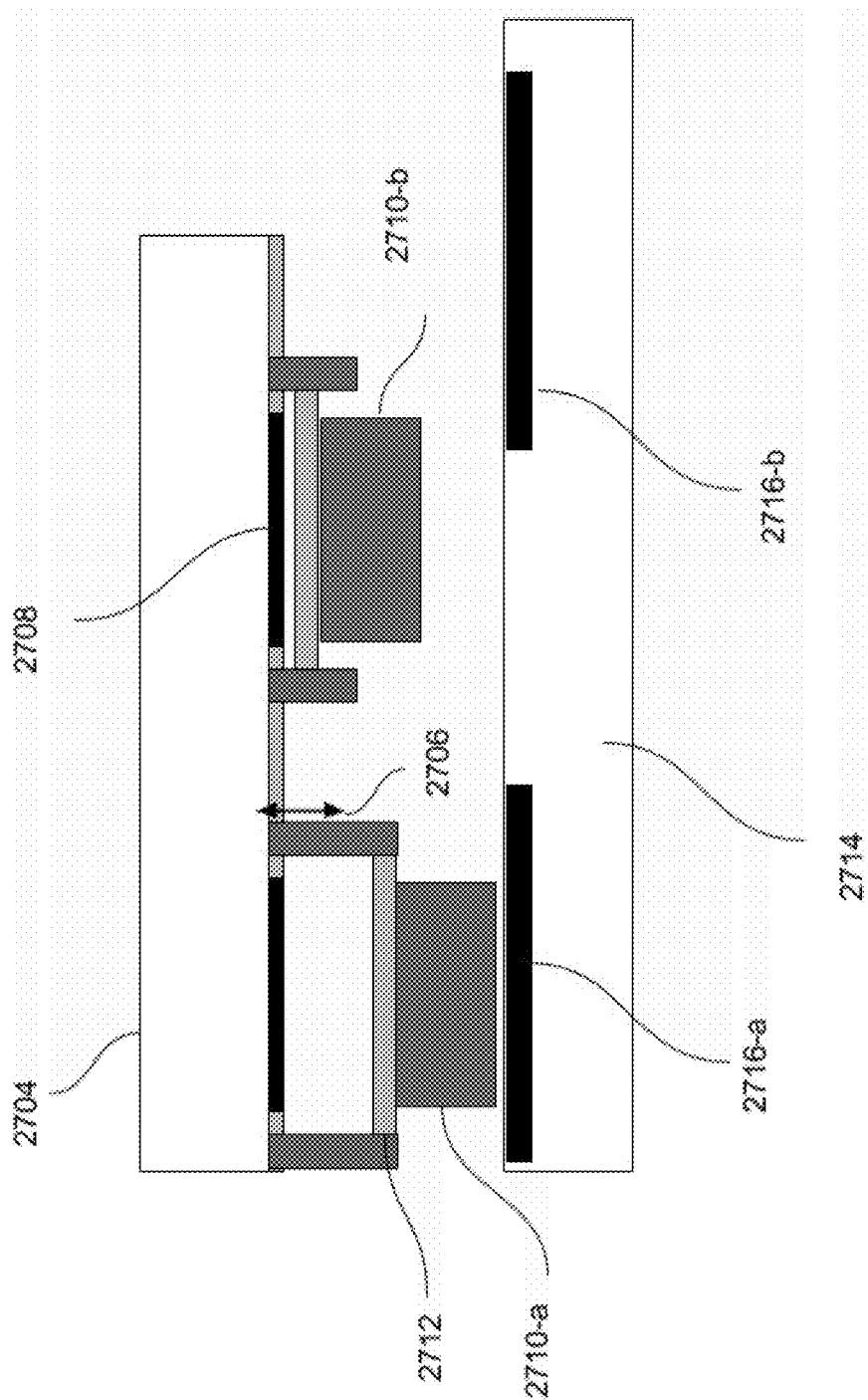
FIG. 27B shows an embodiment using a cantilever (membrane) for moving the selected device closer to the receiver substrate.

In another embodiment demonstrated in FIG. 27, the force modulation element 2702 and its movement 2706 is controlled by a free standing cantilever 2712 (the cantilever can be secured in one or more point or totally free standing). After picking the devices 2710 from original substrate, the donor substrate 2704 moves to receiver substrate 2714. Here, the selected devices 2710-*a* are moved closer to the receiver substrate 2714. Here, the force modulation elements 2716 on the receiver substrate 2714 create transfer force for picking the selected devices 2710-*a*. The transfer force can be either the same for all the devices (in this case the force modulation elements 2716 can be uniform or patterned) or different for selected devices 2710-*a* and unselected devices 2710-*b* to enhance selective transfer.

Figure 28:
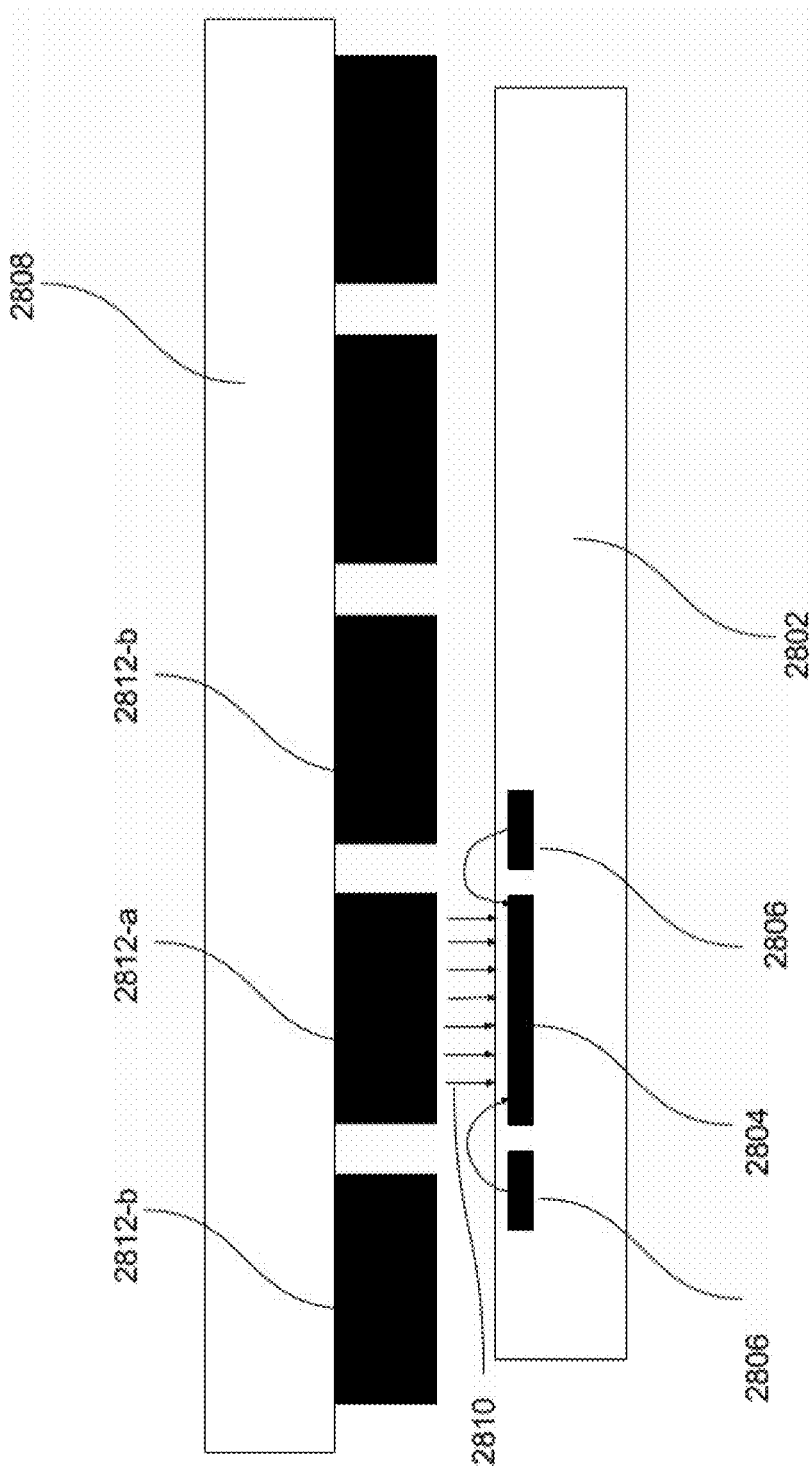
FIG. 28 shows an embodiment for confining the transfer force on the selected device by diverging the force from adjacent devices.

In one embodiment, the transfer force of receiver substrate is confined by using another adjacent force. For the example shown in FIG. 28, the receiver substrate 2802 uses transfer force as form of electrostatic 2810. In this case, another electrode 2806 adjacent to the electrostatic electrode 2804 in at least on side of the electrostatic pad is created. While the electrostatic electrode 2804 create transfer force to attract the selected device 2812-*a*, these other pads 2806 redirect the electrostatic force away from the unselected micro devices 2812-*b*.

Figure 29:
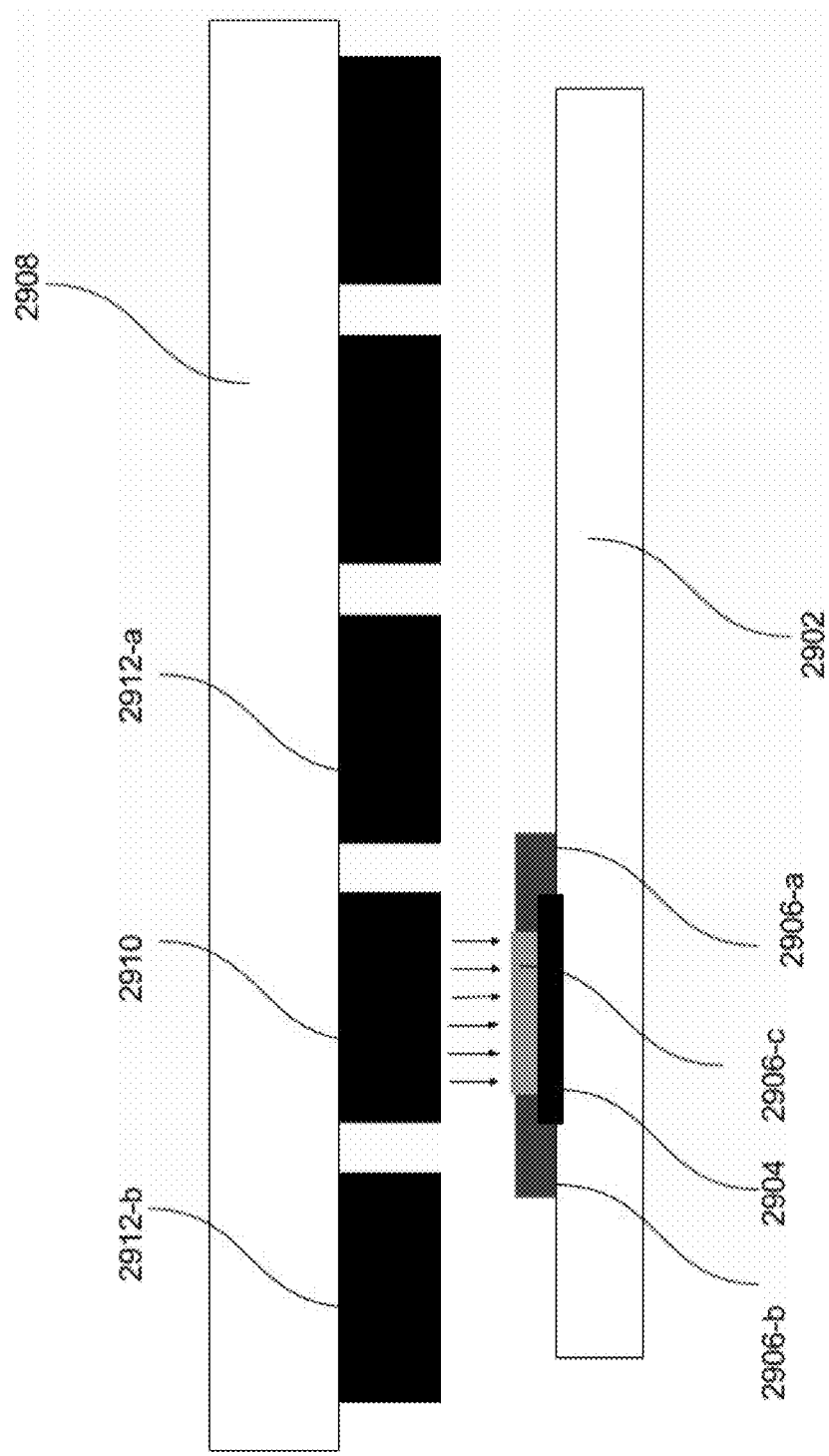
FIG. 29 shows an embodiment for confining the transfer force on the selected devices by reducing the effect of the force on the adjacent devices.

In another embodiment, the force of receiver substrate is confined by using different dielectric layer. As shown in FIG. 29, to reduce the electrostatic force from the receiver substrate 2902 on adjacent devices 2912-*a*, 2912-*b* on the donor substrate 2908, the dielectric layer 2906-*a*, 2906-*b* on the side of the electrostatic pad 2904 has different dielectric constant or different thickness.

In one embodiment, the donor substrate or receiver substrate has sensing devices. As the micro-devices are being integrated into the receiver substrate, the sensing device can test the functionality of each micro-device. This information can be used to repair the faulty device if needed. Also, this information can be used to control the transfer faulty devices by increasing the donor force or reducing the transfer for such faulty devices. In case of emissive device, the sensing element is a photo-sensor that can detect the output of emissive micro devices. In this case, the micro-device is biased during the transfer to emit (or be off). The output is measured by sensing element and so it is used to identify if the device is normal, always ON, or always OFF, or other stages of operation. If sensing device is located on the donor substrate, the testing can be done during the transferring the device to donor substrate as well. The sensing device can be part of donor or receiver substrate or extra element added to the substrate.

In the embodiments associated with FIG. 24, 25, 26, 27, and other possible embodiments, distance can be modulated by using materials that deforms under a trigger conditions. In one case, piezoelectric material or electroactive polymers can be used. Here by applying the electric filed the distance modulation layer deforms and moves the device away from the donor substrate or bring it closer to the receiver substrate. In another case liquid crystal materials, and any other type of materials with volume changing characteristic is used to modulate the distance. Here, applying electricity can increase or decrease the device volumes and so modulate the distance of micro device by pushing or polling the device. The other trigger source can be heat or a form of light. Selective application of heat can change the shape, volume or viscosity of certain materials. These characteristics can be used to change the distance between micro device and receiver or donor substrates.

In all embodiment referred in these applications, more than one force modulation element can be used for each micro device. In case of electrostatic force for example, one can use two electrodes for different polarity. In one case, the bias voltage of electrodes can be DC in another case the bias voltage for the electrodes can be AC.

Figure 30:
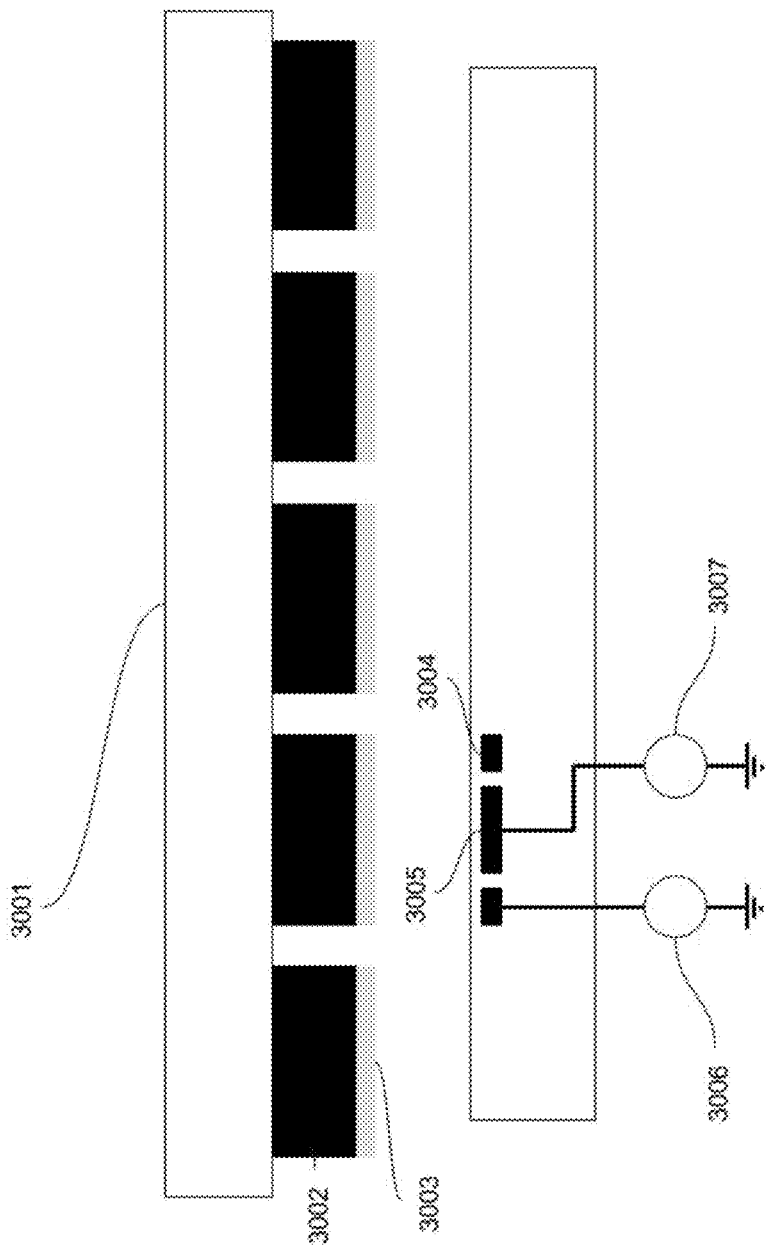
FIG. 30 shows an embodiment which uses an electrostatic electrode to modulate transfer force.
Figure 31:
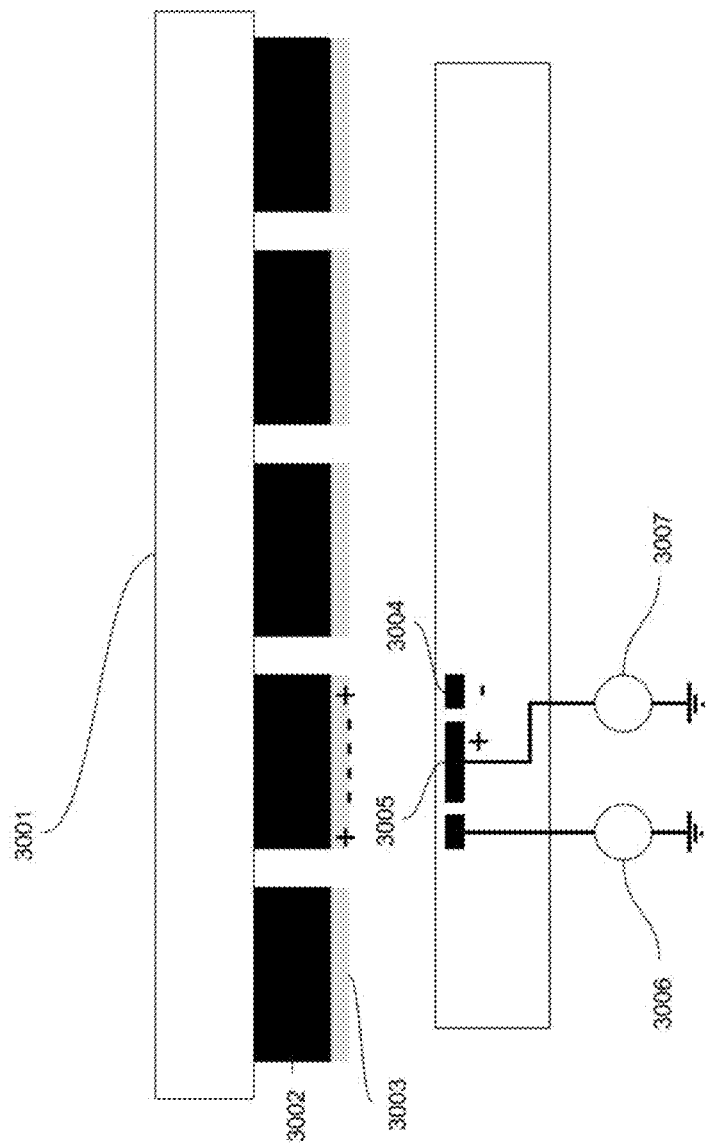
FIG. 31 shows an embodiment which uses an electrostatic electrode to modulate transfer force.

Referring to FIG. 30, in one embodiment, the electrostatic electrode has two electrically separate parts 3004 and 3005. In one example, as shown in FIG. 30, electrode 3004 may be a ring surrounding electrode 3005. During the transfer process electrodes 3004 and 3005 are connected to voltage sources 3006 and 3007. As it is shown in FIG. 31, voltage sources 3006 and 3007 may form continuous or alternative opposite electric fields 3008. In this case, to transfer micro device 3002, it may be not required to ground the micro device during the transfer process. In these embodiments, opposite electric fields 3008 separates electric charges inside the conductive electrode 3003. The voltage polarity shown in FIG. 31 is an example and one can use different polarities. Also, the pads can have different configuration. A benefit of this configuration is the reduction of the unwanted electrostatic force on adjacent micro devices. Since the devices are not biased, the spray electrostatic force from pads 3005 will not affect the unwanted devices.

Figure 32:
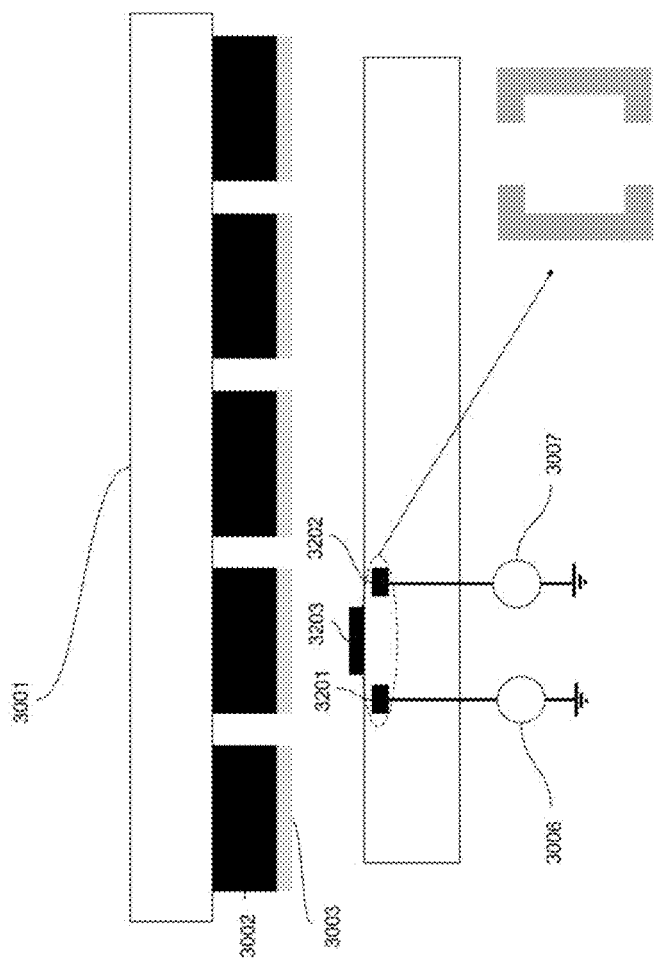
FIG. 32 shows an embodiment which uses an electrostatic electrode to modulate transfer force.

In another embodiment shown in FIG. 32, the electrostatic pad may have two separate parts 3201 and 3202 forming a ring around the contact pad 3203. During the transfer process electrodes 3004 and 3005 are connected to voltage sources 3006 and 3007 which may output continuous voltage or alternative voltage at different or same phase. In one example when voltage sources 3004 and 3005 are alternative voltage the phase difference may be 180 degrees.

In all the embodiment, planarization layer can be deposited between structure on receiver substrate and force modulation elements. This can improve the surface profile and so make the transfer easier.

Dual Function Pads for Selective Transfer.

In another aspect of the present invention, a deformable bonding layer is positioned between the pads in receiver substrate and micro devices. The bonding layer can be deformed to accommodate different height in micro devices. In addition, the bonding layer can cover most of the landing area and, therefore, relax alignment accuracy between donor substrate and receiver substrate. In one embodiment a deformable bonding layer between receiver substrate and micro devices is used to accommodate the height difference in micro devices. In one aspect of the invention, the bonding layer is current curable.

In one embodiment of the invention, a transfer mechanism is used for holding devices from donor substrate to receiver substrate where the bonding layer is cured selectively by applying current to the bonding layer. Here, either the current is applied selectively or the bonding layer is applied selectively or both.

In one aspect of the invention, the current is applied by circuit in the receiver substrate. In another aspect of the invention, the circuit applying current is partially or fully shared with the circuit driving the micro devices in operation mode. where operation mode can be different for different type of micro devices. For example, for micro LED devices, operation mode is where the device generates lights based on driving circuit output. In another example, for micro sensor device, the operation mode is where device generate a signal (e.g. charge current, voltage, impedance, etc) based on a stimulating input signals.

In another aspect of the invention, the current is applied selectively by the donor substrate. Here the donor substrate can control the current of each individual micro devices or groups of micro-devices.

In one aspect of the invention, the curing current flows through micro device and receiver substrate. In another aspect of the invention, the curing current flows between to contact in the receiver substrate.

Figure 33:
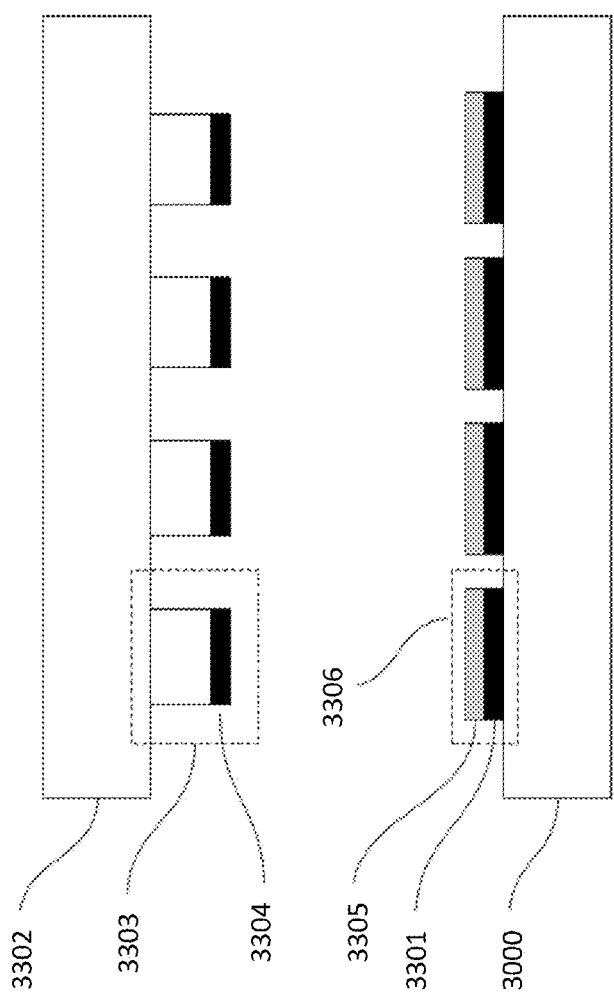
FIG. 33 shows a donor substrate and a receiver substrate with bonding element formed on each contact pads of the receiver substrate.

In one embodiment shown in FIG. 33, a receiver substrate 3300 with contact pads 3301 is aligned with a donor substrate 3302 with an array of micro devices 3303 having electrodes 3304. Each micro device 3003 has at least one corresponding contact pad 3301. Micro devices 3303 can be smaller, larger or the same size as bonding layer 3005.

Still referring to FIG. 33, bonding layer 3305 may be formed on contact pads 3301. Bonding material 3005 may be an adhesive layer to promote bonding of the micro device 3303 to the contact pad 3301. In one case, the curing improves the conductivity of the bonding layer 3305 and at the same time hold the micro device 3303 into receiver substrate 3300. In another case, upon curing the bonding layer 3305, this layer may transform from a non-conductive to a conductive material. In one aspect of this invention, the bonding layer is curable with electrical current. Here, the bonding layer 3305 can have conductive nanoparticles. The current passing through the bonding layer 3305 fuse the nanoparticles together.

Figure 34:
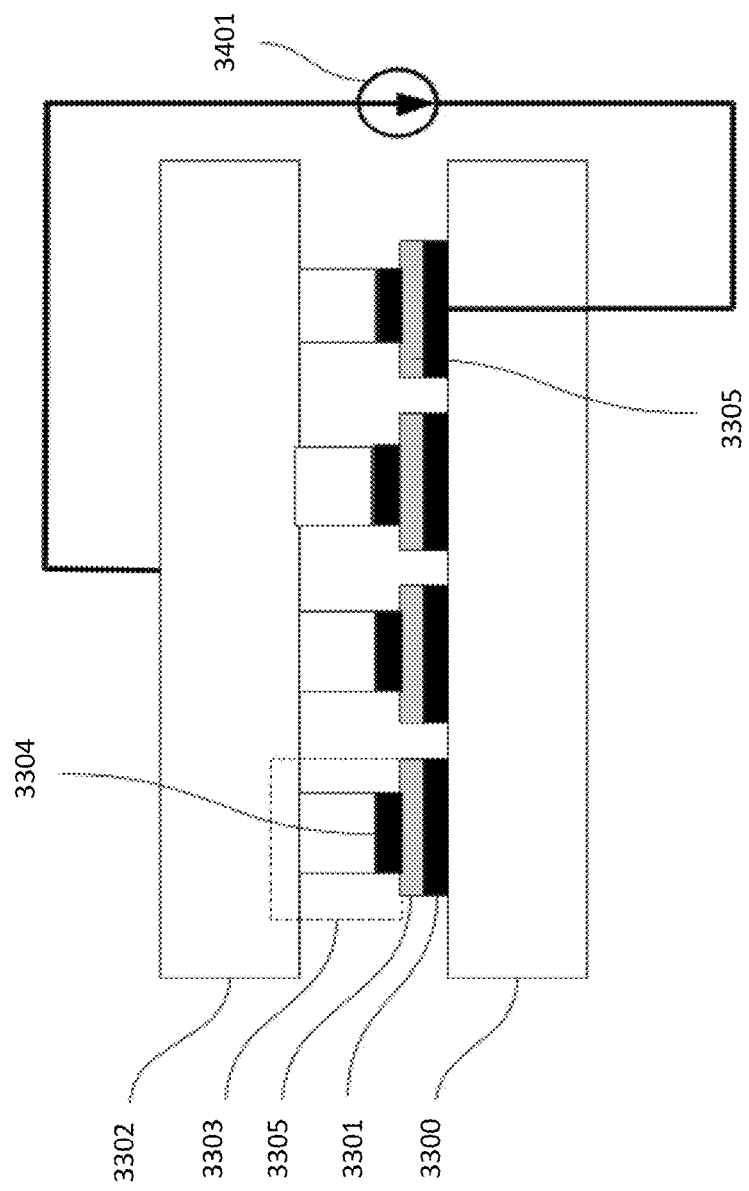
FIG. 34 shows an aligned donor substrate and receiver substrate with a current source connected to one of the contact pads on the receiver substrate and the donor substrate.

Referring to FIG. 34, in one embodiment, selective current 3401 through receiver substrate 3300 is applied to the selected pads 3301 after the receiver substrate 3300 and donor substrate 3302 are aligned with the bonding layers 3305. The current 3401 selectively cures the selected bonding layers 3305 and the selected micro devices 3003 are transferred to the receiver substrate 3000. In another the bonding layer 3305 is applied selectively to the selected pads 3001. As a result, curing the bonding layer 3305 can be global although selective curing as described will work as well.

Figure 35:
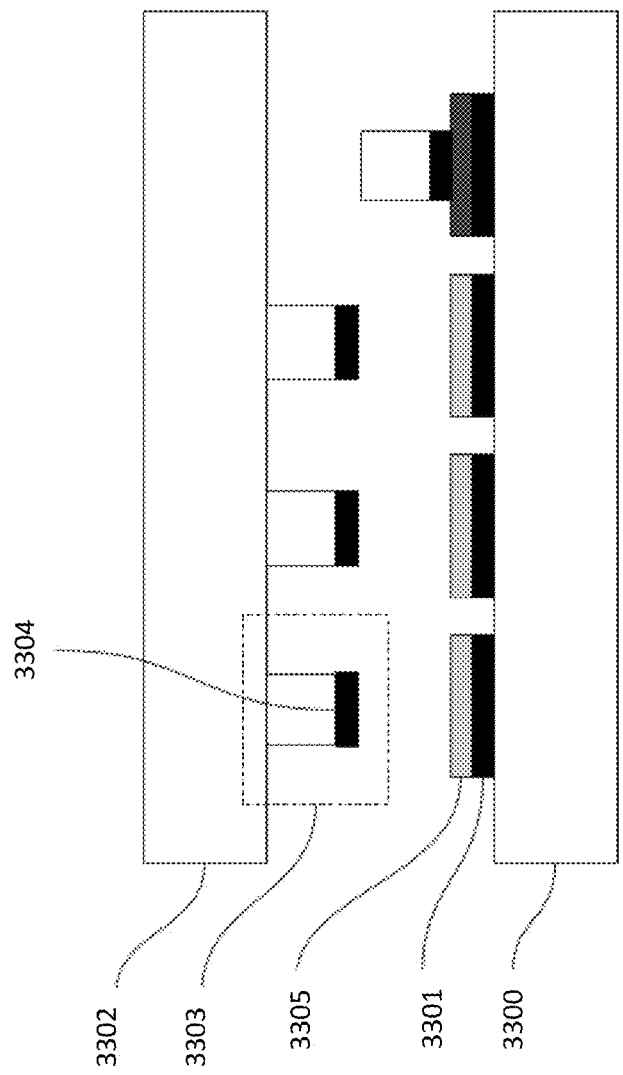
FIG. 35 shows a donor substrate and a receiver substrate with a transferred and bonded micro device on the receiver substrate.

In another embodiment, the micro devices 3303 are transferred to the receiver substrate 3300 using other selective transfer techniques (e.g. substrate assisted transfers or pick-and-place techniques). In this case, the bonding layer 3305 can be also part of the transfer mechanism. Here, during transfer, the bonding layer 3305 can be dielectric and so that a voltage on pad 3301 can act as receiver electrostatic force. After transfer, the current flowing through the bonding layer can cure the bonding layer 3305 and turn it to a conductive layer. As shown in FIG. 35, after transferring micro device 3303 to the receiver substrate 3300, a current source (not shown) is used to cure the bonding layer 3305 by passing the electrical current through the micro device and the bonding layer 3305. At the beginning of the process, bonding layer 3305 resist to the flow of the current which cause the self-heating of this layer. As the curing process continues, bonding layer 3305 resistance decreases. Upon the completion of the curing process, bonding layer 3305 transforms to a conductive interlayer between contact pad 3301 and the micro device electrode 3304. In one example, the bonding layer 3305 material may be an epoxy resin with metallic conductive nanoparticles (e.g. Au, Ag, etc.) or nonmetallic conductive particles (e.g. carbon nanotubes). The nanoparticle elements are separated and suspended in the epoxy resin which results in a high resistance for this material. Upon current flow, local welding causes the nanoparticles to joint and at the end, to transform the material to a conductive layer. In another case, the temperature of the combined donor and receiver substrates is increased to a level below the temperature required for temperature. The temperature of pads for selected micro devices increased selectively to bond the micro devices to the receiver substrate. Different means can do this process such as applying a current through the selected pads. In another case, only selected micro devices contact the pads on the receiver substrate. Therefore, as the combined temperature increases beyond the bonding temperature only the selected devices bond to the receiver substrates. As the donor force can be modulated in advance to be less than the bonding force globally, the selected devices will stay on the receiver substrate.

Figure 36:
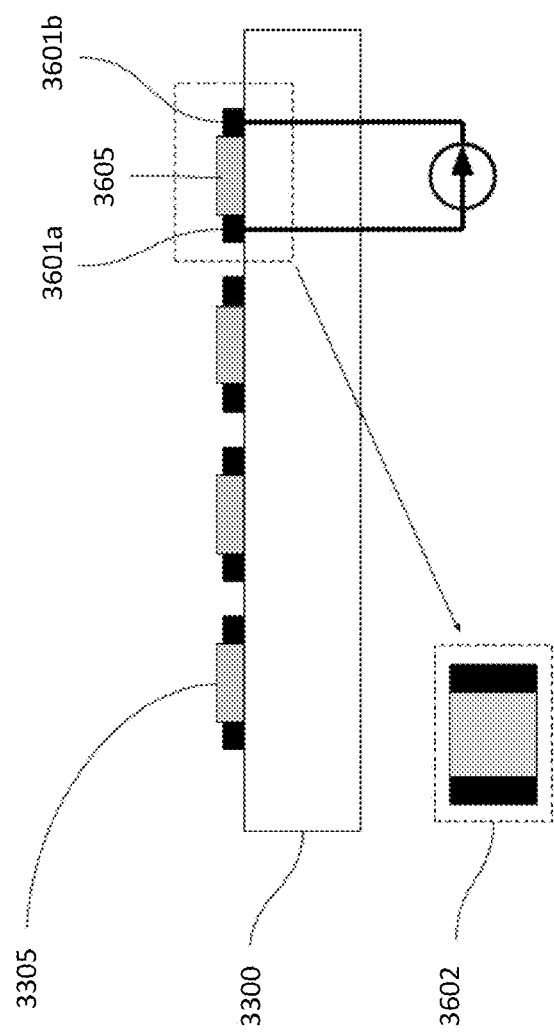
FIG. 36 shows a receiver substrate with contact pads having two electrically isolated bonding elements and a current source connecting to these elements.

Referring to FIG. 36, in another embodiment, the contact pad 3602 may be designed to have two separate conductive elements 3601a and 3601b. In this case, the bonding layer 3305 may be formed between conductive elements 3301a and 3301b. Here, curing is done by flowing a current between these two conductive elements and independent from the micro device.

Figure 37:
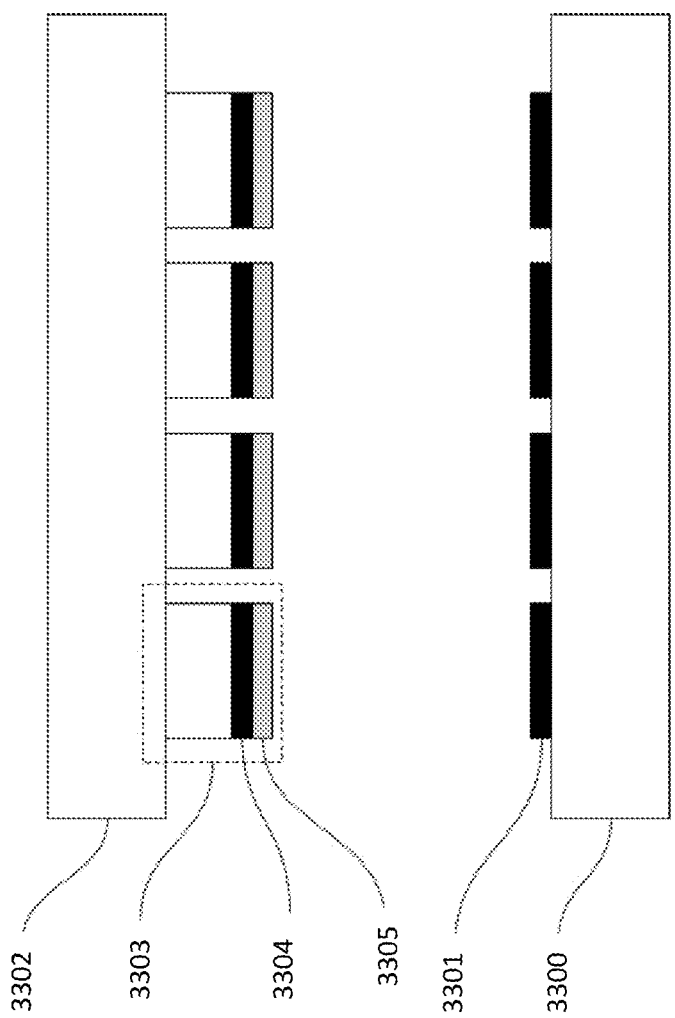
FIG. 37 shows a donor substrate and a receiver substrate with bonding element formed on each micro devices on the donor substrate.

Alternatively, as shown in FIG. 37, bonding layer 3305 may be formed on the top of the micro devices 3304 (or receiver substrate pad) using methods such as but not limited to stamping, printing or deposition and patterning. The layers can be applied selectively or globally. In all the embodiments in this section, bonding layer 3305 may be formed only for the selected micro devices 3303 that are transferred. In all the embodiments in this section, the current source may be DC or an AC current. In all embodiments in this section, a voltage source may be used to cure the bonding layer.

Figure 38:
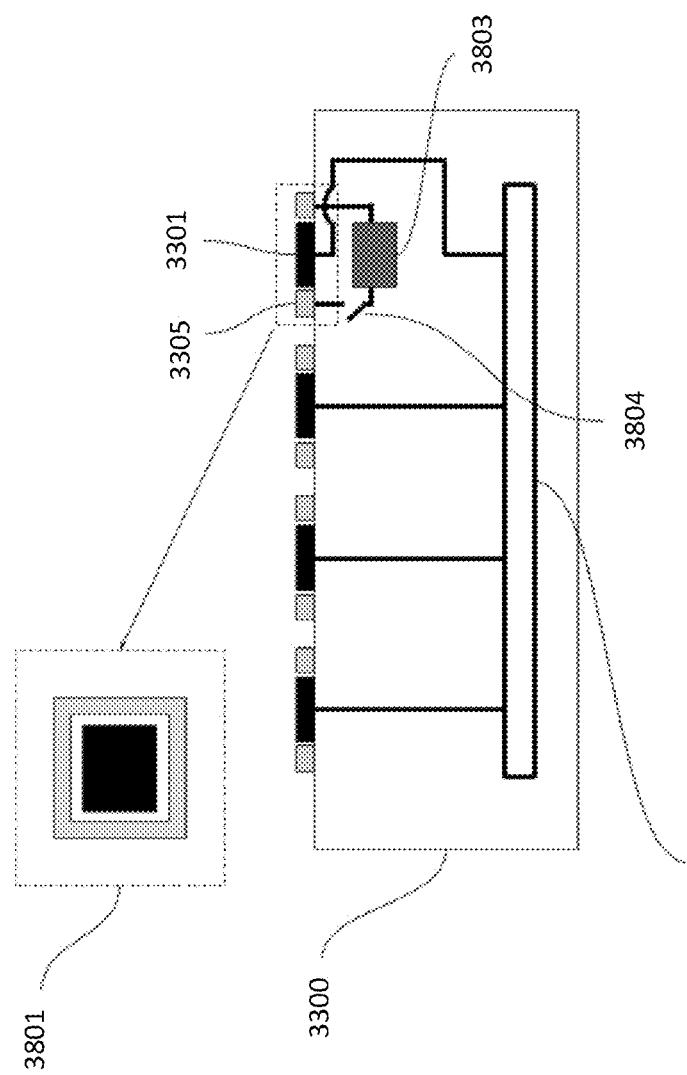
FIG. 38 shows a receiver substrate with contact pads having two electrically isolated bonding elements separate circuitries for the bonding elements and driving contact pads.

In one embodiment shown in FIG. 38, the contact pad 3301 and bonding element 3305 are separated. Driving circuit 3802 is connected to the contact pad and drives the micro device after bonding to the receiver substrate 3300. Sub-circuit 3803 is connected to the bonding element and the switch 3804 is closed for selected micro devices during the bonding process.

Figure 39:
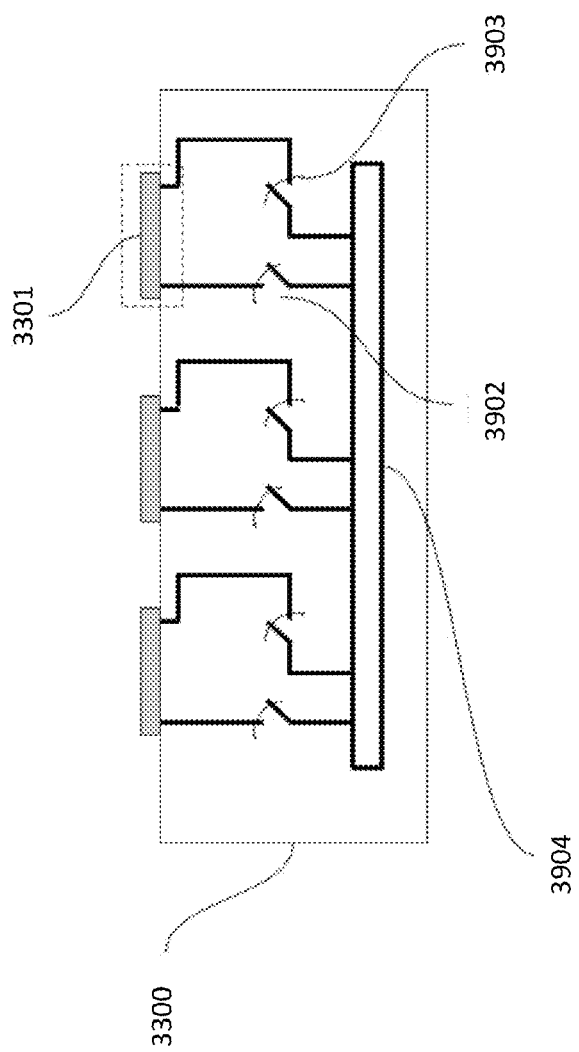
FIG. 39 shows a receiver substrate with bonding elements which transform to the driving contact pads after curing. Two switches control the curing and driving functions.
Figure 40:
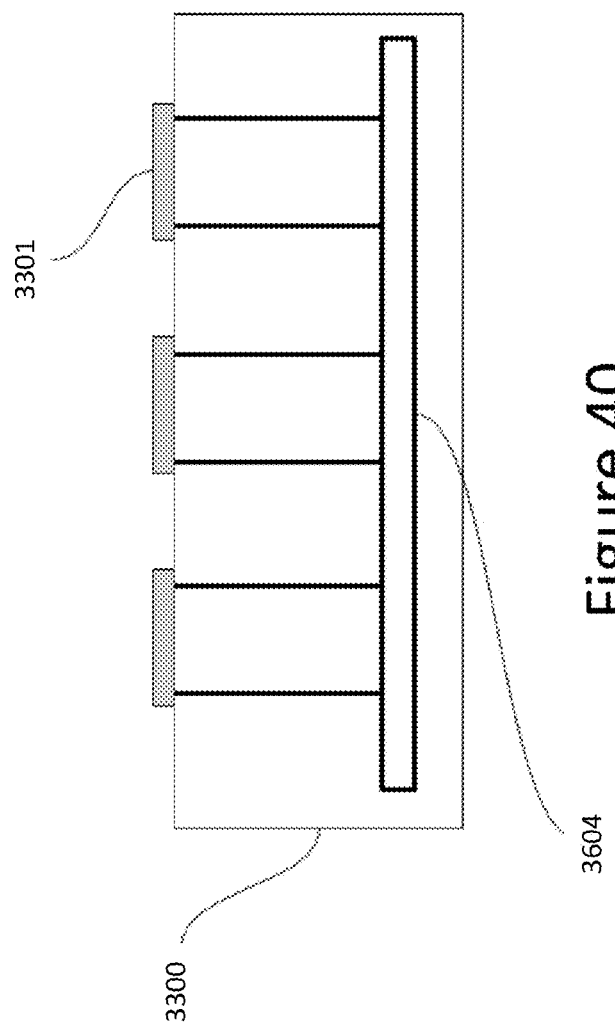
FIG. 40 shows a receiver substrate with bonding elements which transform to the driving contact pads after curing. The same circuitry controls the curing and driving functions.

In another embodiment, referring to FIG. 39, bonding element and the contact pad 3601 are the same. During the bonding process both switches 3902 and 3903 may be connected while after bonding, switches 3902 or 3903 may connect the micro device to the electronic circuit 3904 of the receiver substrate 3300. In an alternate embodiment, shown in FIG. 40, the same receiver substrate pixel circuitry 3604 may be used both for bonding and pixel driving.

Figure 41:
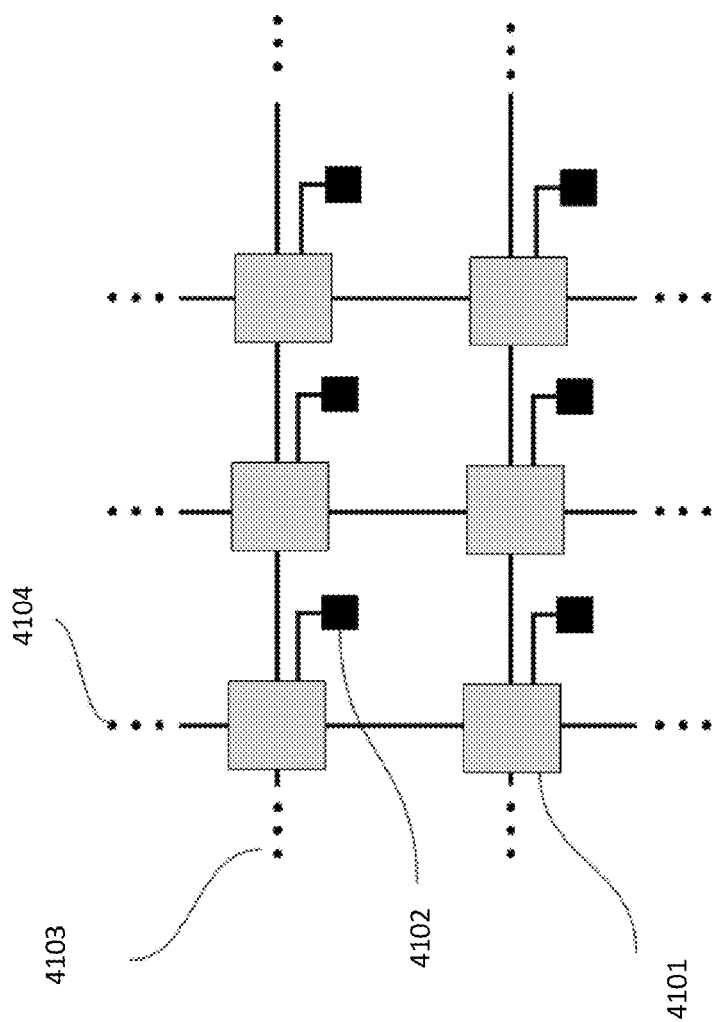
FIG. 41 shows a receiver substrate connection scheme with bonding elements which is connected to the individual pixel circuit for the vertical current curing configuration.

Referring to FIG. 41, each contact pad 4102 on the receiver substrate may be connected to the individual pixel circuit 4101. The bonding element on the contact pads is cured after transferring the micro device and flowing current through the contact pad 3802 and the micro device. One can cure any array of micro devices or any individual micro device using signal for columns and rows 4103 and 4104. This may be important for cases where defective micro devices should not be bonded to the receiver substrate. After the integration process is done, the pixel is used to program the pixel for operation mode.

Figure 42:
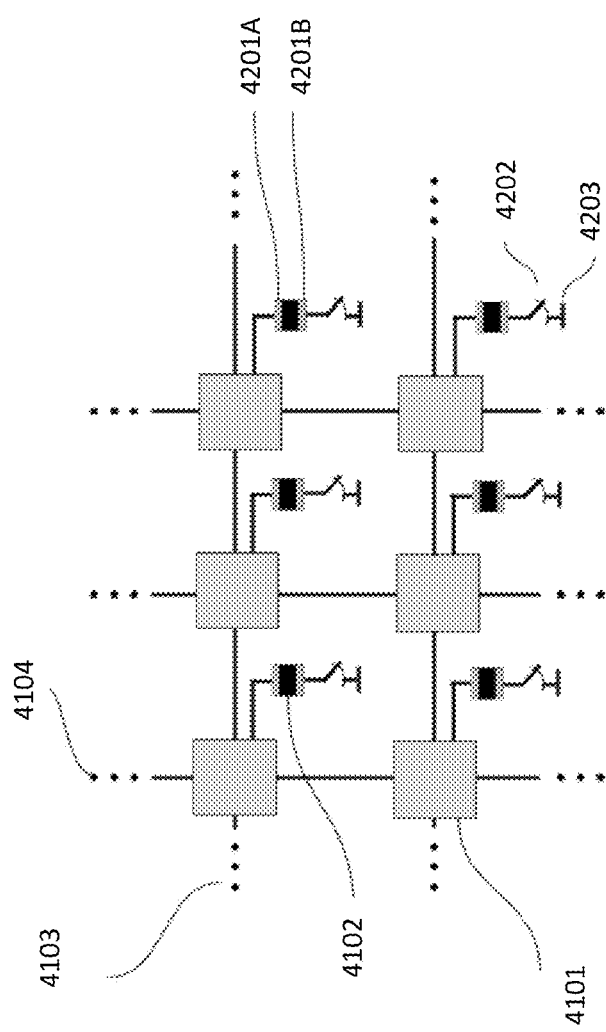
FIG. 42 shows a receiver substrate connection scheme with bonding elements which is connected to the individual pixel circuit for the lateral current curing configuration.

Alternatively, referring to FIG. 42, the bonding element is cured by passing current through contact pads elements 4201A and 4201B after closing the switch 4202 connected to the bias 4203. This configuration allows for a lateral current curing of the bonding elements. After the integration and other steps is done, the switches are configured so that the circuit programs the micro device for operation mode. In one case, the two contact pads are shorted together and coupled to the circuit. In another case, one of the contact pads is floating while the other one is coupled to the circuit.

Figure 43:
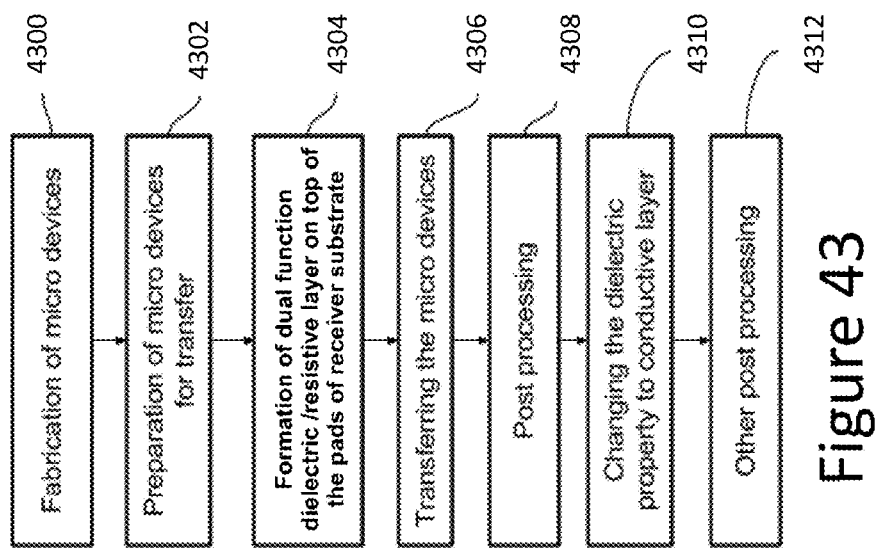
FIG. 43 is a block diagram showing process flow of transferring micro devices.

FIG. 43 shows process flow of transfer and integration of micro devices from the donor substrate to the acceptor substrate. Referring to FIG. 43, block 4300, the first step is the fabrication of micro devices.

The next step, block 4302, is preparation of micro devices for transfer process. This process may be a combination of several steps. In this step, bonding between the micro devices and native substrate may be weaken by any appropriate method. In addition, micro devices may be transferred to the temporary substrate.

The next step, block 4304, is the formation of dual function bonding or dielectric layer on top of the contact pad on the receiver substrate by various methods. Etching step may also be employed to form dielectric layer on top of the contact pad.

The next step, block 4306, is the transfer process in which micro devices are transferred from the donor substrate to the acceptor/receiver one with the electrostatic or other type of forces. Here, the dielectric (resistive) layer act as normal dielectric (or high resistive layer) and create electrostatic force (or thermal force) in combination with the contact pad.

After the micro device transfer step, referring to block 4308, several post processing steps such as cleaning, planarization, formation of additional layer, etc. may be employed on the receiver substrate.

After that the dielectric property is changed to couple the contact pads to the micro device at step 4310.

Further post processing steps 4312 such as deposition of electrode, light confinement, and other process can be performed.

Figure 44C:
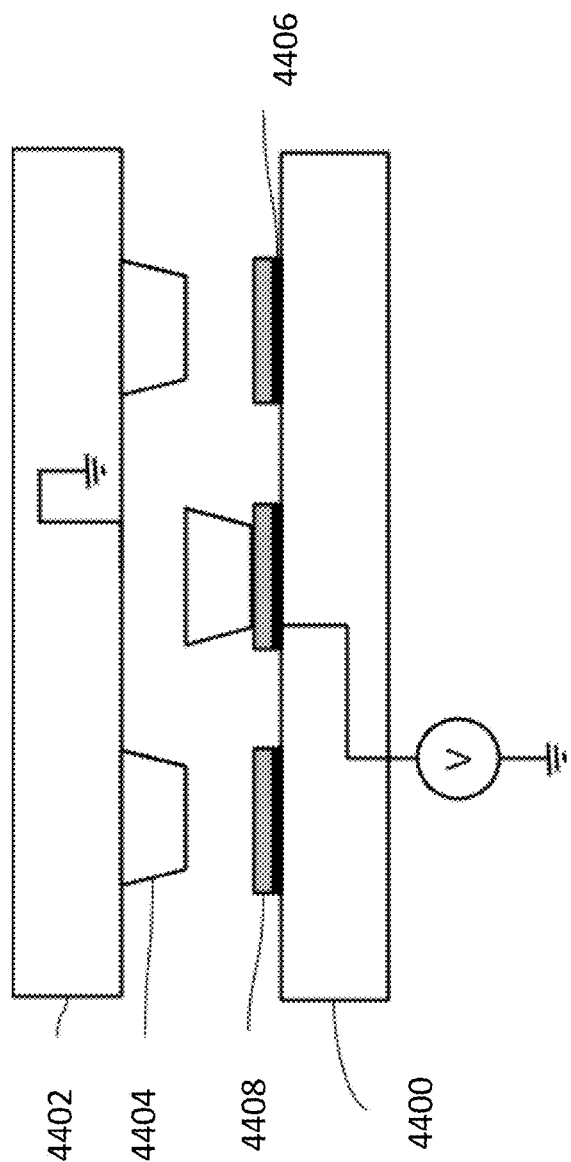
FIG. 44C is a cross sectional view of transferred micro device to the receiver substrate.

Referring to FIG. 44A, micro devices 4404 are attached to donor substrate 4402. Receiver substrate 4400 contains array of contact pads 4406. Dual function dielectric layer 4408 is formed on top of contact pad 4406 by various methods. Additional steps including patterning and etching may be employed to remove the dielectric layer from the unwanted area. Here, dual function pad structure is a combination of conductive contact pad and dielectric layer on top of it.

In an embodiment, attraction force between the landing pad and micro device is an electrostatic force. Referring to FIG. 44B, an array of micro devices is attached to donor substrate 4402. Contact pads 4406 on the acceptor substrate 4400 are connected to a voltage source. Here, voltage bias can be applied to all pads at the same time or to the desired individual pad for selective transfer purpose as it is shown in FIG. 44B. Donor substrate 4402 with attached micro devices and receiver substrate are brought together so that surface of the micro devices contacts to the landing pad. Differential potential in the dielectric layer creates an attractive electrostatic force, which pulls the micro device toward the receiver substrate. Referring to FIG. 44B, separating the donor substrate from the receiver substrate detaches the micro device from the donor substrate.

Dielectric layer 4408 between the contact pad and micro device is insulator and prevents electrical biasing of the micro device during normal operation. Referring to process 4310, one can modulate the dielectric properties of this layer to make it conductive in order to electrically connect the micro device to the contact pad for operation biasing.

In one embodiment, one can partially dope the dielectric layer during process 4304 and modulate its dielectric properties to conductive in process 4310.

Figure 45A:
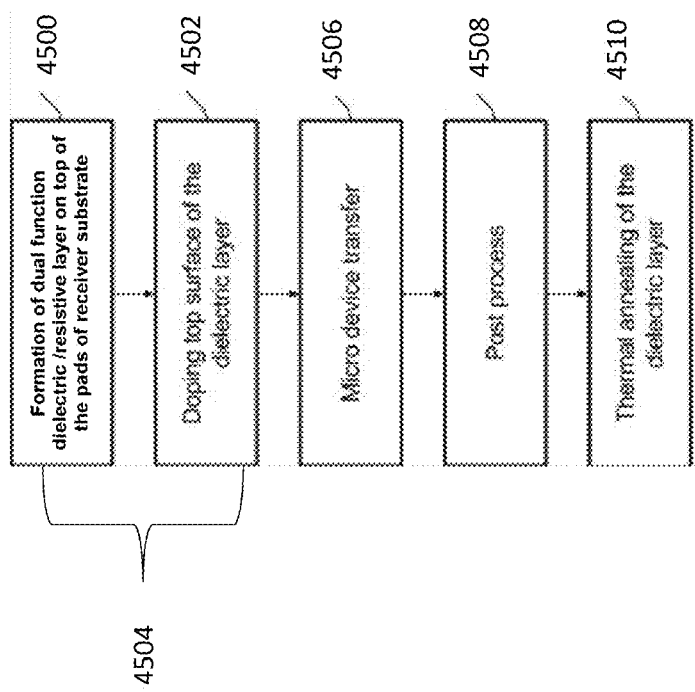
FIG. 45A is a process flow of modifying dielectric layer to form a conductive layer by doping top surface of the dielectric layer with dopants.

FIG. 45A shows process flow for modifying the dielectric layer to form a conductive layer by doping top surface of the dielectric layer with dopants.

Referring to FIG. 45A, process 4504 is a combination of two steps 4500 and 4502. The first step is a formation of the dielectric (resistive) layer on the receiver substrate. This step may be done with variety of methods such as deposition, stamping and spin coating, etc. Additional steps such as patterning and etching steps may be required to remove the dielectric layer from the unwanted area. At the end of this process, dielectric (resistive) layer is formed on top of the contact pad. The next step shown in block 4502 is doping top surface of the dielectric layer to form a highly doped surface. The third and fourth steps shown in block 4506 and 4508 are the transfer of the micro device from the donor substrate to the receiver substrate and post processing step. The next step, process 4510, is modulation of dielectric (resistive) layer to conductive layer, which is a thermal annealing of the dielectric layer. This will allow diffusion of dopants into the dielectric layer making this layer conductive.

In any of the above embodiment, a blocking layer can be used on micro devices or receiver substrate to prevent migration of unwanted materials to the micro devices or receiver substrate.

Referring to FIG. 45B, prior to the micro device transfer, top side of the dielectric film 4518 is doped 4513 with dopants by various techniques for example ion bombardment method to form highly doped layer 4514 on the received substrate 4510. In case of ion bombardment method, dopant concentration, energy of doping, and uniformity of doping profile can be controlled precisely. In an embodiment, one can form dielectric layer 4518 on top of the receiver substrate followed by doping 4513 of the entire surface and subsequent etching of this layer to selectively form dielectric layer 4518 on top of the contact pads 4516. In another embodiment, one can form dielectric layer 4518 on the receiver substrate 4510 followed by an etching step and then a doping step to dope surface of the dielectric layer 4518. Prior to the doping process in the latter case additional steps such as applying photoresist and patterning may be employed to create a mask for prevention of doping of unwanted area on the receiver substrate. A wide variety of dopants can be used in order to dope the top layer of the dielectric layer. Dopant includes but not limited to boron, phosphorus, indium, arsenic, antimony, gold, aluminum, Si, Ge, titanium, chromium.

Figure 45C:
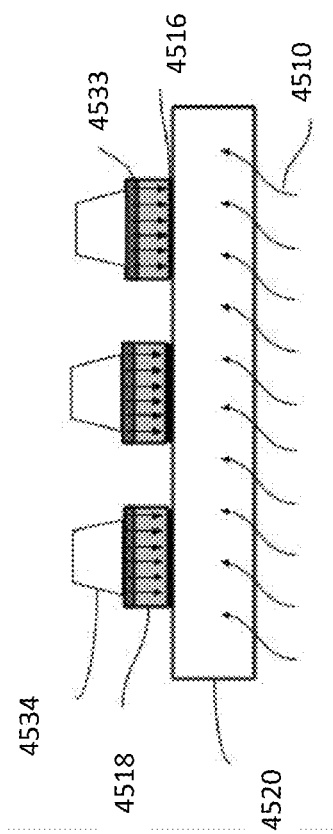
FIG. 45C shows the process for diffusion of dopant through the dielectric layer with thermal annealing.

Referring to FIG. 45C, following the transfer of micro device, thermal annealing step 4510 at elevated temperature is used to bond the top surface of doped dielectric layer 4518 to the micro device electrode 4514 and in the meantime allow diffusion 4533 of dopant into the dielectric layer 4518 forming a conductive layer. Conductive layer connects the contact pad 4516 on the receiving substrate 4520 to the micro device electrode. In this particular design, dielectric layer 4518 can be made of an organic/inorganic materials, semiconductors and polymers. Examples are silicon oxide, silicon nitride, polyamide and organic polymers and small molecules organic materials. Materials can be deposited by various methods such as sputtering, CVD, PECVD, sol-gel, spin coating, inkjet printing and thermal evaporation techniques. Dielectric thickness is within a range of tens of nanometers to micrometers. For sintering the dielectric layer 4518, depending on the material that is used the micro device can be heated from 500C to 6000C enabling annealing of this layer and dopant diffusion through the film.

Figure 45D:
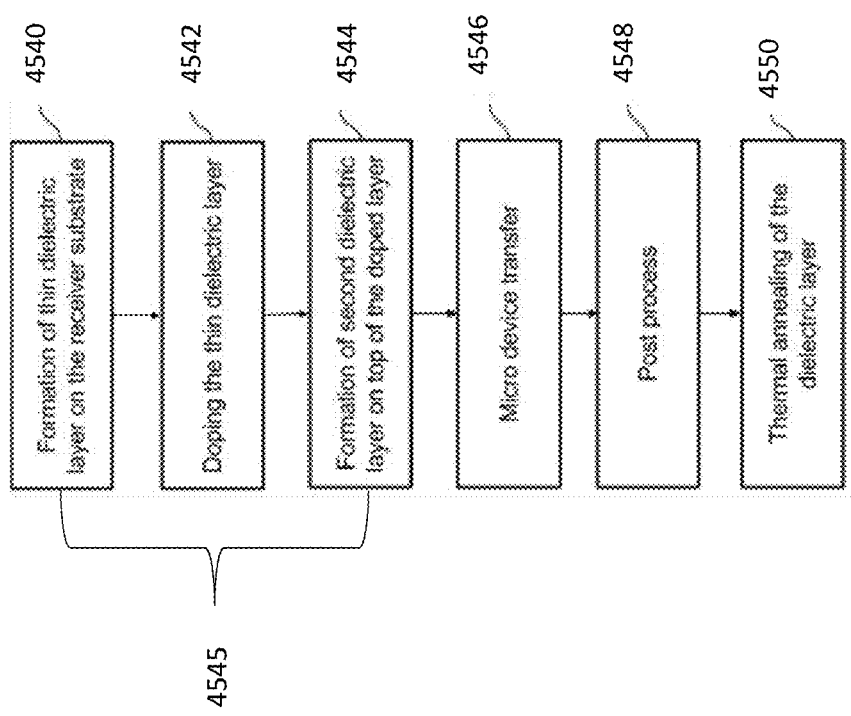
FIG. 45D is a block diagram showing process flow of modifying dielectric layer to form a conductive layer by doping bottom surface of the dielectric layer with dopants.

In another embodiment, referring to the process flow steps shown in FIG. 45D, bottom side of the dielectric layer is doped with the dopant. Here, formation of dual function dielectric layer on the contact pads, process 4545, is a combination of three steps. The first step 4540 is a formation of thin dielectric layer on the receiver substrate. The next process, block 4542, is doping the thin dielectric layer. The third step, block 4544 is formation of highly resistive low impurity second dielectric layer on top of the doped layer. Here, patterning and etching steps for removal of the dielectric layer from the unwanted area can be employed at any stage depending on the dielectric layer formation method, before the micro device transfer process. Following the micro device transfer step 4546, subsequent sintering 4548 of the dielectric layer, process 4550, allows diffusion of dopant from the bottom side of the layer to the top side and modulation of dielectric layer to conductive layer.

Figure 46A:
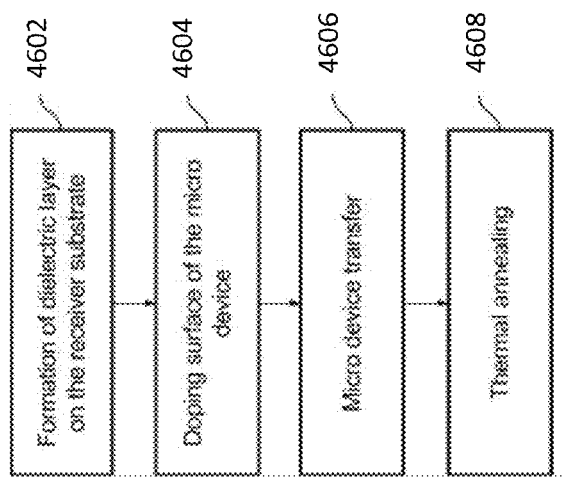
FIG. 46A shows process flow of creating conductive interlayer by doping surface of the micro device.
Figure 46B:
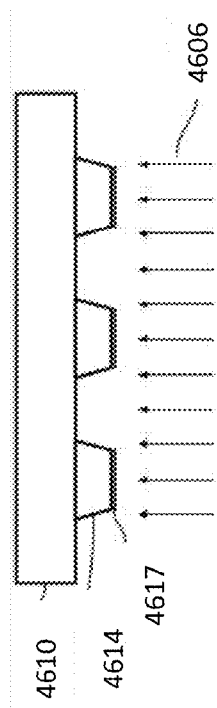
FIG. 46B shows surface doping of the micro devices.

In another embodiment, prior to the micro device transfer, side of the micro device (e.g. either top or bottom side), which requires to be connected to the contact pad is doped first and then the micro device is transferred to the receiver substrate. FIG. 46A shows the process flow of transferring the surface doped micro devices to the receiver substrate. Similar to the previous process flows, the dielectric layer is formed 4602 on the receiver substrate on top of the contact pad. During process 4604, surface of the micro device that requires to be attached to the landing pad is doped by an appropriate method. Doping is following by micro device transfer 4306 and thermal annealing 4608.

Referring to FIG. 43B, doping 4606 creates highly doped surface 4617 on micro devices. During process 4306, micro devices 4614 are transferred to the receiver substrate 4610. After the micro device transfer step, during process 4304, thermal annealing 4608 allows penetration of dopants from the surface of micro device 4617 into the dielectric layer 4618.

Figure 46C:
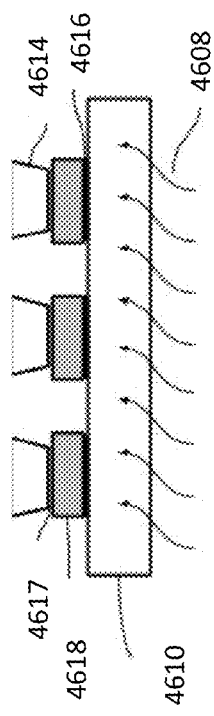
FIG. 46C shows transferred surface doped micro devices and annealing step for dopant penetration from the micro device into the dielectric layer.

Referring to FIG. 46C, annealing step 4608 also allows for diffusion of the penetrated dopants from the surface of the micro device 4617 through the dielectric layer 4618. One can also form a very thin dielectric layer on the micro device acting as a protective layer and dope the layer instead of doping the surface of the micro device directly to prevent any damage that might be imposed on the micro device surface during doping process.

Figure 47:
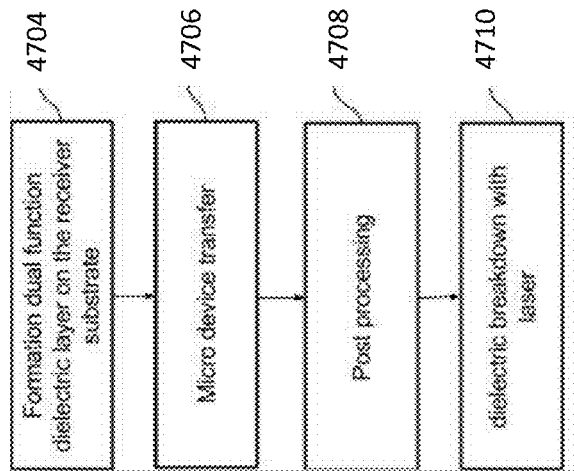
FIG. 47 shows process flow of modifying electrical properties of the dielectric layer with laser exposure.

In an embodiment, another method to change dielectric layer to conductive layer is to expose this layer to the laser beam. FIG. 47 shows process flow of modifying dielectric layer to form a conductive layer by a laser exposure. The first step 4704 similar to the previous process is the formation of dielectric layer on the receiver substrate. The second step 4706 is the transfer of micro devices on top of the dielectric layer. The third step 4708 is post-processing. The last step 4710 is laser exposure of the dielectric layer to induce dielectric breakdown.

Laser beam exposure induces breakdown of the dielectric layer (i.e. insulator) and shorting between the contact pad and device electrode. One can also use laser as a heating source to melt the dielectric layer. In another embodiment, laser beam may be used to heat the metal contact and melt the contact allowing diffusion of metal ions into the dielectric layer or promoting reaction of metal with the dielectric layer. At least one contact, either micro device electrode or receiving substrate contact pad requires to be transparent allowing a penetration of laser into the dielectric layer.

Figure 48A:
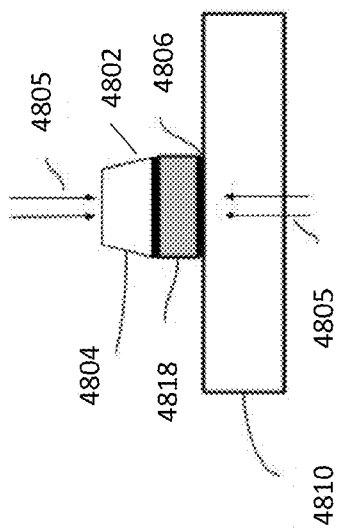
FIG. 48A is a cross sectional view of transferred micro device to the receiver substrate.

FIG. 48A shows cross sectional view of the structure in which laser 4805 is exposed to the dielectric layer 4818 from the top or bottom side perpendicular to the micro device 4804. Transparent electrode 4802 may be made from a thin metal film or transparent conductive oxide. Highly resistive dielectric film without impurity is used for the dielectric interlayer 4818. Laser beam wavelength can be chosen in a way so that it can be absorbed by the dielectric material 4818. In addition, power, beam diameter and exposure pulse are defined to precisely control the process and preventing damage of the other layers. Dielectric layer 4818 can be formed from wide variety of organic and inorganic materials such as SiO2, SiN, etc. Metal contact may be made from aluminum, tungsten, molybdenum, etc. Reflective metal on the contact pad 4806 or micro device electrode can be also used as a protective layer to prevent damage of the substrate 4810 and/or underlying layers.

Figure 48B:
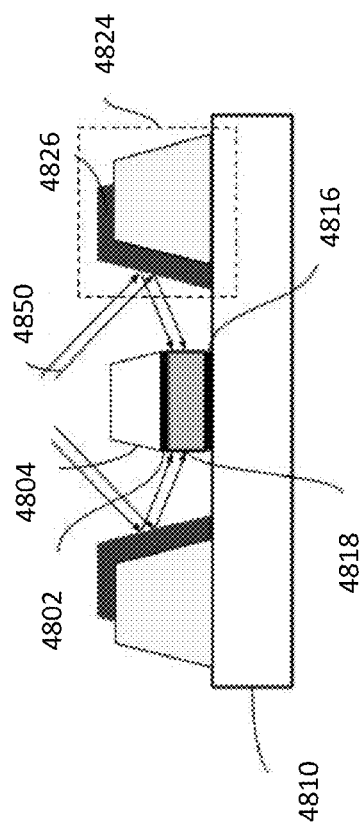
FIG. 48B shows laser exposure of micro device from sidewalls.

Referring to FIG. 48B, in an embodiment, in the case of two metal reflective electrodes on each side of the dielectric layer 4818 (i.e. contact biasing pad 4806 and micro device electrode 4802) in which the laser beam 4850 is blocked when is exposed perpendicular to the surface of electrodes, light confinement structure 4824 may be used to reflect the laser beam 4850 and direct it to the dielectric layer. 4818. Light confinement structure 4824 may be a combination of several different layers and materials. The top surface of light confinement structure 4824 is made from highly reflective metal 4826. Incident laser beam on the light confinement structure 4824, where reflective metal presents, is reflected toward the sidewalls of the micro device 4804. Reflected laser beam 4850 is absorbed by dielectric layer 4818 resulting a modification of its electrical properties. Here, light confinement structure 4824 may be made before transferring the micro devices 4804 or after the transfer process.

In an embodiment, mechanical or thermal force may be used to remove partially or fully the dielectric layer 4818 to provide electrical connection between the contact pad 4816 and micro device electrode 4802.

In an embodiment, soft material may be used to form a dielectric layer for landing pad. The soft dielectric layer can be made from organic or inorganic materials such as polymers and polyimide, etc. Here the term "soft materials" refers to any materials that can be easily modified or deformed by a mechanical or thermal force such as gels and polymers. Depending on the material specific characteristics, variety of methods such as thermal evaporation, spin coating, inkjet printing, stamping, spray coating, etc. can be used to form the dielectric layer.

Figure 49:
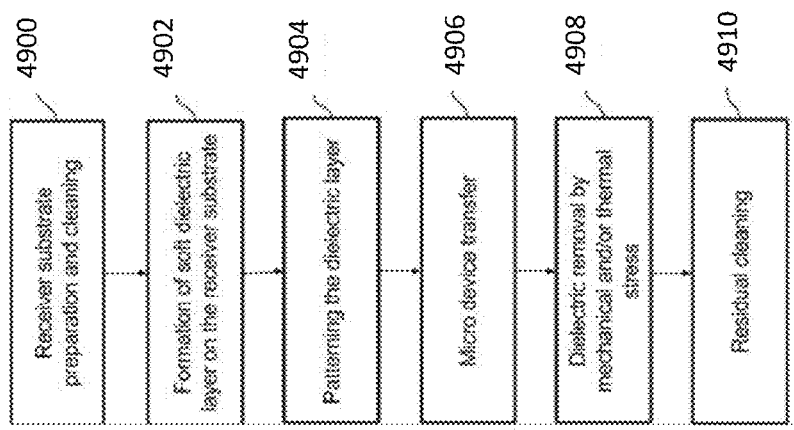
FIG. 49 is a block diagram showing process flow of micro device transfer using soft material as a dielectric layer.

FIG. 49 shows process flow of the formation of soft dielectric layer and subsequent post processing steps for removing this layer. Referring to FIG. 49, process 4900, first step is preparation of substrate such as cleaning steps for removal of residuals and impurities on top of the surface of the receiver substrate allowing a better and stronger attachment of the dielectric layer to the surface. During process 4902, dielectric layer from soft material is formed by employing a proper method on top of the system or receiver substrate. Afterwards, referring to step 4904, the formed dielectric layer is patterned to remove the material from the unwanted area resulting formation of this layer on top of the contact pad. Following formation of the dielectric layer and subsequent patterning step, the micro device is transferred 4906 from the donor or carrier substrate to the system or receiver substrate. Here, one can employ previous methods to modify the dielectric properties of the formed layer to conductive layer. In addition, one can employ a mechanical or thermal force, referring to process 4908, to remove the dielectric layer between the contact and micro device electrode. In the case of mechanical force, it can be applied to the micro device while receiver substrate is fixed. In another case mechanical force can be applied to the back of the receiver substrate or to both the micro device and receiver substrate at the same time. The last step, block 4910, includes sequence of cleaning steps for removing the material residual on the receiver substrate.

Figure 50:
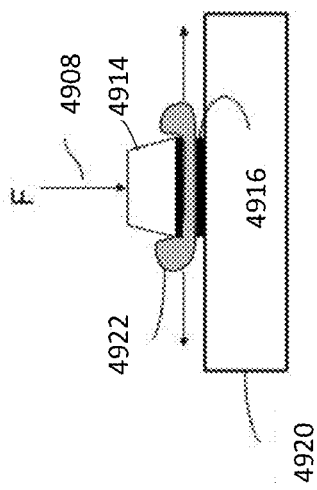
FIG. 50 is a cross sectional view of transferred micro device on top of the soft dielectric layer in which mechanical stress is applied.

FIG. 50 shows the process step 4908 in which mechanical stress is applied to the micro device. Here applied mechanical stress 4908 allows removal of soft material 4922 between the contact pad 4916 on the receiver substrate 4920 and micro device electrode 4914 from the sidewalls where the opening exist. In an embodiment, mechanical force or stress can be applied to the individual micro device or to the several micro devices at the same time. This can be done either at the end of each micro device transfer step or at the end of the transfer step of several micro devices.

In another embodiment, after the micro device transfer step, one can put thermal force on the dielectric layer, referring again to block 4908 in FIG. 49. Thermal force results evaporation of the dielectric layer between the contact pad and the micro device electrode, which allows a physical contact between them. Depending on the material evaporation temperature, variety of methods such as direct heating, conventional heating or laser beam can be used to heat the dielectric layer. In addition, thermal force can be used to soften or melt the material that can be easily removed from the opening area on the sidewalls between the contacts. Additional cleaning step may be used to remove the remaining residual on the receiver substrate. One can also use mechanical force during heating step to accelerate the dielectric removal process. Thermal force may also be used to reduce the required magnitude of the mechanical force in order to prevent catastrophic damages on the receiver substrate and micro devices.

Figure 51:
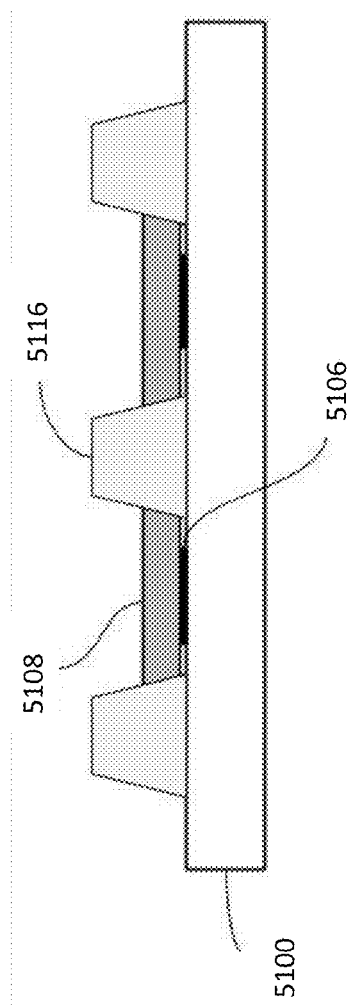
FIG. 51 is a cross sectional view of formed soft dielectric layer between the insulator layers on the receiver substrate.

Referring to process 4904, for formation of dual functional dielectric layer from soft material, different methods can be used to pattern the dielectric layer. In one case, dielectric layer is formed on the entire surface of the receiver substrate and then patterning steps are employed. In another case, referring to FIG. 51, separator layer 5106 that can also be a light confining layer is first formed on the receiver substrate 5100 and then dielectric layer 5108 is formed on the receiver substrate. In case of formation of dielectric layer 5108 on top of the separator layer 5106, additional steps may be used to remove the dielectric layer on top of the separator layer 5106. Separator layer 5106 isolates adjacent landing pads 5116. In FIG. 51, for example a well shape structure is formed around the contact biasing pad 5116.

Figure 52A:
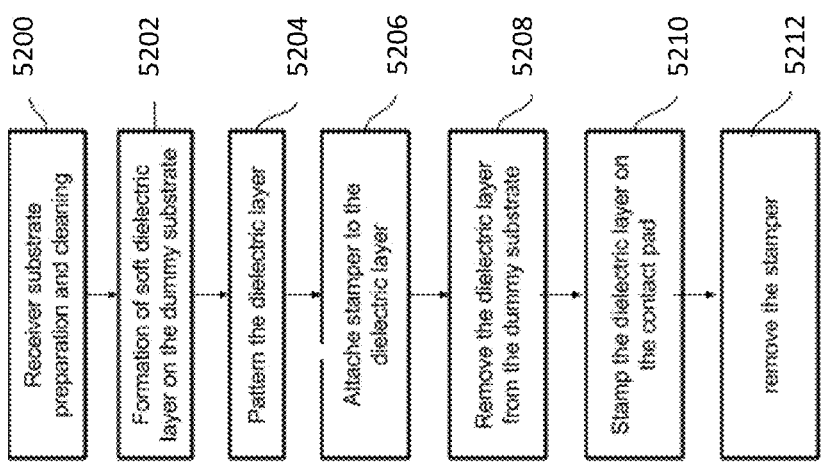
FIG. 52A is a process flow diagram of transferring patterned soft dielectric layer to the contact pads by stamping technique.

In another embodiment, stamping technique can be used to pattern the dielectric layer. FIG. 52A shows process flow of forming patterned soft dielectric layer on the contact pad by stamping technique. As a first step S200, a dummy substrate is received and prepared (e.g. cleaned). As a second step S202, a soft dielectric layer is formed on the dummy substrate. As a third step S204, the dielectric layer is patterned. As a fourth step S206, a stamper is attached to the dummy substrate. As a fifth step S208, the stamper and associated dielectric layer is removed from the dummy substrate. As a sixth step S210, the dielectric layer is stamped on a contact pad on the receiver substrate. As a final step S212, the stamper is removed from the contact pad and receiver substrate.

Referring to FIG. 52B, one method is to form 5202 dielectric layer 5212 on dummy substrate 5214 and pattern 5204 it in accordance to the contact bias pads pattern on the receiver substrate. Then stamper 5216 or carrier substrate is attached 5206 to patterned dielectric layer 5212 on the dummy substrate. The stamper can be made from wide variety of materials such as PDMS. Subsequently, stamper 5216 and associated the dielectric layer 5212 is detached or removed 5208 from the dummy substrate 5214. The stamper is 5216 is then used to stamp 5210 the dielectric layer 5212 on the contact pads 5226 on the receiver substrate 5230.

In another embodiment, referring to FIG. 52C, the stamper 5217 or carrier substrate is patterned first in accordance to the formation of contact pads on the receiver substrate. For example, a PDMS mold can be formed on the stamper 5217 in any specific desired shape. The dielectric layer 5212 is prepared 5200 and patterned on the dummy substrate 5214. The patterned stamper 2917 is then attached 5206 to the dielectric layer 5212 on the dummy substrate 5212. The patterned stamper 2917 and associated dielectric layer 5212 is then removed 5208 from the dummy substrate and used to stamp 5210 the dielectric layer 5212 on contact pads 5226 on the receiver substrate 5230.

In an embodiment, soft dielectric layer can be formed directly on the micro devices rather than receiver substrate. Here, micro devices may be on the growth substrate or on the carrier one. Dielectric layer is formed on the surface of the micro device, which requires to be attached to the contact pad. Methods such is immersion, spray coating or spin coating may be used to form this layer. The next step is the transfer of the device to the receiver substrate.

Figure 53A:
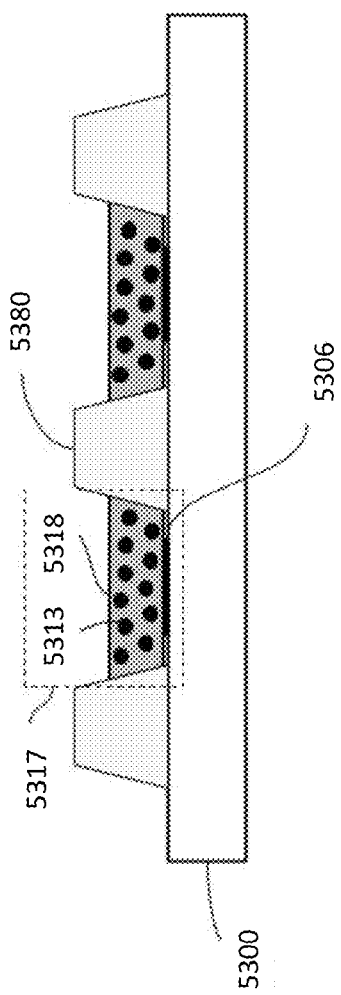
FIG. 53A shows a cross sectional view of the receiver substrate with the formed dielectric with metal nanoparticles layer.
Figure 53B:
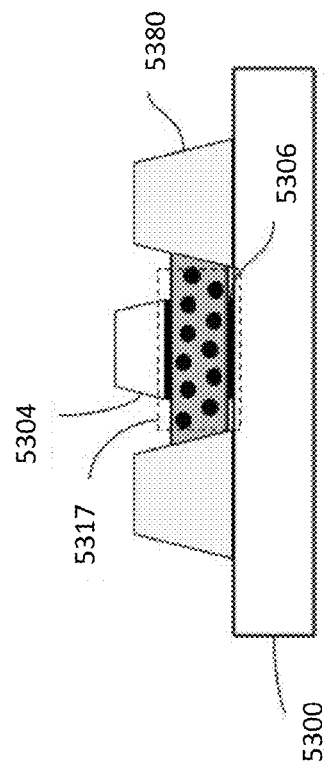
FIG. 53B is a cross sectional view of transferred micro device on top of the dielectric with metal nanoparticles layer.
Figure 53C:
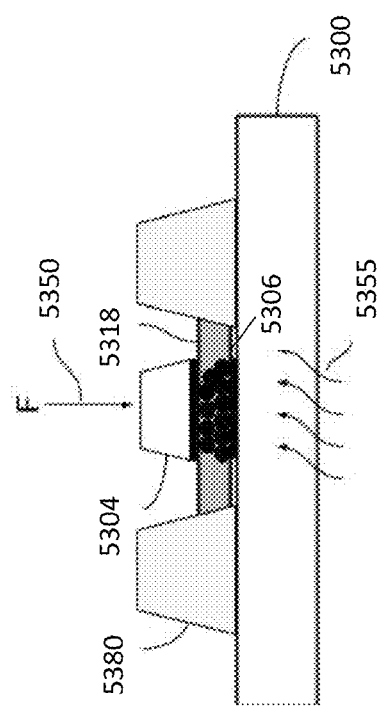
FIG. 53C shows aggregated metal nanoparticles forming conductive layer between the contact pad and micro device electrode by mechanical or thermal stress.

Following the transfer, disclosed methods are used to remove or modify the dielectric layer. In an embodiment, mechanical or thermal force can be used to partially remove the dielectric layer. Here, soft material, which includes metal nanoparticles, can be used as the dual functional dielectric layer. Metal nanoparticles such as gold or silver are first dispersed in the dielectric material or solvent. Referring to FIG. 53A, insulating layer 5380 or in one case light confining layer is formed on the receiver substrate prior to the formation of dielectric/conductive layer. Dielectric layer 5318 including metal nanoparticles 5313 forms layer 5317 on the receiver substrate 5300. Insulating layer 5380 prevents formation of this layer on the entire surface and subsequent lateral shorting between the contact pads 5306. Since nanoparticles 5313 are dispersed in the dielectric layer 5318, the formed layer 5317 is not conductive and acts as a dielectric layer 5318 in the micro device transfer step. FIG. 53B shows transferred micro device 5304 on layer 5317.

After the micro device transfer process, referring to FIG. 21C, mechanical stress 5350 or thermal stress 5355 or both is applied to remove dielectric material 5317 and aggregate the metal nanoparticles between the contact pad 5306 and micro device electrode 5304. Here, isolation layer 5380 prevents lateral electrical shorting between the contact pads 5306 on the receiver substrate 5300 due to the aggregated metal nanoparticles. One can also employ thermal stress 5355 to melt the nanoparticles allowing stronger bonding between the electrode 5304 and contact pad 5306.

Figure 22:
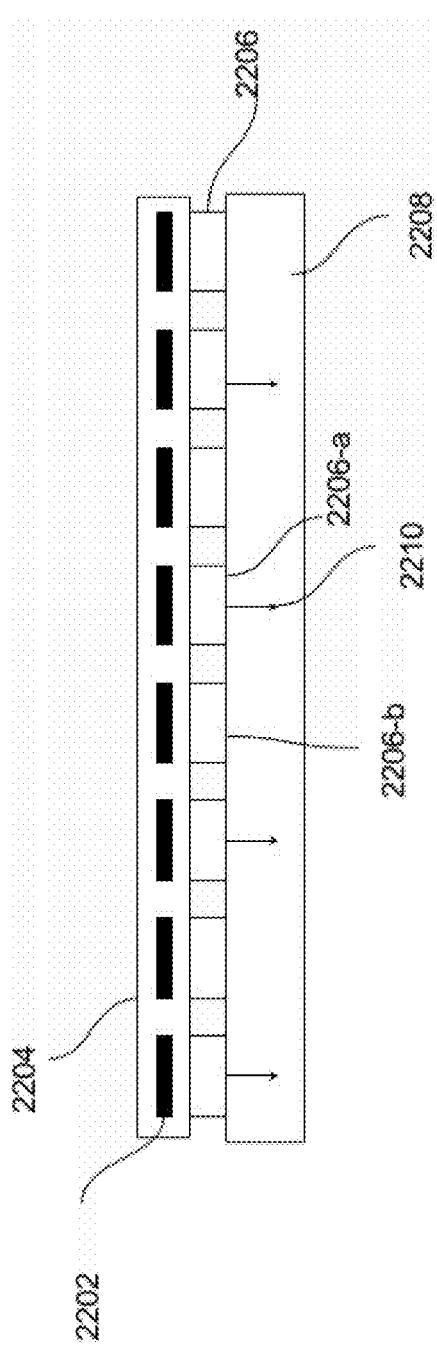
FIG. 22 shows a donor substrate with force modulating elements on the donor substrate.
Figure 54A:
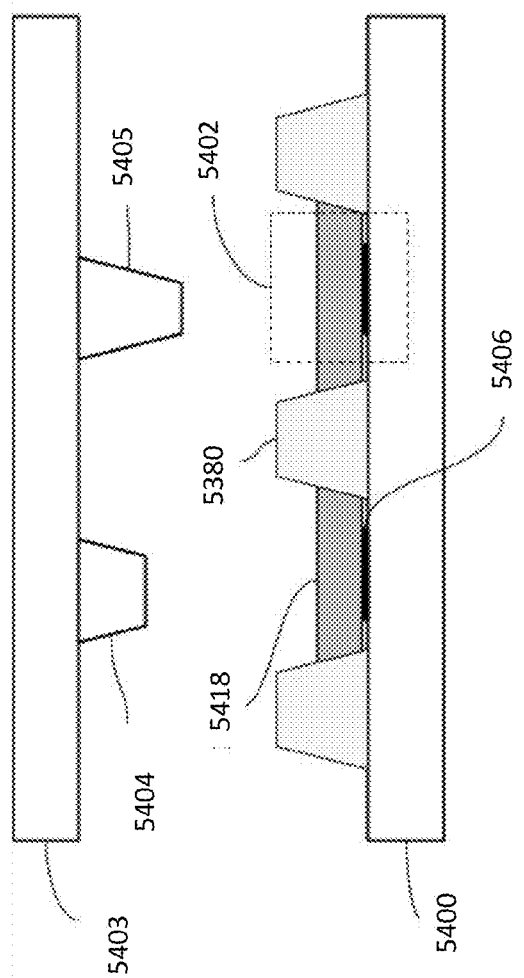
FIG. 54A is a cross sectional view of receiver substrate and micro devices with different heights on the donor substrate.
Figure 54B:
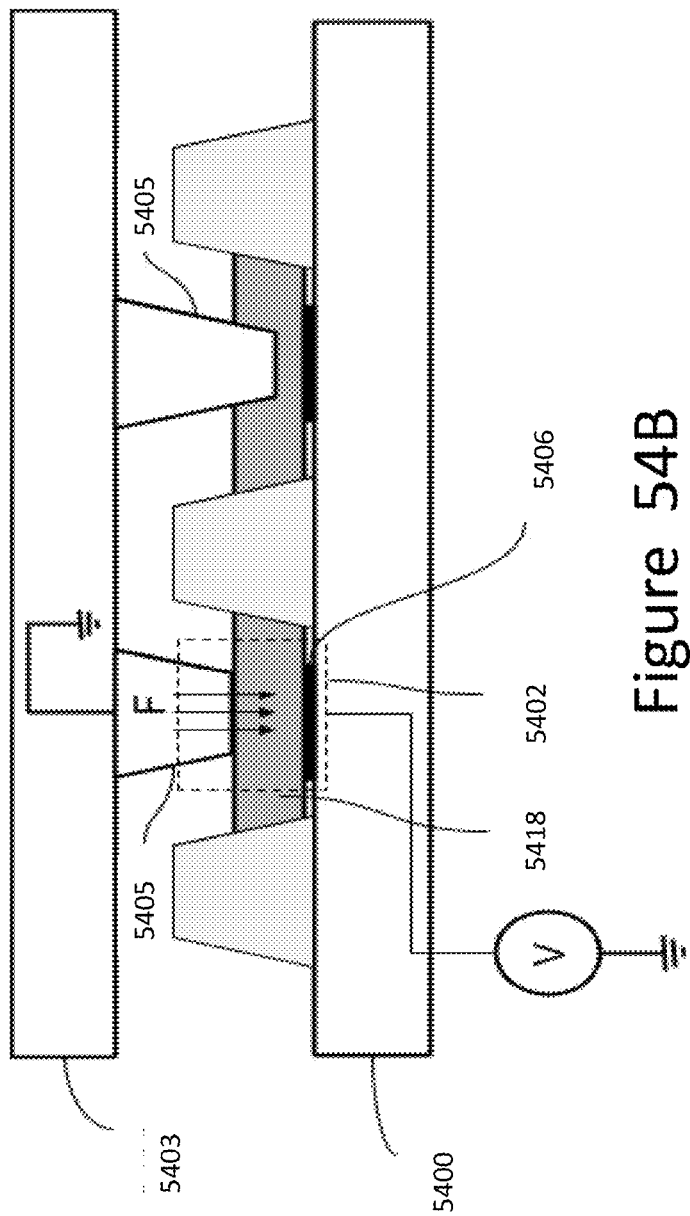
FIG. 54B shows process of transferring micro devices with different heights to the receiver substrate.

In an embodiment, referring to FIG. 54A, soft dielectric layer 5418 can be used to transfer micro devices 5404, 5405 with different heights from the donor substrate 5403 to the acceptor substrate 5400. Here the donor or carrier substrate may hold micro devices with different heights. During micro device transfer process, when hard dielectric layer is used and donor substrate is brought in close proximity of the receiver substrate, taller micro devices 5405 may prevent transfer of shorter micro devices 5405 to the receiver substrate 5400. For example, device 3100 increases the critical distance between the electrode of shorter height micro device 5404 and landing pad 5402 and therefore transfer force may not be strong enough to transfer the micro device to the contact pad 5406. Referring to FIG. 22B, formed soft dielectric layer on the receiver substrate on the other hand, during micro device transfer process allows penetration of taller devices into this layer which in turn allows contact between the electrode of shorter height device and landing pad 3102.

Figure 55:
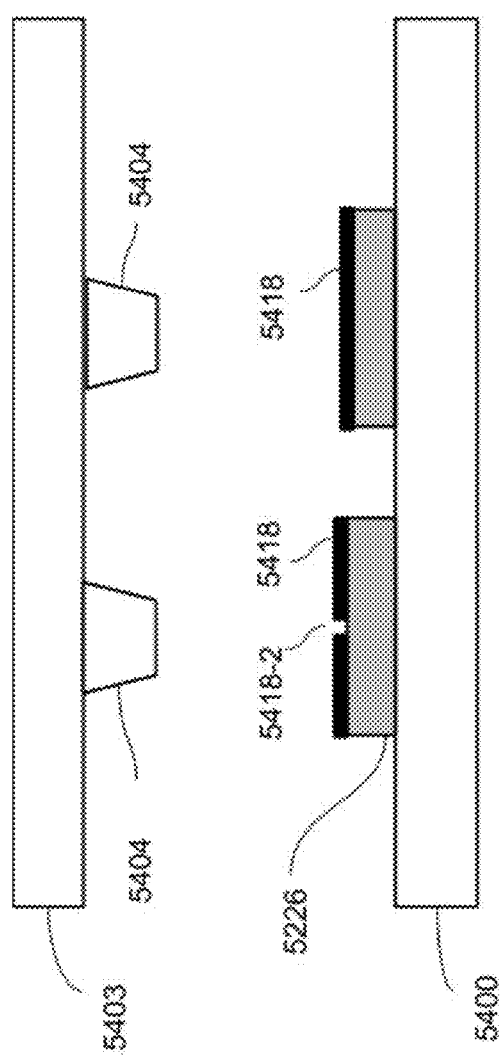
FIG. 55 shows deformable pads for creating dual function pads.

In an embodiment, referring to FIG. 55, a dielectric layer 5418 is used on top of the contact pads 5226. This dielectric deforms under pressure and/or temperature. In one case, the deformation is assisted by the softening of the pad material 5226 underneath the dielectric layer 5418. In another case, the dielectric layer has at least one hole 5418-2 (or it does not cover the entire pad 5226 area). Thus, the soften pad material 5226 can be squeezed through the holes 5418-2 and create a conductive layer with the micro-device 5404. In another case, the soften pad material 5226 can be used for bonding the micro-device 5404 to the substrate 5400.

While particular implementations and applications of the present disclosure have been illustrated and described, it is to be understood that the present disclosure is not limited to the precise construction and compositions disclosed herein and that various modifications, changes, and variations can be apparent from the foregoing descriptions without departing from the spirit and scope of an invention as defined in the appended claims.

What is claimed is:

1. A method of transferring micro devices, the method comprising:

positioning a donor substrate comprising the micro devices proximal to a receiver substrate, wherein the donor substrate is a substrate upon which the micro devices were manufactured or grown, or a temporary substrate onto which the micro devices were transferred to from the substrate upon which the micro devices were manufactured or grown, wherein the receiver substrate includes landing areas where the micro devices sit when on the receiver substrate, wherein the landing areas include at least one force modulator element, and the at least one force modulator element creates a transfer force for transferring selected one or more of the micro devices, and wherein the receiver substrate has a contact pad, and the micro devices are coupled to a circuit through the contact pad.

2. The method of claim 1, wherein selectively reducing the effect of a force generated by the force modulator element comprises generating a reverse polarity of force surrounding the force modulating element.

3. A method of transferring a micro device, the method comprising:

positioning a donor substrate comprising a micro device proximal to a receiver substrate, wherein the donor substrate is a substrate upon which the micro device was manufactured or grown, or a temporary substrate onto which the micro device was transferred to from the substrate upon which the micro device was manufactured or grown, and the receiver substrate includes a pad structure having a dielectric layer and a conductive layer;

transferring the micro device from the donor substrate to the pad structure; and coupling the first micro device and the conductive layer by removing the dielectric layer, wherein the dielectric layer is removed by a force.

4. The method of claim 3, further comprising providing a deformable layer on top of one of a receiver of the contact pad or the micro devices to adjust for different heights in the micro devices.

5. The method of claim 4, wherein the deformable layer consists of either-one of: another conductive layer, high resistive layer, another dielectric layer on top of the dielectric layer or a part of the dielectric layer.

6. The method of claim 3, wherein the dielectric layer is removed partially or fully.

7. The method of claim 3, wherein the force is a thermal force.

8. The method of claim 3, wherein the force is a mechanical force.

* * * * *